United States Patent
Okada et al.

(10) Patent No.: US 10,547,253 B2
(45) Date of Patent: Jan. 28, 2020

(54) POWER GENERATING ELEMENT

(71) Applicant: TRI-FORCE MANAGEMENT CORPORATION, Saitama (JP)

(72) Inventors: Kazuhiro Okada, Saitama (JP); Miho Okada, Saitama (JP)

(73) Assignee: TRI-FORCE MANAGEMENT CORPORATION, Saitama (JP)

( * ) Notice: Subject to any disclaimer, the term of this patent is extended or adjusted under 35 U.S.C. 154(b) by 0 days.

(21) Appl. No.: 16/357,132

(22) Filed: Mar. 18, 2019

(65) Prior Publication Data

US 2019/0280626 A1    Sep. 12, 2019

Related U.S. Application Data

(63) Continuation of application No. 15/285,143, filed on Oct. 4, 2016, now Pat. No. 10,284,119.

(30) Foreign Application Priority Data

Oct. 19, 2015 (JP) .................................. 2015-205294

(51) Int. Cl.
   *H01L 41/113*    (2006.01)
   *H02N 2/18*    (2006.01)
(52) U.S. Cl.
   CPC ......... *H02N 2/181* (2013.01); *H01L 41/1136* (2013.01); *H02N 2/186* (2013.01); *H02N 2/188* (2013.01)
(58) Field of Classification Search
   CPC ........ H02N 2/181; H02N 2/186; H02N 2/188; H01L 41/1136

(Continued)

(56) References Cited

U.S. PATENT DOCUMENTS 4,905,523 A    3/1990   Okada
4,967,605 A    11/1990  Okada
(Continued)

FOREIGN PATENT DOCUMENTS

EP    2 113 953 A1    11/2009
JP    10-243667 A    9/1998
(Continued)

OTHER PUBLICATIONS espacenet English abstract of JP 10-243667 A.
(Continued)

*Primary Examiner* — Thomas M Dougherty
(74) *Attorney, Agent, or Firm* — Ladas & Parry LLP

(57) ABSTRACT

There is provided a power generating element which is capable of converting vibration energy in various directions into electric energy without waste and less likely to be damaged even upon application of excessive vibration. Made available is a main generating structure (MGS) in which a first layer (100), a second layer (200) and a third layer (300) are laminated. The second layer (200) has a plate-like bridge portion (210), a central plate-like portion (220), a left-hand side plate-like portion (230) and a right-hand side plate-like portion (240), each of which is flexible, and the third layer (300), that is a weight body, formed in the "U" letter shape is joined with the lower surface thereof. The plate-like bridge portion (210) is protected by the weight body (300) circumference thereof. The first layer (100) is structured so that a piezoelectric material layer (105) is laminated on an upper surface of a lower layer electrode (E0), and four localized upper layer electrodes (E1 to E4) are laminated on the upper surface thereof. The base end of the plate-like bridge portion (210) is fixed to a pedestal (400). Vibration of the weight body (300) is efficiently transmitted to the plate-like bridge portion (210) and the bridge portion (Continued)

piezoelectric layer (110), and a power generating circuit (500) outputs electric power on the basis of charge generated at the lower layer electrode (E0) and the upper layer electrodes (E1 to E4).

3 Claims, 16 Drawing Sheets

(58) Field of Classification Search
USPC .......................................................... 310/339
See application file for complete search history.

(56) References Cited

U.S. PATENT DOCUMENTS

| | | | |
|---|---|---|---|
| 4,969,366 | A | 11/1990 | Okada |
| 5,014,415 | A | 5/1991 | Okada |
| 5,035,148 | A | 7/1991 | Okada |
| 5,092,645 | A | 3/1992 | Okada |
| 5,182,515 | A | 6/1993 | Okada |
| 5,263,375 | A | 11/1993 | Okada |
| 5,295,386 | A | 3/1994 | Okada |
| 5,343,765 | A | 9/1994 | Okada |
| 5,365,799 | A | 11/1994 | Okada |
| 5,392,658 | A | 2/1995 | Okada |
| 5,406,848 | A | 4/1995 | Okada |
| 5,421,213 | A | 6/1995 | Okada |
| 5,437,196 | A | 8/1995 | Okada |
| 5,492,020 | A | 2/1996 | Okada |
| 5,497,668 | A | 3/1996 | Okada |
| 5,531,002 | A | 7/1996 | Okada |
| 5,531,092 | A | 7/1996 | Okada |
| 5,571,972 | A | 11/1996 | Okada |
| 5,639,973 | A | 6/1997 | Okada |
| 5,646,346 | A | 7/1997 | Okada |
| 5,668,318 | A | 9/1997 | Okada |
| 5,682,000 | A | 10/1997 | Okada |
| 5,744,718 | A | 4/1998 | Okada |
| 5,780,749 | A | 7/1998 | Okada |
| 5,811,693 | A | 9/1998 | Okada |
| 5,831,163 | A | 11/1998 | Okada |
| 5,850,040 | A | 12/1998 | Okada |
| 5,856,620 | A | 1/1999 | Okada |
| 5,962,787 | A | 10/1999 | Okada |
| 5,987,985 | A | 11/1999 | Okada |
| 6,003,371 | A | 12/1999 | Okada |
| 6,053,057 | A | 4/2000 | Okada |
| 6,076,401 | A | 6/2000 | Okada |
| 6,098,461 | A | 8/2000 | Okada |
| 6,158,291 | A | 12/2000 | Okada |
| 6,159,761 | A | 12/2000 | Okada |
| 6,185,814 | B1 | 2/2001 | Okada |
| 6,205,856 | B1 | 3/2001 | Okada |
| 6,269,697 | B1 | 8/2001 | Okada |
| 6,282,956 | B1 | 9/2001 | Okada |
| 6,314,823 | B1 | 11/2001 | Okada |
| 6,367,326 | B1 | 4/2002 | Okada |
| 6,378,381 | B1 | 4/2002 | Okada |
| 6,474,133 | B1 | 11/2002 | Okada |
| 6,477,903 | B2 | 11/2002 | Okada |
| 6,512,364 | B1 | 1/2003 | Okada |
| 6,530,283 | B2 | 3/2003 | Okada |
| 6,716,253 | B2 | 4/2004 | Okada |
| 6,772,632 | B2 | 8/2004 | Okada |
| 6,779,408 | B2 | 8/2004 | Okada |
| 6,809,529 | B2 | 10/2004 | Okada et al. |
| 6,858,970 | B2 | 2/2005 | Malkin et al. |
| 6,859,048 | B2 | 2/2005 | Okada et al. |
| 6,864,677 | B1 | 3/2005 | Okada |
| 6,865,943 | B2 | 3/2005 | Okada |
| 6,894,482 | B2 | 5/2005 | Okada |
| 6,915,709 | B2 | 7/2005 | Okada |
| 6,920,788 | B2 | 7/2005 | Okada |
| 6,941,810 | B2 | 9/2005 | Okada |
| 6,990,867 | B2 | 1/2006 | Okada |
| 7,059,188 | B2 | 6/2006 | Okada |
| 7,075,527 | B2 | 7/2006 | Takagi et al. |
| 7,121,147 | B2 | 10/2006 | Okada |
| 7,123,028 | B2 | 10/2006 | Okada et al. |
| 7,152,485 | B2 | 12/2006 | Okada |
| 7,219,561 | B2 | 5/2007 | Okada |
| 7,231,802 | B2 | 6/2007 | Okada |
| 7,360,455 | B2 | 4/2008 | Okada |
| 7,363,814 | B2 | 4/2008 | Okada |
| 7,533,582 | B2 | 5/2009 | Okada |
| 7,578,162 | B2 | 8/2009 | Okada |
| 7,882,740 | B2 | 2/2011 | Okada |
| 7,900,513 | B2 | 3/2011 | Okada |
| 8,408,075 | B2 | 4/2013 | Okada |
| 8,667,854 | B2 | 3/2014 | Nishioki et al. |
| 8,966,996 | B2 | 3/2015 | Okada et al. |
| 9,383,277 | B2 | 7/2016 | Okada et al. |
| 9,995,644 | B2 | 6/2018 | Nishioki et al. |
| 2008/0079333 | A1 | 4/2008 | Ulm et al. |
| 2009/0178260 | A1 | 7/2009 | Yamazaki et al. |
| 2013/0154439 | A1 | 6/2013 | Lee et al. |
| 2013/0293069 | A1* | 11/2013 | Sakaguchi ............. H02N 2/186 310/348 |
| 2013/0320807 | A1* | 12/2013 | Sakaguchi ............. H02N 2/188 310/339 |
| 2016/0156284 | A1 | 6/2016 | Makihara et al. |
| 2016/0211778 | A1* | 7/2016 | Okada ................... H01L 41/053 |
| 2017/0110989 | A1* | 4/2017 | Okada ................. H01L 41/1136 |
| 2018/0262130 | A1* | 9/2018 | Okada ................... H01L 41/047 |
| 2018/0351481 | A1* | 12/2018 | Okada ................... H01L 41/047 |

FOREIGN PATENT DOCUMENTS

| | | |
|---|---|---|
| JP | 2011-152010 A | 8/2011 |
| JP | 2015-50935 A | 3/2015 |
| WO | 2015/022794 A1 | 2/2015 |
| WO | 2015/033621 A1 | 3/2015 |

OTHER PUBLICATIONS espacenet English abstract of JP 2011-152010 A.
espacenet English abstract of WO 2015/033621 A1.
JPO Office Action dated Mar. 1, 2016 for Japanese Application No. 2015-205294 with English translation.
Japanese Office Action dated Jan. 10, 2017 for Japanese Patent Application No. 2016-160256.
English translation of JP 2015-50935 A.
Extended European Search Report (ESR) dated Mar. 15, 2017 in connection with corresponding EP Patent Application No. 16194167.9.
Decision to Grant a Patent dated Feb. 6, 2018 for Application No. JP 2017-209392.
espacenet English abstract of JP 2015-50935 A.

* cited by examiner

| UPPER LAYER ELECTRODE | +Fx | +Fy | +Fz |
|---|---|---|---|
| E1 | CONTRACTION | CONTRACTION | EXPANSION |
| E2 | EXPANSION | CONTRACTION | EXPANSION |
| E3 | EXPANSION | CONTRACTION | CONTRACTION |
| E4 | CONTRACTION | CONTRACTION | CONTRACTION |

| UPPER LAYER ELECTRODE | +Fx | +Fy | +Fz |
|---|---|---|---|
| E1 | − | − | + |
| E2 | + | − | + |
| E3 | + | − | − |
| E4 | − | − | − |

POWER GENERATING ELEMENT

RELATED APPLICATION

This application is a continuation of application Ser. No. 15/285,143 filed on Oct. 4, 2016, the entire contents of which are incorporated herein by reference.

FIELD OF THE INVENTION

The present invention relates to a power generating element and in particular to technology for generating electric power by converting vibration energy into electric energy.

BACKGROUND ART

In order to attain the effective use of limited resources, there have been proposed technologies for taking out electric energy through conversion of various types of energy. One of them is technology for taking out electric energy through conversion of vibration energy. For example, Patent Document 1 given below discloses a piezoelectric-type power generating element in which a layered piezoelectric element is laminated to form a piezoelectric element for power generation, and an external force is used to cause the piezoelectric element for power generation to vibrate, thereby generating electric power. Further, Patent Document 2 discloses a power generating element which has a MEMS (Micro Electro Mechanical System) structure using a silicon substrate.

On the other hand, Patent Document 3 discloses a type of power generating element in which a hammer-head like structure body for supporting a weight body by a cantilever beam, one end of which is fixed, is used to cause the weight body which constitutes a head portion to vibrate, thereby generating electric power by the use of a piezoelectric element for power generation arranged at a handle portion. Further, Patent Document 4 discloses a piezoelectric element which uses a structure body for supporting a weight body by a plate-like bridge portion which is bent in the L letter shape, together with a power generating element which uses the hammer-head like structure body.

A basic principle of these power generating elements is to impart periodic deflection to a piezoelectric element by vibration of a weight body, thereby taking out to the outside charge generated on the basis of stress applied to the piezoelectric element. The power generating elements are mounted on, for example, automobiles, trains and ships, by which vibration energy which is applied during transportation can be taken out as electric energy. Further, they are attached to vibration sources such as refrigerators and air conditioners, thus making it possible to generate electric power.

PRIOR ART DOCUMENTS

Patent Document 1: Japanese Patent Publication No. H10-243667A
Patent Document 2: Japanese Patent Publication No. 2011-152010A
Patent Document 3: U.S. Patent Publication No 2013/0154439A
Patent Document 4: WO2015/033621

SUMMARY OF THE INVENTION

Problems to be Solved by the Invention

Where a power generating element is used by being mounted on transportation equipment such as automobiles, trains and ships, force is imparted in various directions at random during traveling. Therefore, in a power generating element mounted on the transportation equipment, it is preferable in enhancing power generation efficiency that a weight body is assumed to vibrate in various directions so that vibration energy in all directions can be converted into electric energy.

Further, there can be provided such an advantage that a power generating element which uses the plate-like bridge portions disclosed in Patent Documents 3 and 4 described above is simplified in structure to reduce costs. However, in order that sufficient deflection is imparted to the plate-like bridge portion, thereby enhancing power generation efficiency, it is necessary to make the plate-like bridge portion as long and thin as possible. Therefore, the plate-like bridge portion may be damaged upon application of excessive vibration.

Thus, an object of the present invention is to provide a power generating element which is simple in structure but able to attain high power generation efficiency by converting vibration energy which includes various direction components into electric energy without waste and which is also less likely to be damaged even where excessive vibration is applied.

Means to Solve the Problems (1) The first feature of the present invention resides in a power generating element which generates electric power by converting vibration energy into electric energy, the power generating element, comprising:

a plate-like bridge portion which extends along a first longitudinal direction axis and has flexibility;

a pedestal which supports and fixes a base end of the plate-like bridge portion;

a weight body which is directly or indirectly connected to a leading end of the plate-like bridge portion;

a piezoelectric element which is fixed at a predetermined position on a surface of the plate-like bridge portion at which expansion/contraction deformation occurs; and a power generating circuit which rectifies electric current produced on the basis of charge generated at the piezoelectric element and takes out electric power; wherein the weight body is provided with a left-hand side weight body portion which is positioned on a left hand side of the plate-like bridge portion in relation to the longitudinal direction axis and a right-hand side weight body portion which is positioned on a right hand side of the plate-like bridge portion in relation to the longitudinal direction axis.

(2) The second feature of the present invention resides in a power generating element according to the first feature, wherein a weight body supporting portion is connected to the leading end of the plate-like bridge portion, the weight body is connected to a lower surface of the weight body supporting portion, and a center of gravity of the weight body is positioned below the plate-like bridge portion.

(3) The third feature of the present invention resides in a power generating element according to the second feature, wherein the weight body supporting portion is provided with a central plate-like portion which extends along a second longitudinal direction axis orthogonal to the first longitudinal direction axis, the leading end of the plate-like bridge portion is connected to a central vicinity of the central plate-like portion, a "T" letter shaped structure body is formed by the plate-like bridge portion and the central plate-like portion; and the left-hand side weight body portion is connected to a left-side lower surface of the central plate-like portion, and the right-hand side weight body portion is connected to a right-side lower surface of the central plate-like portion.

(4) The fourth feature of the present invention resides in a power generating element according to the second feature, wherein the weight body supporting portion is provided with a central plate-like portion which extends along a second longitudinal direction axis orthogonal to the first longitudinal direction axis, with a central vicinity connected to the leading end of the plate-like bridge portion, a left-hand side plate-like portion which extends from a left side of the central plate-like portion to a left hand side of the plate-like bridge portion and a right-hand side plate-like portion which extends from a right side of the central plate-like portion to a right hand side of the plate-like bridge portion; and the left-hand side weight body portion is connected to a lower surface of the left-hand side plate-like portion, and the right-hand side weight body portion is connected to a lower surface of the right-hand side plate-like portion.

(5) The fifth feature of the present invention resides in a power generating element according to the third or fourth feature, wherein the weight body is provided with a central weight body portion which couples the left-hand side weight body portion with the right-hand side weight body portion, and the central weight body portion is connected to a lower surface of the central plate-like portion.

(6) The sixth feature of the present invention resides in a power generating element according to any one of the first to fifth features, wherein a pedestal connection portion which extends along a third longitudinal direction axis which is orthogonal to the first longitudinal direction axis is connected to the base end of the plate-like bridge portion, and the pedestal connection portion is fixed to the pedestal.

(7) The seventh feature of the present invention resides in a power generating element according to any one of the first to sixth features, wherein the pedestal gives an annular structure body which surrounds a circumference of the plate-like bridge portion and the weight body, and where acceleration in excess of a predetermined magnitude is applied to the power generating element, a part of the weight body comes into contact with a part of the annular structure body, thereby restricting further displacement.

(8) The eighth feature of the present invention resides in a power generating element according to any one of the first to seventh features, wherein the piezoelectric element is provided with a leading end left-side piezoelectric element which is arranged on a left side in a vicinity of the leading end of the plate-like bridge portion, a leading end right-side piezoelectric element which is arranged on a right side in a vicinity of the leading end of the plate-like bridge portion, a base end left-side piezoelectric element which is arranged on a left side in a vicinity of the base end of the plate-like bridge portion, and a base end right-side piezoelectric element which is arranged on a right side in a vicinity of the base end of the plate-like bridge portion.

(9) The ninth feature of the present invention resides in a power generating element according to any one of the first to eighth features, wherein the piezoelectric element is provided with a lower layer electrode which is formed in a layered manner on a surface of the plate-like bridge portion, a piezoelectric material layer which is formed in a layered manner on a surface of the lower layer electrode, and an upper layer electrode group composed of a plurality of upper layer electrodes locally formed on a surface of the piezoelectric material layer, and the piezoelectric material layer is likely to polarize in a thickness direction by application of stress which expands and contracts in a layer direction.

(10) The tenth feature of the present invention resides in a power generating device which includes the power generating element according to any one of the first to ninth features and further includes a device package which houses the power generating element, wherein the pedestal of the power generating element is fixed to the device package, and upon application of an external force which vibrates the device package, the weight body of the power generating element undergoes vibration inside the device package by deflection of the plate-like bridge portion, thereby outputting electric power taken out from the power generating circuit depending on the vibration.

(11) The eleventh feature of the present invention resides in a power generating device which includes the power generating element according to any one of the first to ninth features and further includes a device package which houses the power generating element, wherein the weight body of the power generating element is fixed to the device package, and upon application of an external force which vibrates the device package, the pedestal of the power generating element undergoes vibration inside the device package by deflection of the plate-like bridge portion, thereby outputting electric power taken out from the power generating circuit depending on the vibration.

(12) The twelfth feature of the present invention resides in a power generating element which generates electric power by converting vibration energy in a direction of each coordinate axis in an XYZ three-dimensional coordinate system into electric energy, the power generating element, comprising:

a main generating structure in which a main generating first layer, a main generating second layer and a main generating third layer are laminated sequentially from above where an XY plane is placed on a horizontal surface, a positive direction of a Z-axis is placed in an upward direction and a negative direction of the Z-axis is placed in a downward direction;

a pedestal which supports and fixes a predetermined site of the main generating structure; and a power generating circuit which rectifies electric current produced on the basis of charge generated by the main generating structure and takes out electric power; wherein the main generating second layer is a flat-plate like layer arranged along a surface parallel to the XY plane and provided with a plate-like bridge portion which is arranged on a Y-axis and has flexibility and a weight body supporting portion which supports the main generating third layer;

the weight body supporting portion is provided with a central plate-like portion which is arranged on an X'-axis which is an axis orthogonal to the Y-axis and parallel to an X-axis;

the plate-like bridge portion extends from a base end to a leading end along the Y-axis, the central plate-like portion extends along the X'-axis so as to intersect with the Y-axis, the leading end of the plate-like bridge portion is connected to a vicinity of a part intersecting with the Y-axis of the central plate-like portion, and a projection image of the plate-like bridge portion and the central plate-like portion on the XY plane assumes a "T" letter shape;

the main generating first layer is provided with a piezoelectric element which is formed so as to cover at least a part of an upper surface of the plate-like bridge portion of the main generating second layer;

the main generating third layer is connected to a lower surface of the weight body supporting portion of the main generating second layer, performing a function as a weight body having sufficient mass which causes deflection at the plate-like bridge portion on the basis of applied acceleration;

when both sides of the plate-like bridge portion are defined in such a manner that a side in which an X coordinate value is negative is defined as a left hand side, and a side in which an X coordinate value is positive is defined as a right hand side, the main generating third layer is provided with a left-hand side weight body portion positioned on the left hand side of the plate-like bridge portion and a right-hand side weight body portion positioned on the right hand side thereof;

the pedestal supports and fixes the base end of the plate-like bridge portion; and the power generating circuit is a circuit which rectifies electric current produced on the basis of charge generated at the piezoelectric element and takes out electric power.

(13) The thirteenth feature of the present invention resides in a power generating element according to the twelfth feature, wherein the weight body supporting portion of the main generating second layer is additionally provided with a left-hand side plate-like portion which extends from a left side of the central plate-like portion to a left hand side of the plate-like bridge portion along a direction parallel to the Y-axis and a right hand-side plate-like portion which extends from a right side of the central plate-like portion to a right hand side of the plate-like bridge portion along a direction parallel to the Y-axis; and the left-hand side weight body portion is connected to a lower surface of the left-hand side plate-like portion and the right-hand side weight body portion is connected to a lower surface of the right-hand side plate-like portion.

(14) The fourteenth feature of the present invention resides in a power generating element according to the twelfth or thirteenth feature, wherein the main generating third layer is provided with a central weight body portion which couples the left-hand side weight body portion with the right-hand side weight body portion, the central weight body portion is connected to a lower surface of the central plate-like portion, and a projection image of the weight body which has the left-hand side weight body portion, the right-hand side weight body portion and the central weight body portion on the XY plane assumes a "U" letter shape.

(15) The fifteenth feature of the present invention resides in a power generating element according to any one of the twelfth to fourteenth features, wherein a center of gravity of a structure body which constitutes the main generating third layer is positioned below the plate-like bridge portion.

(16) The sixteenth feature of the present invention resides in a power generating element according to any one of the twelfth to fifteenth features, wherein the main generating structure gives a plane symmetry in relation to a YZ plane, and a center of gravity of a structure body which constitutes the main generating third layer is positioned on the YZ plane below the plate-like bridge portion.

(17) The seventeenth feature of the present invention resides in a power generating element according to any one of the twelfth to sixteenth features, wherein a projection image of the main generating first layer on the XY plane is identical in shape with a projection image of the main generating second layer on the XY plane, and an entire domain of a lower surface of the main generating first layer is joined with an entire domain of an upper surface of the main generating second layer.

(18) The eighteenth feature of the present invention resides in a power generating element according to any one of the twelfth to seventeenth features, wherein an end of the main generating third layer in a positive direction of the X-axis projects in the positive direction of the X-axis to a greater extent than an end of the weight body supporting portion in the positive direction of the X-axis, an end of the main generating third layer in a negative direction of the X-axis projects in the negative direction of the X-axis to a greater extent than an end of the weight body supporting portion in the negative direction of the X-axis, an end of the main generating third layer in a positive direction of the Y-axis projects in the positive direction of the Y-axis to a greater extent than an end of the weight body supporting portion in the positive direction of the Y-axis, and an end of the main generating third layer in a negative direction of the Y-axis projects in the negative direction of the Y-axis to a greater extent than an end of the weight body supporting portion in the negative direction of the Y-axis.

(19) The nineteenth feature of the present invention resides in a power generating element according to any one of the twelfth to eighteenth features, wherein the main generating first layer constitutes a piezoelectric element which is provided with a lower layer electrode which is formed in a layered manner on a surface of the plate-like bridge portion, a piezoelectric material layer which is formed in a layered manner on a surface of the lower layer electrode, and an upper layer electrode group which is composed of a plurality of upper layer electrodes formed locally on a surface of the piezoelectric material layer;

the piezoelectric material layer is likely to polarize in a thickness direction by stress which expands and contracts in a layer direction; and the power generating circuit rectifies electric current produced on the basis of charge generated at the upper layer electrode and the lower layer electrode and takes out electric power.

(20) The twentieth feature of the present invention resides in a power generating element according to the nineteenth feature, wherein the upper layer electrode group is provided with a leading end left-side upper layer electrode, a leading end right-side upper layer electrode, a base end left-side upper layer electrode and a base end right-side upper layer electrode;

a projection image of the leading end left-side upper layer electrode on an upper surface of the main generating second layer extends in a direction parallel to the Y-axis and is positioned in a vicinity of the leading end of the plate-like bridge portion on a side in which an X coordinate value is negative;

a projection image of the leading end right-side upper layer electrode on the upper surface of the main generating second layer extends in a direction parallel to the Y-axis and is positioned in a vicinity of the leading end of the plate-like bridge portion on a side in which an X coordinate value is positive;

a projection image of the base end left-side upper layer electrode on the upper surface of the main generating second layer extends in a direction parallel to the Y-axis and is positioned in a vicinity of the base end of the plate-like bridge portion on a side in which an X coordinate value is negative; and a projection image of the base end right-side upper layer electrode on the upper surface of the main generating second layer extends in a direction parallel to the Y-axis and is positioned in a vicinity of the base end of the plate-like bridge portion on a side in which an X coordinate value is positive.

(21) The twenty-first feature of the present invention resides in a power generating element according to the nineteenth or twentieth feature, wherein the power generating circuit is provided with a capacitive element;

a positive charge rectifying element in which a direction from each of the upper layer electrodes to a positive electrode of the capacitive element is given as a forward direction in order to guide positive charge generated at each of the upper layer electrodes to the positive electrode of the capacitive element;

a negative charge rectifying element in which a direction from a negative electrode of the capacitive element to each of the upper layer electrodes is given as a forward direction in order to guide negative charge generated at each of the upper layer electrodes to the negative electrode of the capacitive element; and the power generating circuit supplies electric energy converted from vibration energy through smoothing by the use of the capacitive element.

(22) The twenty-second feature of the present invention resides in a power generating element according to any one of the nineteenth to twenty-first features, wherein the piezoelectric material layer of the main generating first layer is constituted with a piezoelectric thin film, the upper layer electrode and the lower layer electrode of the main generating first layer are constituted with a metal layer, the main generating second layer is constituted with a silicon substrate, and the main generating third layer is constituted with a metal substrate, a ceramic substrate or a glass substrate.

(23) The twenty-third feature of the present invention resides in a power generating element according to any one of the twelfth to twenty-second features, wherein the pedestal gives an annular structure body which surrounds the main generating structure along the XY plane, and when a horizontal direction component of acceleration in excess of a predetermined magnitude is applied to the power generating element, the main generating third layer comes into contact with an inner surface of the annular structure body, thereby restricting further displacement.

(24) The twenty-fourth feature of the present invention resides in a power generating element according to the twenty-third feature, wherein the pedestal gives a rectangular frame-like structure body having four sets of wall portions composed of a first wall portion, a second wall portion, a third wall portion and a fourth wall portion;

the first wall portion is adjacently arranged in a negative direction of the X-axis in relation to the main generating structure to constitute a wall surface along a plane parallel to the YZ plane;

the second wall portion is adjacently arranged in a positive direction of the X-axis in relation to the main generating structure to constitute a wall surface along a plane parallel to the YZ plane;

the third wall portion is adjacently arranged in a positive direction of the Y-axis in relation to the main generating structure to constitute a wall surface along a plane parallel to the XZ plane;

the fourth wall portion is adjacently arranged in a negative direction of the Y-axis in relation to the main generating structure to constitute a wall surface along a plane parallel to the XZ plane; and the base end of the plate-like bridge portion is supported and fixed to the fourth wall portion.

(25) The twenty-fifth feature of the present invention resides in a power generating element according to the twenty-third or twenty-fourth feature, wherein the pedestal is constituted with a laminated structure body in which a pedestal first layer, a pedestal second layer and a pedestal third layer are laminated sequentially from above, the pedestal first layer continues to the main generating first layer in a vicinity of the base end of the plate-like bridge portion, and the pedestal second layer continues to the main generating second layer at the base end of the plate-like bridge portion.

(26) The twenty-sixth feature of the present invention resides in a power generating element according to the twenty-third or twenty-fourth feature, wherein the main generating second layer is additionally provided with a pedestal connection portion which is connected to the base end of the plate-like bridge portion, and the pedestal connection portion is arranged on a predetermined arrangement axis orthogonal to the Y-axis and parallel to the X-axis and extends along the arrangement axis; and a fitting groove for fitting the pedestal connection portion is formed at a predetermined site on an upper surface of the pedestal, and the pedestal connection portion is fixed in a state of being fitted into the fitting groove.

(27) The twenty-seventh feature of the present invention resides in a power generating device which includes the power generating element according to any one of the twelfth to twenty-sixth features and further includes a device package which houses the power generating element, wherein the pedestal of the power generating element is fixed to the device package, and upon application of an external force which causes vibration at the device package, the main generating third layer of the power generating element undergoes vibration inside the device package by deflection of the plate-like bridge portion, thereby outputting electric power taken out from the power generating circuit depending on the vibration.

(28) The twenty-eighth feature of the present invention resides in a power generating device according to the twenty-seventh feature, wherein the device package is provided with a base substrate which supports and fixes the power generating element from below, an upper lid substrate which covers above the power generating element, and a side wall plate which is arranged so as to surround the power generating element and couples the base substrate with the upper lid substrate;

a bottom surface of the pedestal of the power generating element is positioned below a bottom surface of the main generating third layer of the power generating element, the bottom surface of the pedestal is fixed to an upper surface of the base substrate, and there is formed a lower clearance portion between the upper surface of the base substrate and the bottom surface of the main generating third layer;

the upper lid substrate is positioned above an upper surface of the main generating first layer of the power generating element, there is formed an upper clearance portion between a lower surface of the upper lid substrate and the upper surface of the main generating first layer; and when a perpendicular direction component of acceleration in excess of a predetermined magnitude is applied to the power generating element, a part of the main generating structure comes into contact with the upper surface of the base substrate or the lower surface of the upper lid substrate, thereby restricting further displacement.

(29) The twenty-ninth feature of the present invention resides in a power generating device which includes the power generating element according to any one of the twelfth to twenty-sixth features and further includes a device package which houses the power generating element, wherein the main generating third layer of the power generating element is fixed to the device package, and upon application of an external force which vibrates the device package, the pedestal of the power generating element undergoes vibration inside the device package by deflection of the plate-like bridge portion, thereby outputting electric power taken out from the power generating circuit depending on the vibration.

(30) The thirtieth feature of the present invention resides in a power generating device according to the twenty-ninth feature, wherein the device package is provided with a base substrate which supports and fixes the power generating element from below, an upper lid substrate which covers above the power generating element, and a side wall plate which is arranged so as to surround the circumference of the power generating element and couples the base substrate with the upper lid substrate;

a bottom surface of the pedestal of the power generating element is positioned above a bottom surface of the main generating third layer of the power generating element, the bottom surface of the main generating third layer is fixed to an upper surface of the base substrate, and there is formed a lower clearance portion between the upper surface of the base substrate and the bottom surface of the pedestal;

the upper lid substrate is positioned above an upper surface of the main generating first layer of the power generating element, and there is formed an upper clearance portion between a lower surface of the upper lid substrate and the upper surface of the main generating first layer; and when a perpendicular direction component of acceleration in excess of a predetermined magnitude is applied to the power generating element, a part of the pedestal comes into contact with the upper surface of the base substrate or the lower surface of the upper lid substrate, thereby restricting further displacement.

(31) The thirty-first feature of the present invention resides in a structure body for power generating element in which the power generating circuit is removed from the power generating element according to any one of the first to ninth features and the twelfth to twenty-sixth features.

Effects of the Invention

The power generating element according to the present invention adopts such a cantilever beam structure that a base end of a flexible plate-like bridge portion is fixed to a pedestal and a weight body is connected to a leading end thereof, and electric power is generated by a piezoelectric element which is fixed to the plate-like bridge portion. Further, since the weight body is provided with a left-hand side weight body portion positioned on the left hand side of the plate-like bridge portion and a right-hand side weight body portion positioned on the right hand side thereof, it is able to transmit at high efficiency an external force which allows the plate-like bridge portion to deflect in various directions. Still further, a member which restricts displacement of the weight bodys on both sides is installed, thus making it possible to restrict displacement of the plate-like bridge portion even upon application of excessive vibration and to prevent damage to the plate-like bridge portion.

As described above, according to the present invention, it is possible to realize a power generating element which is simple in structure but able to attain high power generation efficiency by converting vibration energy which includes various direction components into electric energy without waste and which is also less likely to be damaged even upon application of excessive vibration.

BRIEF DESCRIPTION OF THE DRAWINGS

In FIG. 28(A), the reference numerals in parentheses indicate constituents of individual layers.

DESCRIPTION OF THE PREFERRED EMBODIMENTS

Hereinafter, a description will be given of the present invention by referring to illustrated embodiments.

Chapter 1. Structure of Power Generating Element According to Basic Embodiment

Figure 1:
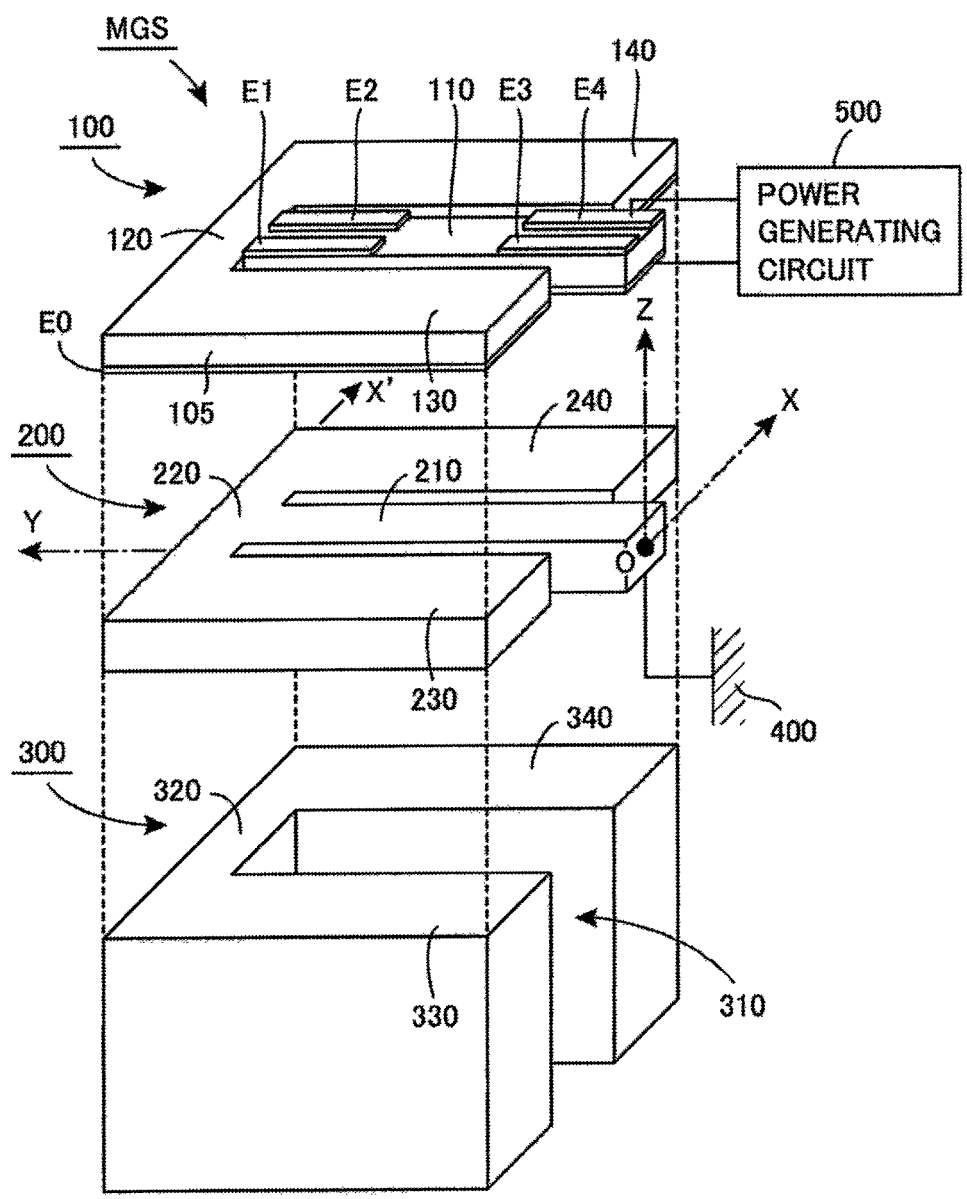
FIG. 1 covers a perspective view which shows a constitution of a power generating element PGE according to a basic embodiment of the present invention (a three-layered portion which constitutes a main generating structure MGS is shown separately) and a block diagram thereof.

FIG. 1 covers a perspective view and a block diagram, each of which shows a constitution of the power generating element PGE (abbreviation of Power Generating Element) according to the basic embodiment of the present invention. As shown in the perspective view, the power generating element PGE is provided with a three-layered structure body in which a first layer 100, a second layer 200 and a third layer 300 are laminated. In the perspective view of FIG. 1, for convenience of description, there is shown a state that each of the three layers is separated in a vertical direction. However, in practice, an upper surface of the second layer 200 is firmly attached to a lower surface of the first layer 100 and an upper surface of the third layer 300 is firmly attached to a lower surface of the second layer 200, by which these three layers are given as a structure body so as to be joined with each other.

The three-layered structure body performs a fundamental function to generate electric power in the power generating element PGE according to the present invention. Thus, in the application concerned, the three-layered structure body is referred to as a main generating structure MGS (abbreviation of Main Generating Structure) and the first layer 100, the second layer 200 and the third layer 300 are respectively referred to as "a main generating first layer," "a main generating second layer" and "a main generating third layer." The power generating element PGE according to the present invention is constituted by adding a pedestal 400 (indicated simply with a symbol in the drawing) and a power generating circuit 500 (indicated with a block in the drawing) to the main generating structure MGS which is composed of the three layers.

The pedestal 400 plays a role of supporting and fixing a part of the main generating structure MGS (a right end surface in the drawing), and a specific structure thereof will be described in detail in Chapter 3. It is noted that, as will be described in Chapter 3, in the case of the basic embodiment of the present invention, the pedestal 400 is also provided with a three-layered structure, as with the main generating structure MGS. The layers which constitute the pedestal 400 are respectively referred to as "a pedestal first layer," "a pedestal second layer" and "a pedestal third layer" for distinction.

Here, as shown in the perspective view of FIG. 1, an origin O is defined at a center position on a right end surface of the main generating second layer 200, and the X-axis, the Y-axis and Z-axis are placed respectively in the depth direction, in the left side direction and in the upper direction, thereby defining an XYZ three-dimensional orthogonal coordinate system. In the following description of the application concerned, a description will be given of a vertical relationship between individual constituents under conditions that the XY plane is, as illustrated, placed on a horizontal surface, the positive direction of the Z-axis is placed in an upward direction and the negative direction of the Z-axis is placed in a downward direction. Therefore, the main generating structure MGS is a structure body in which the main generating first layer 100, the main generating second layer 200 and the main generating third layer 300 are laminated sequentially from above.

The power generating element PGE according to the present invention has a function to generate electric power by converting vibration energy in the direction of each coordinate axis in the above-descried XYZ three-dimensional coordinate system into electric energy. It is noted that an illustrated coordinate system is one example used for convenience of description and the coordinate system is not necessarily positioned at an illustrated site. For example, the origin O is not positioned on a right end surface of the main generating second layer 200 but may be defined at a position of the center of gravity of the main generating second layer 200. However, the right end surface of the main generating second layer 200 is a portion which is fixed by the pedestal 400. Thus, here, the origin O is defined at the center position of the right end surface for convenience of description, thereby giving the following description.

The main generating first layer 100 is a flat-plate like structure body, the planar shape of which is formed in the "E" letter shape, and a main portion thereof is constituted with a piezoelectric material layer 105. More specifically, the main generating first layer 100 is constituted with a three-layered structure body which is composed of the piezoelectric material layer 105, upper layer electrodes E1 to E4 formed in a predetermined domain of the upper surface thereof and a lower layer electrode E0 formed in an entire domain of the lower surface thereof. Here, the piezoelectric material layer 105 is likely to polarize in the thickness direction by application of stress which expands and contracts in the layer direction. Therefore, when stress is applied to each portion of the piezoelectric material layer 105 to cause deflection, polarization takes place in the thickness direction, by which charge is generated on the upper layer electrodes E1 to E4 and the lower layer electrode E0.

Whereas the lower layer electrode E0 is a single common electrode which is formed on the lower surface of the piezoelectric material layer 105 in its entirety, each of the upper layer electrodes E1 to E4 is a localized electrode which is formed at each predetermined domain of the piezoelectric material layer 105. This is due to the fact that stress applied to each portion of the piezoelectric material layer 105 (whether it is compression-direction stress or expansion-direction stress) is different in direction depending on a direction of an external force which is applied, by which charge to be generated may be different in polarity.

The power generating circuit 500 has a function to rectify electric current produced on the basis of the thus generated charge and take out electric power. Electric power generated by the power generating element PGE is to be supplied to the outside from the power generating circuit 500. In FIG. 1, for convenience of illustration, as wiring of the power generating circuit 500, only wiring to the upper layer electrode E4 and the lower layer electrode E0 is shown. In practice, similar wiring is given also between the upper layer electrodes E2 to E4 and the power generating circuit 500.

Figure 2:
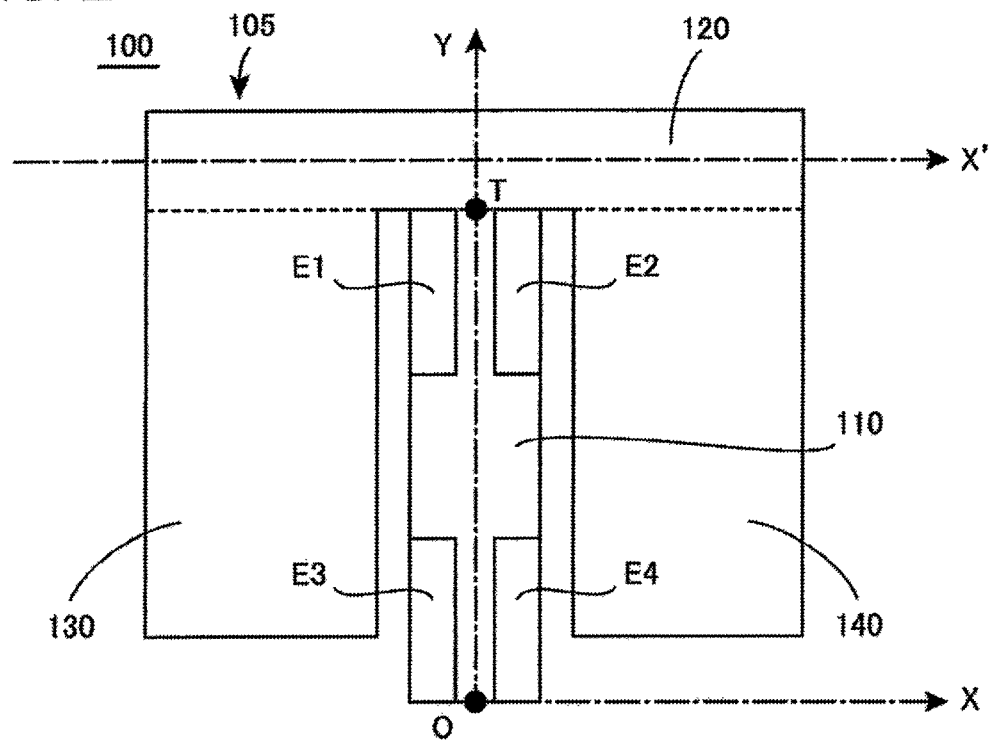
FIG. 2 is a top view of a main generating first layer 100 of the main generating structure MGS shown in FIG. 1.

FIG. 2 is a top view of the main generating first layer 100 of the main generating structure MGS shown in FIG. 1 and this is a two-dimensional plane view in which the X-axis is placed in the right side direction on the drawing and the Y-axis is taken in the upward direction in the drawing. It is noted that the X-axis, the Y-axis and the origin O shown in FIG. 2 are actually positioned below the main generating first layer 100 (that is, inside the main generating second layer 200). As described above, the main generating first layer 100 is such that four upper layer electrodes E1 to E4 are formed on the upper surface of the piezoelectric material layer 105 in the "E" letter shape, and one lower layer electrode E0 (not appearing in FIG. 2) is formed on the lower surface thereof.

The piezoelectric material layer 105 is in practice a single plate-like integrated structure body in the "E" letter shape. However, here, for convenience of description, it is to be taken as being divided into four portions of 110, 120, 130 and 140, as illustrated. Each portion is constituted with a flat-plate like piezoelectric material layer which is arranged along the surface parallel to the XY plane.

The portion 110 is a portion which has a bridge structure extending along the Y-axis and, here, it is referred to as a bridge portion piezoelectric layer 110. As shown in the drawing, the bridge portion piezoelectric layer 110 is a portion arranged at a section from the origin O to a leading end point T (a point defined on the Y-axis) along the Y-axis. Each of the four upper layer electrodes E1 to E4 is arranged on the upper surface of the bridge portion piezoelectric layer 110. It is noted that wiring is in practice given between the power generating circuit 500 and the upper layer electrodes E1 to E4 and the lower layer electrode E0, but the wiring is not illustrated here.

The portion 120 is a portion extending along an X'-axis (an axis orthogonal to the Y-axis and parallel to the X-axis), and a central portion thereof continues to the bridge portion piezoelectric layer 110 at a position of the leading end point T. Here, the portion 12Q is referred to as a central piezoelectric layer. The bridge portion piezoelectric layer 110 and the central piezoelectric layer 120 constitute a structure body, the planar shape of which is formed in the T letter shape.

The portion 130 is a wing-like portion which extends from the left side of the central piezoelectric layer 120 to below in the drawing and is arranged on the left hand side of the bridge portion piezoelectric layer 110. Here, this portion 130 is referred to as a left-hand side piezoelectric layer 130. On the other hand, the portion 140 is a wing-like portion which extends from the right side of the central piezoelectric layer 120 to below in the drawing and is arranged on the right hand side of the bridge portion piezoelectric layer 110. Here, this portion 140 is referred to as a right-hand side piezoelectric layer 140.

It is noted that in the application concerned, for convenience of description, as shown in FIG. 2, the right side and the left side are defined, with a top view in which the Y-axis is drawn in a lengthwise direction taken into account. Therefore, a side in which an X coordinate value is negative in relation to the YZ plane is referred to as the left side, while a side in which an X coordinate value is positive in relation to the Y-axis is referred to as the right side. According to the above definition, the left-hand side piezoelectric layer 130 is arranged on the left hand side of the bridge portion piezoelectric layer 110, and the right-hand side piezoelectric layer 140 is arranged on the right hand side of the bridge portion piezoelectric layer 110. Of course, the above definition of the right side and the left side is given only for describing a relative positional relationship with the YZ plane and has no absolute meaning.

In FIG. 2, the lower end of the bridge portion piezoelectric layer 110 in the drawing (the vicinity of the origin O) extends below as compared with the lower end of the left-hand side piezoelectric layer 130 and the lower end of the right-hand side piezoelectric layer 140. This is because, as shown in the perspective view of FIG. 1, the vicinity of the origin O on the main generating second layer 200 is connected to the pedestal 400. As will be described below, stress will concentrate at the vicinity of a connection end with the pedestal 400. Therefore, the upper layer electrodes E3 and E4 are arranged at stress concentrating portions, by which electric power can be generated at higher efficiency.

Figure 3:
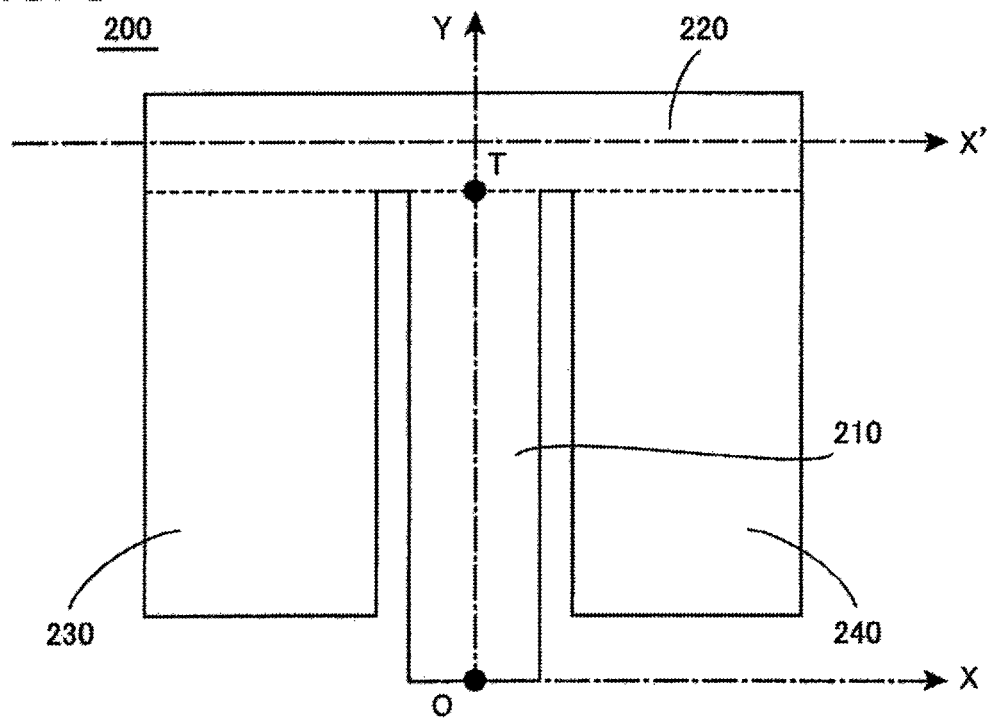
FIG. 3 is a top view of a main generating second layer 200 of the main generating structure MGS shown in FIG. 1.

FIG. 3 is a top view of the main generating second layer 200 of the main generating structure MGS shown in FIG. 1. This is also a two-dimensional plan view in which the X-axis is placed in the right side direction in the drawing, and the Y-axis is placed in the upward direction in the drawing. The X-axis, the Y-axis and the origin O shown in FIG. 3 are actually arranged at a position embedded inside the main generating second layer 200 (an intermediate positioned in the thickness direction).

The main generating second layer 200 is also a plate-like structure body which is formed in the "E" letter shape. In the case of the basic embodiment shown here, a projection image of the main generating first layer 100 shown in FIG. 2 on the XY plane is identical in shape with a projection image of the main generating second layer 200 shown in FIG. 3 on the XY plane. An entire domain of the lower surface of the main generating first layer 100 is joined with an entire domain of the upper surface of the main generating second layer 200. Therefore, the main generating second layer 200 can also be defined for four portions of 210, 220, 230, 240, as with the main generating first layer 100. Each of the portions is constituted with a flat-plate like layer which is arranged along a surface parallel to the XY plane. Of course, in practice, the main generating second layer 200 is a single plate-like integrated structure body formed in the "E" letter shape and the above-described four portions are provided only for convenience of describing the plate-like integrated structure body by being divided into individual sections.

First, the portion 210 is a portion which is arranged on the Y-axis and provided with a flexible bridge structure. Here, the portion 210 is referred to as a plate-like bridge portion 210. The plate-like bridge portion 210 is a thin beam-like structure body which extends along the Y-axis from the origin O up to the leading end point T (one point on the Y-axis). This portion is flexible and, therefore, likely to deform in various directions. Here, for convenience of description, the vicinity of the origin O of the plate-like bridge portion 210 is referred to as a base end, while the vicinity of the leading end point T is referred to as a leading end. The plate-like bridge portion 210 is a narrow plate-like member which extends along the Y-axis from the base end to the leading end.

Here, the base end of the plate-like bridge portion 210 (the vicinity of origin O) is supported and fixed by being joined with the pedestal 400 (not illustrated in FIG. 3). As the pedestal 400 is fixed to a device package or the like, the base end is also kept fixed. In contrast, the leading end of the plate-like bridge portion 210 (the vicinity of the leading end point T) is a free end which can undergo displacement within a degree of freedom of deformation of the plate-like bridge portion 210.

The bridge portion piezoelectric layer 110 shown in FIG. 2 is firmly attached on the upper surface of the plate-like bridge portion 210 shown in FIG. 3. As will be described below, the plate-like bridge portion 210 is likely to deflect by vibration of the weight body. The deflection is transmitted to the bridge portion piezoelectric layer 110 firmly attached on the upper surface thereof, by which charge is generated on the basis of the thus caused stress.

On the other hand, of the portions 220, 230, 240 (portions excluding the plate-like bridge portion 210 of the main generating second layer 200) are collectively referred to as a weight body supporting portion. As shown in the drawing, the weight body supporting portion continues to the plate-like bridge portion 210 at the leading end point T. Roles of the weight body supporting portion are literally to support the weight body (the main generating third layer 300), thereby transmitting vibration of the weight body to the leading end of the plate-like bridge portion 210 (the vicinity of the leading end point T). In the case of the basic embodiment shown here, the weight body supporting portion is a "U" letter shaped member which has a central plate-like portion 220, a left-hand side plate-like portion 230 and a right-hand side plate-like portion 240.

The central plate-like portion 220 is a narrow plate-like member which is arranged on the X'-axis orthogonal to the Y-axis and parallel to the X-axis and extends along the X'-axis so as to intersect with the Y-axis. Then, a central portion of the central plate-like portion 220 continues to a leading end of the plate-like bridge portion 210 at a position of the leading end point T. That is, the leading end of the plate-like bridge portion 210 is connected to the vicinity of a part intersecting with the Y-axis of the central plate-like portion 220. As a result, a projection image of the plate-like bridge portion 210 and the central plate-like portion 220 on the XY plane assumes the T letter shape. The central piezoelectric layer 120 shown in FIG. 2 is firmly attached on the upper surface of the central plate-like portion 220 shown in FIG. 3.

On the other hand, the left-hand side plate-like portion 230 is a plate-like member which extends along a direction parallel to the Y-axis from the left side of the central plate-like portion 220 to the left hand side of the plate-like bridge portion 210. The right-hand side plate-like portion 240 is a plate-like member which extends along a direction parallel to the Y-axis from the right side of the central plate-like portion 220 to the right hand side of the plate-like bridge portion 210. The left-hand side piezoelectric layer 130 shown in FIG. 2 is firmly attached on the upper surface of the left-hand side plate-like portion 230 shown in FIG. 3, and the right-hand side piezoelectric layer 140 shown in FIG. 2 is firmly attached on the upper surface of the right-hand side plate-like portion 240 shown in FIG. 3.

In FIG. 3, the lower end (the base end) of the plate-like bridge portion 210 in the drawing extends below, as compared with the lower end of the left-hand side plate-like portion 230 or the lower end of the right-hand side plate-like portion 240. This is because, as shown in the perspective view of FIG. 1, the base end of the plate-like bridge portion 210 (the vicinity of the origin O) is connected to the pedestal 400. Stress applied to the plate-like bridge portion 210 by vibration of the weight body will concentrate at the base end (the vicinity of a connection end with the pedestal 400) and the leading end (the vicinity of the connection end with the central plate-like portion 220).

Figure 4:
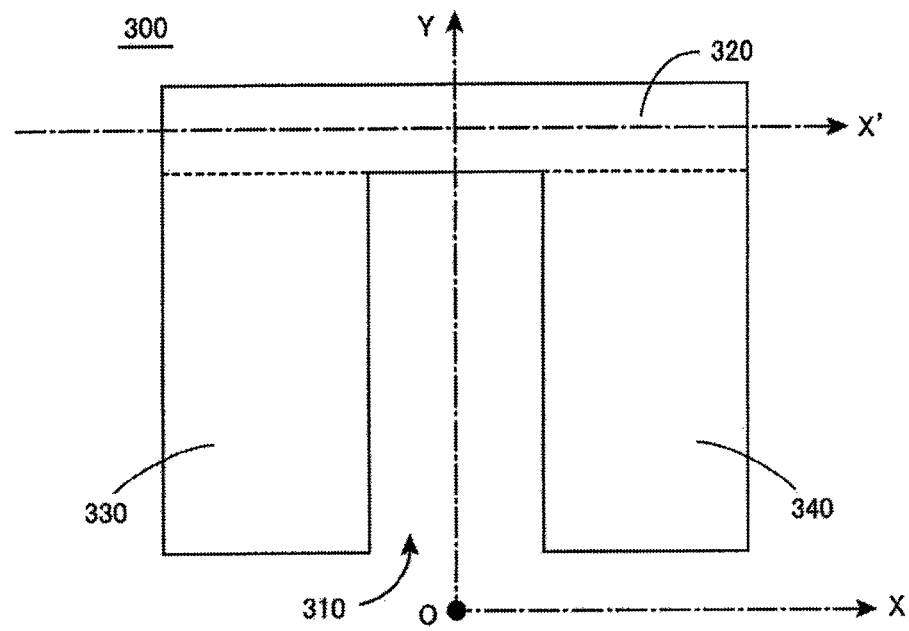
FIG. 4 is a top view of a main generating third layer 300 of the main generating structure MGS shown in FIG. 1.

FIG. 4 is a top view of the main generating third layer 300 of the main generating structure MGS shown in FIG. 1, and this is also a two-dimensional plan view in which the X-axis is placed in the right side direction in the drawing and the Y-axis is placed in the upward direction in the drawing. The X-axis, the Y-axis and the origin O shown in FIG. 4 are actually positioned above the main generating third layer 300. The main generating third layer 300 is connected to the lower surfaces of the weight body supporting portions 220, 230, 240 shown in FIG. 3, playing a function as a weight body having sufficient mass for causing deflection at the plate-like bridge portion 210 on the basis of acceleration which has been applied. The weight body causes vibration by force based on acceleration which has been applied from the outside, thereby playing a role of causing temporally varying elastic deformation at the plate-like bridge portion 210.

In the case of the basic embodiment shown here, the main generating third layer 300 (the weight body) is, as shown in FIG. 4, constituted with the central weight body portion 320, the left-hand side weight body portion 330 and the right-hand side weight body portion 340. The central weight body portion 320 is a narrow portion which extends along the X'-axis (an axis intersecting with the Y-axis and parallel to the X-axis), playing a role of connecting the left-hand side weight body portion 330 with the right-hand side weight body portion 340.

Further, as described above, with regard to both sides of the plate-like bridge portion 210, a side in which an X coordinate value is negative is defined as a left hand side, while a side in which an X coordinate value is positive is defined as a right hand side. In this case, the left-hand side weight body portion 330 is a weight body which extends along a direction parallel to the Y-axis from the left side of the central weight body portion 320 to the left hand side of the plate-like bridge portion 210, and the right-hand side weight body portion 340 is a weight body which extends along a direction parallel to the Y-axis from the right side of the central weight body portion 320 to the right hand side of the plate-like bridge portion 210.

The central weight body portion 320 shown in FIG. 4 is firmly attached on the lower surface of the central plate-like portion 220 shown in FIG. 3. The left-hand side weight body portion 330 shown in FIG. 4 is firmly attached on the lower surface of the left-hand side plate-like portion 230 shown in FIG. 3. The right-hand side weight body portion 340 shown in FIG. 4 is firmly attached on the lower surface of the right-hand side plate-like portion 240 shown in FIG. 3. Resultantly, a projection image of the weight body having the left-hand side weight body portion 330, the central weight body portion 320 and the right-hand side weight body portion 340 on the XY plane assumes the "U" letter shape. It is noted that in the main generating third layer 300, a void portion 310 is formed at a position directly under the plate-like bridge portion 210. The plate-like bridge portion 210 is able to undergo downward displacement (in the negative direction of the Z-axis) due to the presence of the void portion 310.

In practice, the main generating third layer 300 is an integrated structure body formed in the "U" letter shape. The above-described three portions are for convenience of describing the integrated structure body by being divided into individual sections.

Figure 5:
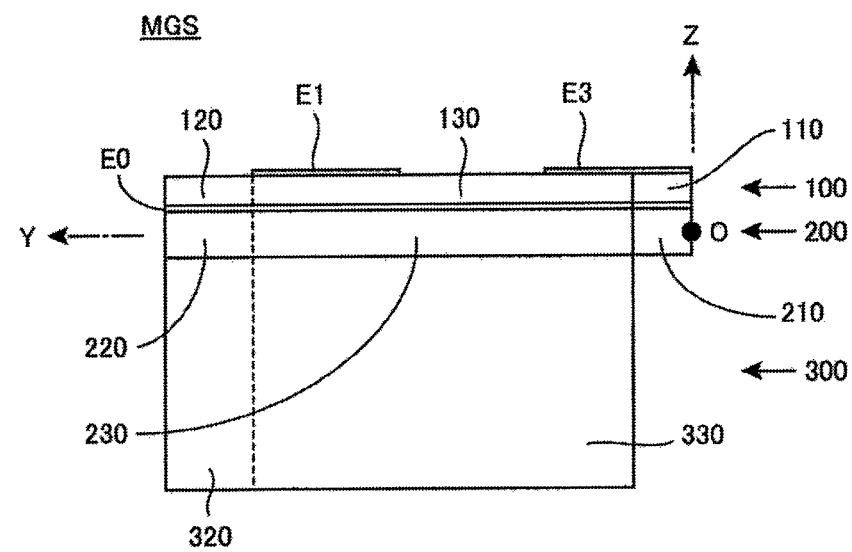
FIG. 5 is a side elevational view of the main generating structure MGS shown in FIG. 1.

FIG. 5 is a side elevational view of the main generating structure MGS shown in FIG. 1. As described above, in practice, the main generating first layer 100, the main generating second layer 200 and the main generating third layer 300 shown in FIG. 1 constitute a three-layered structure body which is joined with each other in a state of being laminated in the vertical direction. Each of the layers may be joined by adhesion with the use of an adhesive agent, for example (as will be described below, the layers can be formed by methods such as printing, vapor deposition and spattering). FIG. 5 is a side elevational view obtained when the thus layered main generating structure MGS is observed from the negative direction of the X-axis to the positive direction of the X-axis. Therefore, the origin O of the coordinate system is positioned at the right end in the drawing, the depth direction perpendicular to the sheet surface in the drawing is the positive direction of the X-axis, the left side direction in the drawing is the positive direction of the Y-axis, and the upward direction in the drawing is the positive direction of the Z-axis.

In FIG. 5, the base end of the plate-like bridge portion 210 is indicated in the vicinity of the origin O at the portion of the main generating second layer 200. There are observed the central plate-like portion 220 and the left-hand side plate-like portion 230 which are positioned in front of the plate-like bridge portion 210. At the portion of the main generating first layer 100 positioned above the main generating second layer 200, the bridge portion piezoelectric layer 110, the central piezoelectric layer 120 and the left-hand side piezoelectric layer 130 are observed on the upper surface of the lower layer electrode E0. On the further upper surface thereof, there are observed the upper layer electrodes E1, E3 (the upper layer electrodes E2, E4 are hidden behind thereof). Further, as the portion of the main generating third layer 300 positioned below the main generating second layer 200, there are observed the central weight body portion 320 and the left-hand side weight body portion 330. The right end of each of the bridge portion piezoelectric layer 110 and the plate-like bridge portion 210 which projects in the right side direction in the drawing (the vicinity of the origin O) is firmly attached to the pedestal 400 which is not shown in the drawing.

As shown in the drawing, the main generating first layer 100 constitutes a piezoelectric element (the piezoelectric material layer 105 and upper and lower electrodes) formed so as to cover the upper surface of the main generating second layer 200. The main generating third layer 300 (the weight body formed in the "U" letter shape) is joined below the main generating second layer 200. When the weight body undergoes displacement on the basis of acceleration which has been applied, the main generating second layer 200 (in particular, the portion of the plate-like bridge portion 210) deflects, and the deflection is transmitted to the portion of the main generating first layer 100 formed on the upper surface thereof (in particular, the bridge portion piezoelectric layer 110), by which charge is generated at the upper layer electrodes E1 to E4 and the lower layer electrode E0.

Figure 6:
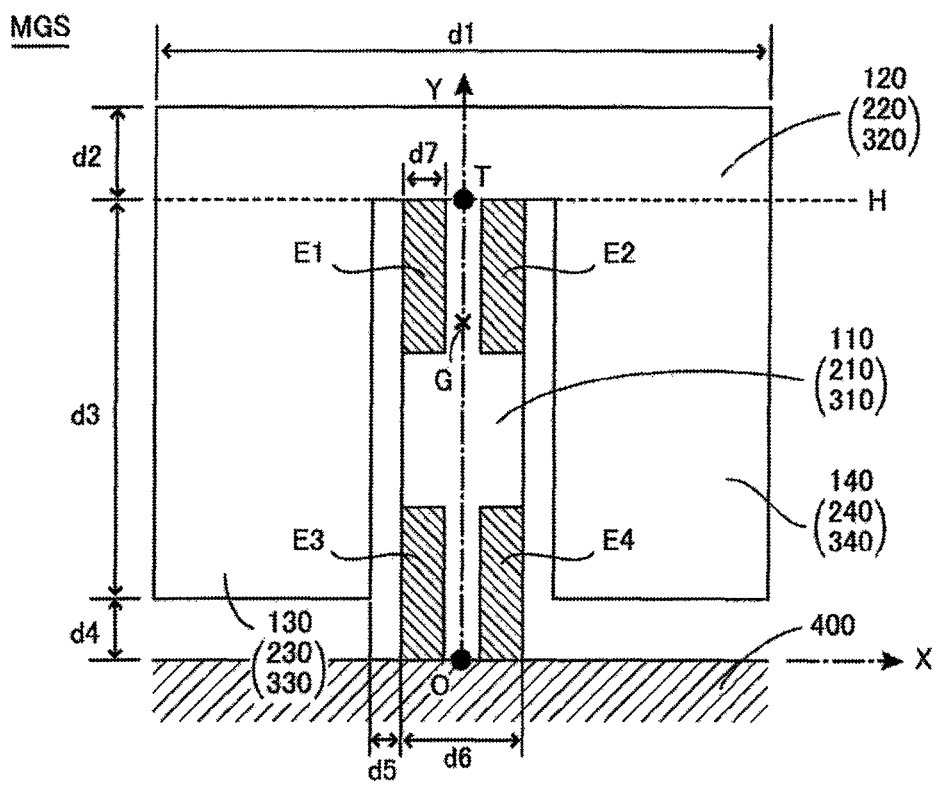
FIG. 6 is a top view which shows a state that the main generating structure MGS given in FIG. 1 is fixed to a pedestal 400 (hatching is given for indicating each domain at which upper layer electrodes are formed and a state of being fixed to the pedestal and not for indicating a cross section. The reference numerals in parentheses indicate constituents arranged below).

FIG. 6 is a top view which shows a state that the main generating structure MGS shown in FIG. 1 is fixed to the pedestal 400. Hatching given in the drawing is to indicate a domain at which each of the upper layer electrodes is formed and a state of being fixed to the pedestal 400 and not to indicate a cross section. Further, the reference numerals in parentheses indicate constituents arranged below. Here, when attention is given to a planar shape of each of the four upper layer electrodes E1 to E4 arranged on the upper surface of the bridge portion piezoelectric layer 110, each of them is given as a narrow and rectangular electrode extending in the direction of the Y-axis.

Further, when attention is given to an arrangement of the four upper layer electrodes E1 to E4, the upper ends of the upper layer electrodes E1, E2 are arranged at a position so as to be aligned with a boundary line H (a boundary line between the bridge portion piezoelectric layer 110 and the central piezoelectric layer 120), and the lower ends of the upper layer electrodes E3, E4 are arranged at a position so as to be aligned with the lower end of the bridge portion piezoelectric layer 110 (a position so as to be aligned with the X-axis). Further, the upper layer electrodes E1, E3 are arranged on the left side of the bridge portion piezoelectric layer 110 (a position at which an X coordinate value is negative), while the upper layer electrodes E2, E4 are arranged on the right side of the bridge portion piezoelectric layer 110 (a position at which an X coordinate value is positive).

As described in Chapter 2, the thus described shape and arrangement of the upper layer electrodes E1 to E4 are favorable in generating electric power efficiently. In FIG. 6, under the part of "U" letter shape (the central piezoelectric layer 120, the left-hand side piezoelectric layer 130 and the right-hand side piezoelectric layer 140), there are joined the weight body supporting portion (the central plate-like portion 220, the left-hand side plate-like portion 230, the right-hand side plate-like portion 240) and the weight body (the main generating third layer, namely, the central weight body portion 320, the left-hand side weight body portion 330 and the right-hand side weight body portion 340), each of which is also formed in the "U" letter shape. When force on the basis of vibration of the weight body is applied to the vicinity of the leading end point T, (refer to FIG. 7 which will be described below), the bridge portion piezoelectric layer 110 undergoes deflection together with the plate-like bridge portion 210 which is a supporting layer thereof, by which charge is generated at each of the upper layer electrodes E1 to E4, depending on the deflection. An arrangement of the electrodes shown in the drawing is suitable for generating the charge efficiently (details will be described in Chapter 2). As described above, electric current produced on the basis of charge generated by the main generating structure MGS is rectified by the power generating circuit 500 and taken out as electric power.

Figure 7:
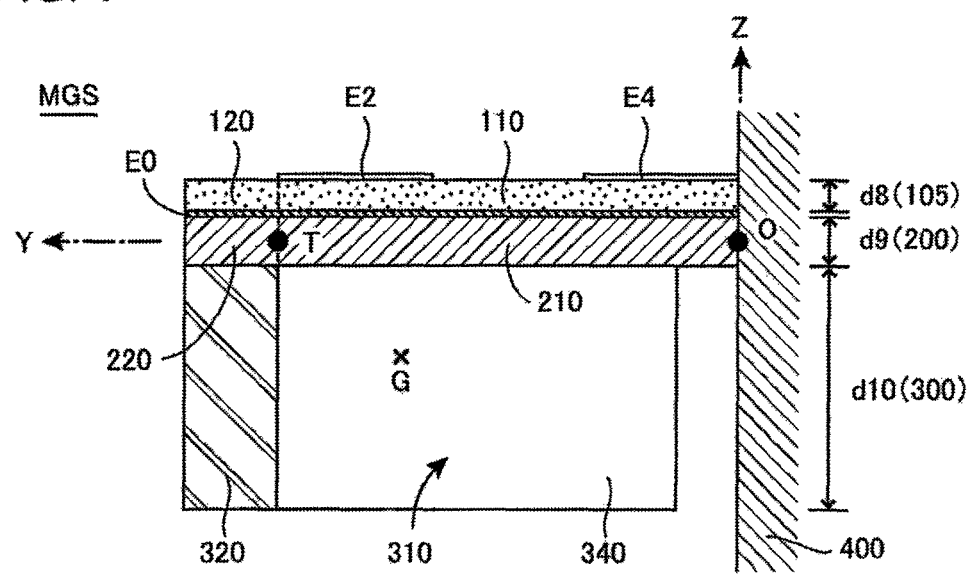
FIG. 7 is a side sectional view which shows a state that the main generating structure MGS given in FIG. 1 is fixed to the pedestal 400 (indicating a cross section cut along the YZ plane).

FIG. 7 is a side sectional view which shows a state that the main generating structure MGS shown in FIG. 1 is fixed to the pedestal 400. This drawing corresponds to a cross section in which the main generating structure MGS shown in FIG. 6 is cut along the YZ plane at the center.

In the side sectional view, at the portion of the main generating second layer 200, there are shown cross sections of the plate-like bridge portion 210 from the origin O (the base end) to the leading end point T (the leading end) and the central plate-like portion 220. Further, at the portion of the main generating first layer 100, there are shown cross sections of the bridge portion piezoelectric layer 110, the central piezoelectric layer 120 and the lower layer electrode E0 and side surfaces of the upper layer electrodes E2, E4.

Then, at the portion of the main generating third layer 300 (the weight body), there are shown cross sections of the central weight body portion 320 and the side surface of the right-hand side weight body portion 340. A void portion 310 is formed in front of the right-hand side weight body portion 340, and the plate-like bridge portion 210 is able to undergo downward displacement due to the presence of the void portion 310.

In the case of the example shown in the drawing, the base end of the plate-like bridge portion 210 and the base end of the bridge portion piezoelectric layer 110 are both joined with the pedestal 400 so as to be supported and fixed. However, at least the base end of the plate-like bridge portion 210 may be supported and fixed to the pedestal 400. In short, the weight body may be supported by a cantilever beam structure with respect to the pedestal 400 and in a state of being suspended via the plate-like bridge portion 210.

Further, in the application concerned, a dimensional ratio of each portion in the drawings is not necessarily in agreement with a dimensional ratio of an actual product. For convenience of description, the drawings are depicted, with an actual dimensional ratio disregarded. Thus, in FIG. 6 and FIG. 7, actual dimensions of individual portions are indicated with the reference numerals d1 to d10 for reference. Values of the actual dimensions, d1 to d10, may be set, for example, to be the following values, as long as a power generating element PGE with a MEMS structure is constituted. Of course, the following dimensions are provided just as one example, and dimensions of individual portions shall not be limited to the dimensional values given below in carrying out the present invention.

d1=1000 μm, d2=200 μm, d3=800 μm, d4=100 μm, d5=50 μm, d6=200 μm, d7=70 μm, d8 (thickness of the piezoelectric material layer 105)=2 μm (in practice, 2 μm or more is preferable), d9 (thickness of the main generating second layer 200)=200 μm, d10 (thickness of the main generating third layer 300)=1000 μm. The lower layer electrode E0 and the upper layer electrodes E1 to E4 are 0.01 μm in thickness.

It is noted that in general, electric power can be generated at the highest efficiency where resonance frequency of the weight body which is determined by a specific structure of the main generating structure MGS is matched with frequency of vibration applied from the outside. Therefore, where frequency of vibration applied from the outside is assumed in advance, it is preferable that the main generating structure MGS is designed so that the resonance frequency is matched with the assumed frequency at a stage of structure design, that is, the MGS is designed so that dimensions of the above-described portions are set in appropriate values.

In general, frequency of vibration occurring in transportation equipment such as automobiles, trains and ships or industrial equipment in which motors, etc., are used is usually in a range from several Hz to several hundred Hz. In most cases, vibration occurs in a range from 10 Hz to 50 Hz in particular. Therefore, it is preferable that the main generating structure MGS is designed so that resonance frequency in the direction of each coordinate axis is within a range from 10 Hz to 50 Hz on the assumption of being mounted on general equipment to generate electric power.

It is noted that for convenience of the above description, only the portion of the main generating third layer 300 is referred to as the weight body. However, in practice, of individual constituents of the main generating structure MGS, all the parts excluding the bridge portion piezoelectric layer 110 and the plate-like bridge portion 210 play a role as the weight body in its entirety, thereby performing a function to cause displacement at the leading end point T. For example, the central piezoelectric layer 120, the left-hand side piezoelectric layer 130 and the right-hand side piezoelectric layer 140 (constituents of the main generating first layer 100) shown in FIG. 6 as well as the central plate-like portion 220, the left-hand side plate-like portion 230 and the right-hand side plate-like portion 240 (constituents of the main generating second layer 200) which are joined with the lower layers thereof also contribute to roles of causing displacement at the leading end point T. Therefore, they perform a function as a part of the weight body.

However, as shown in FIG. 7, the thickness of the main generating third layer 300 is set to be greater than that of the main generating first layer 100 or that of the main generating second layer 200, and the role of the weight body is played mainly by the main generating third layer 300. Therefore, here, for convenience of description, the portion of the main generating third layer 300 is referred to as the weight body.

The power generating element PGE according to the present invention is characterized in that the weight body is arranged laterally on both sides of the plate-like bridge portion 210 which constitutes the main generating structure MGS. That is, as apparent from the perspective view of FIG. 1, the weight body of the power generating element PGE according to the present invention is provided at least with the left-hand side weight body portion 330 positioned on the left hand side of the plate-like bridge portion 210 and the right-hand side weight body portion 340 positioned on the right hand side of the plate-like bridge portion 210, as apparent from a projection image on the XY plane. Therefore, an external force which causes deflection at the plate-like bridge portion 210 in various directions can be transmitted efficiently. Further, as will be described in detail in Chapter 3, a member which restricts displacement of the left-hand side weight body portion 330 and the right-hand side weight body portion 340 is installed outside the main generating structure MGS. Thereby, the plate-like bridge portion 210 can be restricted from displacement, even upon application of excessive vibration, thus making it possible to prevent damage to the plate-like bridge portion.

Further, in the basic embodiment shown here, the plate-like bridge portion 210 is constituted with the main generating second layer 200, and the weight body is constituted with the main generating third layer 300 which is arranged below thereof. Therefore, the center of gravity G of the weight body (a structure body which constitutes the main generating third layer) is positioned below the plate-like bridge portion 210, with a predetermined distance. In FIG. 6 and FIG. 7, the center of gravity G of the weight body is indicated with an x mark. As described above, as the main generating structure MGS, there is adopted a structure in which the center of gravity G of the weight body is arranged below the plate-like bridge portion 210, with a predetermined distance, by which on the basis of direction components of individual coordinate axes of acceleration which is applied to the weight body, the plate-like bridge portion 210 can be deflected efficiently to realize efficient power generation. It is, in particular, preferable that a distance between the center of gravity G and the lower surface of the plate-like bridge portion 210 is made as long as possible so that the plate-like bridge portion 210 will deflect greatly with respect to acceleration in the direction of the Y-axis.

In the case of the example shown here, the main generating structure MGS is structured so as to give plane symmetry in relation to the YZ plane. Thus, the center of gravity of the structure body (the weight body) which constitutes the main generating third layer 300 is positioned on the YZ plane below the plate-like bridge portion 210. Adoption of the symmetrical structure enables the weight body to undergo vibration stably in the direction of each coordinate axis, and this is preferable in enhancing power generation efficiency.

A material of each of the layers which constitute the main generating structure MGS may include any material, as long as the material is able to perform a function as each of the above-described layers. Here, there are given several examples of practically favorable materials.

First, the main generating first layer 100 may be able to perform a function as a piezoelectric element which generates charge on the basis of stress applied from the outside. Therefore, individual electrodes may be formed vertically on both surfaces of the piezoelectric material layer 105 which is likely to polarize in the thickness direction by application of stress which expands and contracts in the layer direction. Specifically, the piezoelectric material layer 105 can be constituted with a piezoelectric thin film, for example, PZT (lead zirconate titanate) and KNN (potassium sodium niobate). Alternatively, a bulk-type piezoelectric element may be used. Each of the electrodes E0 to E4 may be constituted with any material, as long as it is an electrically conductive material. The electrodes may be practically constituted with a metal layer such as gold, platinum, aluminum or copper.

On the other hand, the main generating second layer 200 is required to perform a function as a supporting substrate of the main generating first layer 100, and the portion of the plate-like bridge portion 210 is also required to be flexible. Silicon is an optimal material that is used in the above application. Therefore, in the case of the example described here, the main generating second layer is constituted with a silicon substrate. In the case of the example shown in FIG. 7, the thickness d9 of the main generating second layer 200 is 200 μm. The plate-like bridge portion 210 made of silicon with the above-described thickness has sufficient flexibility necessary for generating electric power.

Of course, it is possible to use a metal substrate as the main generating second layer 200. In this instance, an upper layer portion of the metal substrate plays a role as the lower layer electrode E0. Therefore, a piezoelectric thin film is formed on the metal substrate by sputtering or a sol-gel method, thus making it possible to form a piezoelectric element as the main generating first layer 100. Alternatively, a bulk-type piezoelectric material is allowed to adhere on the metal substrate. The upper layer electrode can be formed by such a method that a metal material is subjected to printing, vapor deposition or spattering.

However, the inventor of the application concerned considers that at the present time, a silicon substrate is an optimal material as the main generating second layer 200. This is because, in general, where comparison is made between a case of a piezoelectric element formed on the upper surface of a metal substrate and a case of a piezoelectric element formed on the upper surface of a silicon substrate by an existing production process, a piezoelectric constant of the latter is about three times greater than a piezoelectric constant of the former, and the latter is much higher in power generation efficiency. This may be due to the fact that formation of a piezoelectric element on the upper surface of a silicon substrate results in uniform orientation of crystallization of the piezoelectric element. Further, when a silicon substrate is used as the main generating second layer 200, it is also possible to constitute the power generating circuit 500 by the use of a semiconductor element formed on the silicon substrate.

Since the main generating third layer 300 is a constituent which performs a function as the weight body, it is preferable to use a material which is great in specific gravity as much as possible. Specifically, the layer may be constituted by using a metal substrate such as SUS (iron), copper and tungsten or by using a ceramic substrate or a glass substrate.

Chapter 2. Power Generating Motion of Power Generating Element According to Basic Embodiment Next, a description will be given of power generating motion of the power generating element PGE according to the basic embodiment described in Chapter 1. As already described, the power generating element PGE shown in FIG. 1 is constituted by adding the pedestal 400 and the power generating circuit 500 to the main generating structure MGS composed of a three-layered structure body, having a function to generate electric power by converting vibration energy in the direction of each coordinate axis in an XYZ three-dimensional coordinate system into electric energy.

Thus, here, a description will be given of what kind of principle the power generating motion is performed when the portion of the pedestal 400 is fixed to an automobile during traveling and a vibration component in the direction of each coordinate axis is added to the power generating element PGE. Therefore, hereinafter, a description will be give of motion of the power generating element PGE on the assumption that the XYZ three-dimensional coordinate system is a coordinate system which is fixed to the pedestal 400 (that is, transportation equipment) and the weight body is to undergo vibration within the coordinate system.

Figure 8:
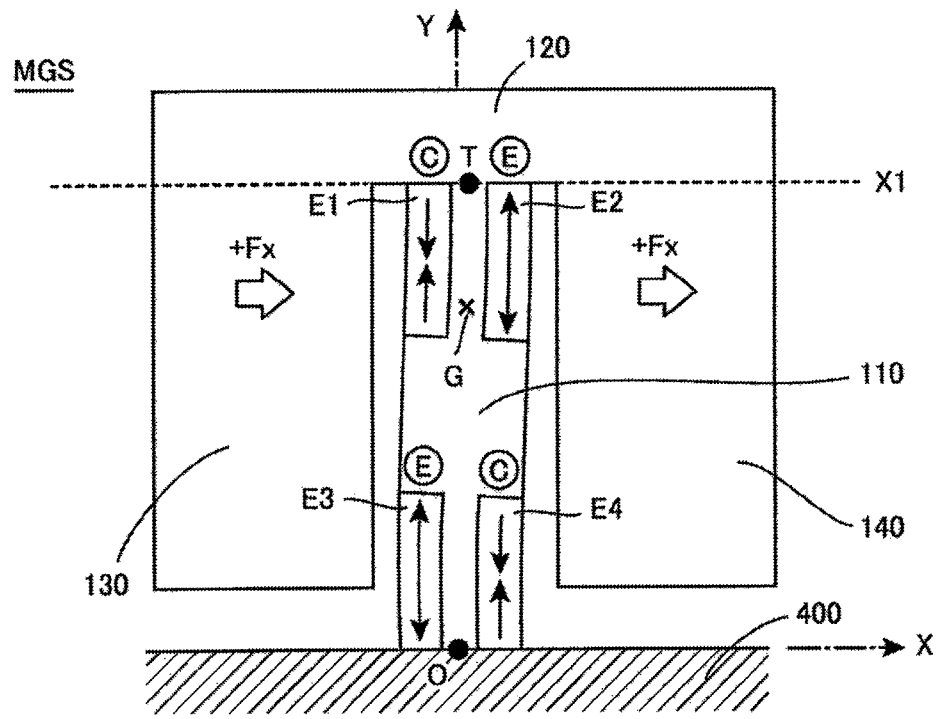
FIG. 8 is a top view which shows a deformation mode when force +Fx in the positive direction of the X-axis is applied to the main generating structure MGS given in FIG. 1.

FIG. 8 is a top view which shows a deformation mode in which force +Fx in the positive direction of the X-axis is applied to the weight body (the main generating third layer 300) of the main generating structure MGS shown in FIG. 1. This phenomenon will take place when acceleration −ax in the negative direction of the X-axis is applied to the pedestal 400 by vibration of an automobile during traveling on a road surface. That is, when acceleration −ax is applied to the pedestal 400, acceleration +ax in a reverse direction as inertia force is applied to the weight body. As a result, in the XYZ three-dimensional coordinate system, an external force +Fx which causes displacement in the positive direction of the X-axis (the right side direction in the drawing) is applied to the weight body, as indicated with a void arrow in the drawing.

The external force +Fx is applied as a force which allows the center of gravity G of the weight body and the leading end point T to displace in the right side direction in the drawing. Therefore, the leading end of the plate-like bridge portion 210 and that of the bridge portion piezoelectric layer 110 formed on the upper surface thereof undergo displacement in the right side direction in the drawing, together with the weight body. On the other hand, since the base end thereof (the vicinity of the origin O) is fixed to the pedestal 400, it will not undergo displacement on the XYZ three-dimensional coordinate system. As a result, the plate-like bridge portion 210 and the bridge portion piezoelectric layer 110 formed on the upper surface thereof undergo curved deformation as shown in the drawing.

The above-described curved deformation yields expansion/contraction stress as shown in the drawing in a direction along the Y-axis at an arrangement position of each of the four upper layer electrodes E1 to E4 on the bridge portion piezoelectric layer 110. That is, contraction stress in the direction of the Y-axis is applied to an arrangement position of each of the upper layer electrodes E1 and E4 on the bridge portion piezoelectric layer 110 as indicated with a pair of arrows facing each other vertically (indicated by the character C for "contraction" enclosed in a circle. And, expansion stress in the direction of the Y-axis is applied to an arrangement position of each of the upper layer electrodes E2 and E3 on the bridge portion piezoelectric layer 110, as indicated with a bidirectional arrow to which arrows are given vertically (indicated by the character E for "expansion" enclosed in a circle).

On the other hand, where acceleration +ax in the positive direction of the X-axis is applied to the pedestal 400, acceleration −ax in a reverse direction as inertia force is applied to the weight body. As a result, in the XYZ three-dimensional coordinate system, an external force −Fx which causes displacement in the negative direction of the X-axis (in the left side direction in the drawing) is applied to the weight body, which is reverse to the case shown in FIG. 8. In this instance, a mode of expansion/contraction at each portion is reversed to that given in FIG. 8. That is, expansion stress is applied to an arrangement position of each of the upper layer electrodes E1 and E4 on the bridge portion piezoelectric layer 110, while contraction stress is applied to an arrangement position of the upper layer electrodes E2 and E3 on the bridge portion piezoelectric layer 110.

Figure 9:
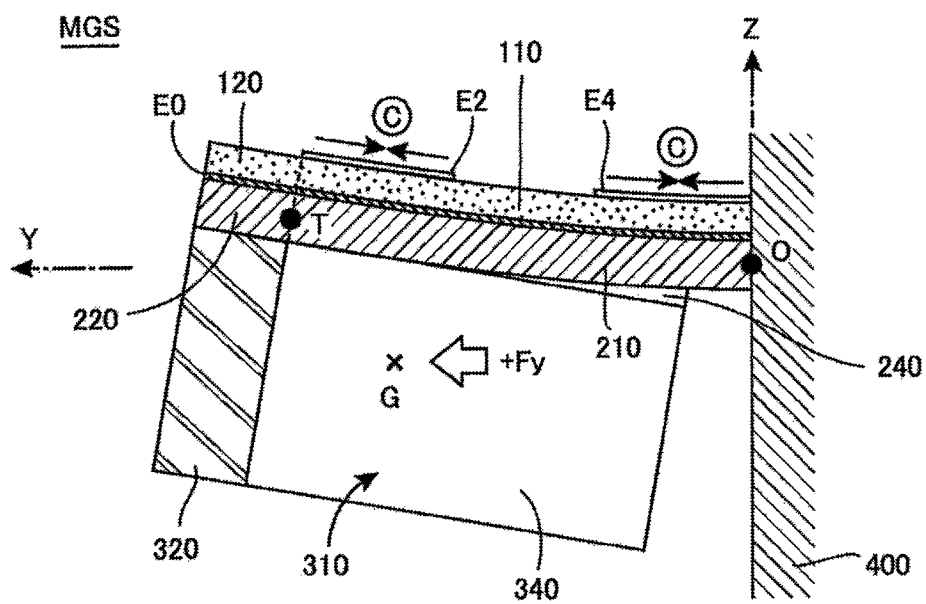
FIG. 9 is a side sectional view which shows a deformation mode when force +Fy in the positive direction of the Y-axis is applied to the main generating structure MGS given in FIG. 1 (indicating a cross section cut along the YZ plane).

FIG. 9 is a side sectional view which shows a deformation mode when force +Fy in the positive direction of the Y-axis is applied to the weight body (the main generating third layer 300) of the main generating structure MGS shown in FIG. 1. This phenomenon takes place where acceleration −αy in the negative direction of the Y-axis is applied to the pedestal 400 by vibration of an automobile during traveling on a road surface. That is, when acceleration −αy is applied to the pedestal 400, acceleration +αy in a reverse direction as inertia force is applied to the weight body. As a result, in the XYZ three-dimensional coordinate system, an external force +Fy which causes displacement in the positive direction of the Y-axis (the left side direction in the drawing) is applied to the weight body as indicated with a void arrow in the drawing.

The external force +Fy is applied as a force which allows the center of gravity G of the weight body to displace in the left side direction in the drawing. Since the weight body is connected to the vicinity of the leading end point T at the plate-like bridge portion 210, the weight body is inclined obliquely as shown in FIG. 9 (in FIG. 9, the left side rises and the right side declines). Therefore, the plate-like bridge portion 210 and the bridge portion piezoelectric layer 110 formed on the upper surface thereof undergo curved deformation so as to warp upward, as shown in FIG. 9.

The thus curved deformation will yield expansion/contraction stress as shown in the drawing in a direction along the Y-axis in relation to an arrangement position of each of the four upper layer electrodes E1 to E4 on the bridge portion piezoelectric layer 110. That is, contraction stress in the direction of the Y-axis is applied to all the arrangement positions of the four upper layer electrodes E1 to E4 formed on the upper surface of the bridge portion piezoelectric layer 110, as indicated with a pair of arrows facing each other laterally (indicated with the character C for "contraction" enclosed in a circle.

On the other hand, where acceleration +αy in the positive direction of the Y-axis is applied to the pedestal 400, acceleration −αy in a reverse direction as inertia force is applied to the weight body. As a result, in the XYZ three-dimensional coordinate system, an external force −Fy which causes displacement in the negative direction of the Y-axis (the right side direction in the drawing) is applied to the weight body, which is reverse to the case shown in FIG. 9. In this instance, the weight body is inclined in a mode reverse to that of FIG. 9, (the left side declines and the right side rises), and a mode of expansion/contraction at each portion is reverse to that of FIG. 9. That is, expansion stress in the direction of the Y-axis is applied to all the arrangement positions of the four upper layer electrodes E1 to E4 formed on the upper surface of the bridge portion piezoelectric layer 110.

Figures 10, 11:
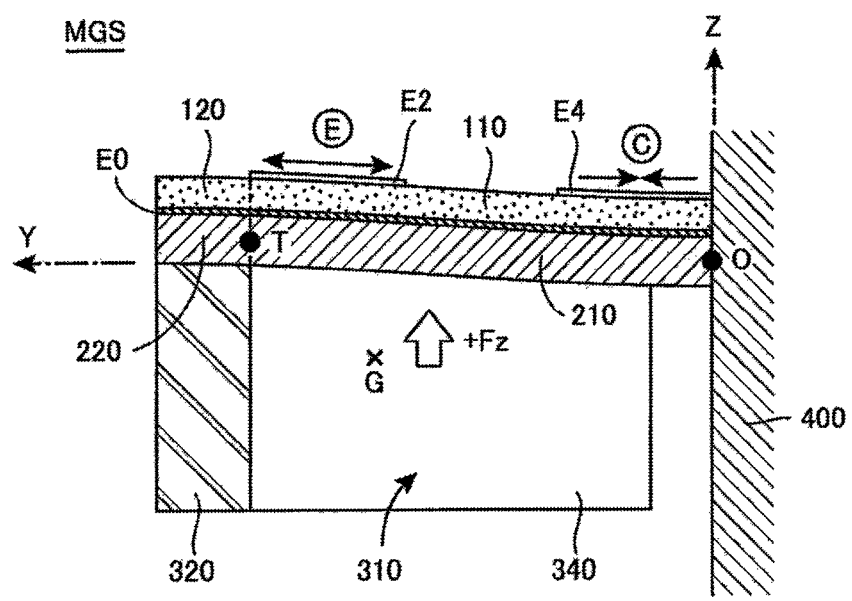
FIG. 10 is a side sectional view which shows a deformation mode when force +Fz in the positive direction of the Z-axis is applied to the main generating structure MGS given in FIG. 1 (indicating a cross section cut along the YZ plane).
FIG. 11 is a table which shows expansion/contraction stress in the direction of the Y-axis which is applied to positions of upper layer electrodes E1 to E4 of a bridge portion piezoelectric layer 110 when force in the positive direction of each coordinate axis is applied to the weight body of the main generating structure MGS given in FIG. 1.

FIG. 10 is a side sectional view which shows a deformation mode when force +Fz in the positive direction of the Z-axis is applied to the weight body (the main generating third layer 300) of the main generating structure MGS shown in FIG. 1. This phenomenon takes place where acceleration −αz in the negative direction of the Z-axis is applied to the pedestal 400 by vibration of an automobile during traveling on a road surface. That is, when acceleration −αz is applied to the pedestal 400, acceleration +αz in a reverse direction as inertia force is applied to the weight body. As a result, in the XYZ three-dimensional coordinate system, an external force +Fz which causes displacement in the positive direction of the Z-axis (the upward direction in the drawing) is applied to the weight body, as indicated with a void arrow in the drawing.

The external force +Fz is applied as a force which allows the center of gravity G of the weight body to displace in the upward direction in the drawing. Since the weight body is connected to the vicinity of the leading end point T of the plate-like bridge portion 210, a force which causes upward displacement in the drawing is applied to the leading end of the plate-like bridge portion 210. On the other hand, the base end (the vicinity of the origin O) of the plate-like bridge portion 210 is fixed to the pedestal 400. Therefore, in the XYZ three-dimensional coordinate system, a force which allows the leading end to move upward is applied in a state that the base end of the plate-like bridge portion 210 is kept fixed. Thereby, the plate-like bridge portion 210 and the bridge portion piezoelectric layer 110 formed on the upper surface thereof undergo curved deformation, as shown in FIG. 10.

The thus curved deformation will yield expansion/contraction stress as shown in the drawing in a direction along the Y-axis at an arrangement position of each of the four upper layer electrodes E1 to E4 on the bridge portion piezoelectric layer 110. That is, expansion stress in the direction of the Y-axis is applied to positions of the upper layer electrodes E1 and E2 arranged at the leading end of the bridge portion piezoelectric layer 110, as indicated with a bidirectional arrow to which arrows are given laterally (indicated with the character E for "expansion" enclosed in a circle). In contrast, contraction stress in the direction of the Y-axis is applied to positions of the upper layer electrodes E3 and E4 arranged at the base end of the bridge portion piezoelectric layer 110, as indicated with a pair of arrows facing each other laterally (indicated with the character C for "contraction" enclosed in a circle).

On the other hand, where acceleration +αz in the positive direction of the Z-axis is applied to the pedestal 400, acceleration −αz in a reverse direction as inertia force is applied to the weight body. As a result, in the XYZ three-dimensional coordinate system, an external force −Fz which causes displacement in the negative direction of the Z-axis (the downward direction in the drawing) is applied to the weight body, which is reverse to the case shown in FIG. 10. In this instance, since the weight body moves below in the drawing, a mode of expansion/contraction at each portion is reverse to that of FIG. 10. That is, contraction stress is applied to an arrangement position of each of the upper layer electrodes E1 and E2 on the bridge portion piezoelectric layer 110, while expansion stress is applied to an arrangement position of each of the upper layer electrodes E3 and E4 on the bridge portion piezoelectric layer 110.

FIG. 11 is a table which shows expansion/contraction stress in the direction of the Y-axis which is applied to positions of the upper layer electrodes E1 to E4 on the bridge portion piezoelectric layer 110 when a force in the direction of each coordinate axis is applied to the weight body of the main generating structure MGS shown in FIG. 1 on the basis of the deformation modes given in FIG. 8 to FIG. 10. This drawing is a table which shows expansion/contraction stress upon application of forces +Fx, +Fy, +Fz in the positive direction of each coordinate axis. Expansion/contraction stress upon application of forces −Fx, −Fy, −Fz in the negative direction of each coordinate axis is such that a relationship of contraction/expansion in the table is reversed.

As described in Chapter 1, in the power generating element PGE according to the basic embodiment, the main generating first layer 100 constitutes a piezoelectric element which has the lower layer electrode E0 formed on the surface of the main generating second layer 200, the piezoelectric material layer 105 formed on the surface of the lower layer electrode E0 in a layered manner and the upper layer electrode group composed of the plurality of upper layer electrodes E1 to E4 formed locally on the surface of the piezoelectric material layer 105. The piezoelectric material layer 105 is likely to polarize in the thickness direction by application of stress which expands and contracts in the layer direction.

Figures 12, 13:
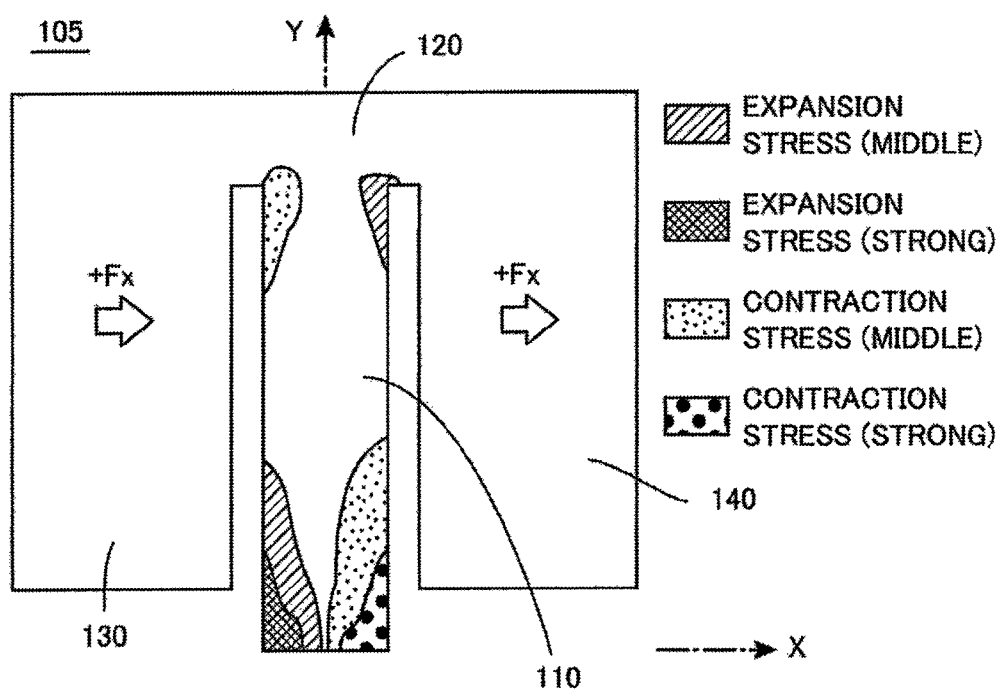
FIG. 12 is a table which shows polarity of charge generated at each of the upper layer electrodes E1 to E4 when force in the positive direction of each coordinate axis is applied to the weight body of the main generating structure MGS given in FIG. 1.
FIG. 13 is a stress distribution diagram which shows stress in the direction of the Y-axis occurring on a piezoelectric material layer 105 when force +Fx in the positive direction of the X-axis is applied to the weight body of the main generating structure MGS given in FIG. 1.

Here, it is assumed that as the piezoelectric material layer 105, such a layer is used that has polarization characteristics in which upon application of stress which expands in the layer direction, positive charge is generated above and negative charge is generated below, and upon application of stress which contracts in the layer direction, negative charge is generated above and positive charge is generated below. On this assumption, when forces +Fx, +Fy, +Fz in the positive direction of each coordinate axis are applied to the weight body, polarity of charge generated on the upper layer electrodes E1 to E4 is as shown in the table of FIG. 12. In other words, the table of FIG. 12 is such that "expansion" and "contraction" in the table of FIG. 11 are replaced respectively with "+" and "−." Expansion/contraction stress upon application of forces −Fx, −Fy, −Fz in the negative direction of each coordinate axis is such that a relationship of +/− in this table is reversed.

Of course, as the piezoelectric material layer 105, such a layer can also be used that has polarization characteristics in which upon application of stress which expands in the layer direction, negative charge is generated above and positive charge is generated below, and upon application of stress which contracts in the layer direction, positive charge is generated above and negative charge is generated below. Where there is used a piezoelectric material layer that has the above-described polarization characteristics, a relationship between +/− is reverse to that of the above-described case. Further, where a bulk-type piezoelectric element is used, it is possible to arrange a piezoelectric element having polarization characteristics different in each of the domains. Any given polarization characteristics can be given to each of localized piezoelectric elements P1 to P4.

In any case, the power generating circuit 500 rectifies electric current produced from charge generated at the four localized upper layer electrodes E1 to E4 and the one common lower layer electrode E0, thus making it possible to take out electric power.

As shown in the top view of FIG. 6, the four upper layer electrodes E1 to E4 are arranged at the individually specific positions on the upper surface of the bridge portion piezoelectric layer 110. Here, a group of the four upper layer electrodes are referred to as a leading end left-side upper layer electrode E1, a leading end right-side upper layer electrode E2, a base end left-side upper layer electrode E3 and a base end right-side upper layer electrode E4, depending on the individual arrangement positions. Then, a projection image of the leading end left-side upper layer electrode E1 on the upper surface of the main generating second layer 200 extends in a direction parallel to the Y-axis and is positioned on a side in which an X coordinate value in the vicinity of the leading end of the plate-like bridge portion 210 is negative. A projection image of the leading end right-side upper layer electrode E2 on the upper surface of the main generating second layer 200 extends in a direction parallel to the Y-axis and is positioned on a side in which an X coordinate value in the vicinity of the leading end of the plate-like bridge portion 210 is positive. A projection image of the base end left-side upper layer electrode E3 on the upper surface of the main generating second layer 200 extends in a direction parallel to the Y-axis and is positioned on a side in which an X coordinate value in the vicinity of the base end of the plate-like bridge portion 210 is negative. A projection image of the base end right-side upper layer electrode E4 on the upper surface of the main generating second layer 200 extends in a direction parallel to the Y-axis and is positioned on a side in which an X coordinate value in the vicinity of the base end of the plate-like bridge portion 210 is positive.

Specific arrangements of these four upper layer electrodes E1 to E4 are suitable for generating charge efficiently and also effective in enhancing power generation efficiency. This is because even where a force in the direction of any coordinate axis is applied to the weight body, a great stress in the direction of the Y-axis is generated at these four arrangement positions. This is apparent from the stress distribution diagrams shown in FIG. 13 to FIG. 15. These stress distribution diagrams show results obtained by FEM (Finite Element Method) structural analysis by computer with the use of actual dimensions described in Chapter 1. These are diagrams which show distribution of stress in the direction of the Y-axis occurring on the piezoelectric material layer 105 where a force in the positive direction of a specific coordinate axis is applied to the weight body in a state that the base end of the plate-like bridge portion 210 is fixed.

FIG. 13 is a stress distribution diagram which shows stress in the direction of the Y-axis occurring on the piezoelectric material layer 105 when force +Fx in the positive direction of the X-axis is applied to the weight body of the main generating structure MGS shown in FIG. 1. It is apparent from this diagram that stress distribution on the basis of the mode of expansion/contraction shown in FIG. 8 is obtained, in principle. Specific arrangements of the four upper layer electrodes E1 to E4 correspond to positions at which conspicuous stress will take place in the stress distribution diagram.

Figure 14:
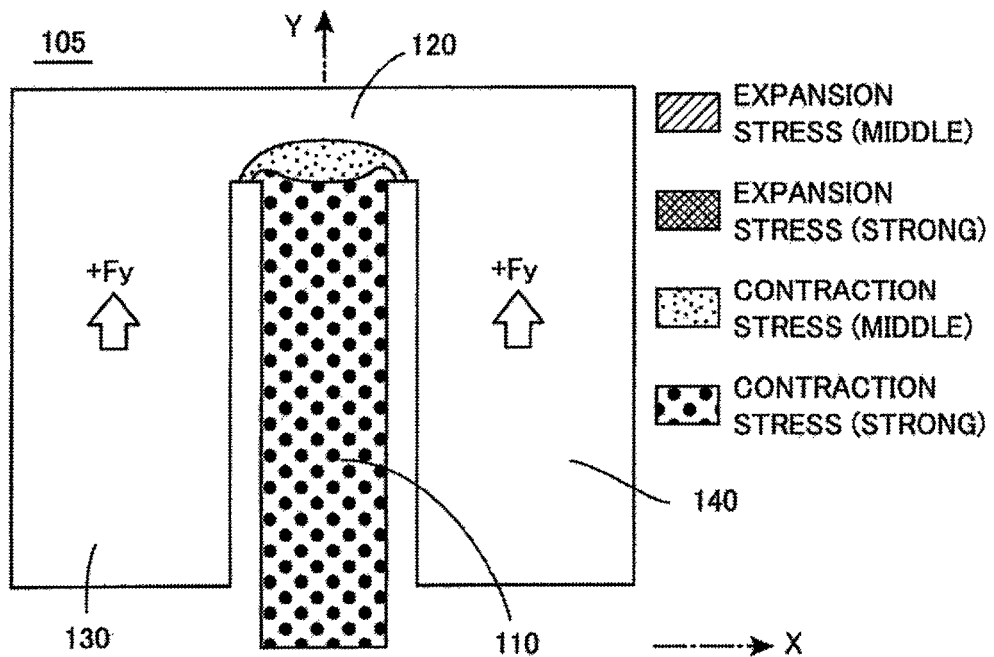
FIG. 14 is a stress distribution diagram which shows stress in the direction of the Y-axis occurring on the piezoelectric material layer 105 when force +Fy in the positive direction of the Y-axis is applied to the weight body of the main generating structure MGS given in FIG. 1.

FIG. 14 is a stress distribution diagram which shows stress in the direction of the Y-axis occurring on the piezoelectric material layer 105 when force +Fy in the positive direction of the Y-axis is applied to the weight body of the main generating structure MGS shown in FIG. 1. As apparent by referring to the deformation mode shown in FIG. 9, upon application of force +Fy, contraction stress in the direction of the Y-axis is applied substantially in an entire domain of the bridge portion piezoelectric layer 110. Therefore, the stress distribution diagram of FIG. 14 also indicates that strong contraction stress occurs substantially in an entire domain of the bridge portion piezoelectric layer 110. The specific arrangements of the four upper layer electrodes E1 to E4 correspond to such positions at which conspicuous stress will occur also in this stress distribution diagram.

Figure 15:
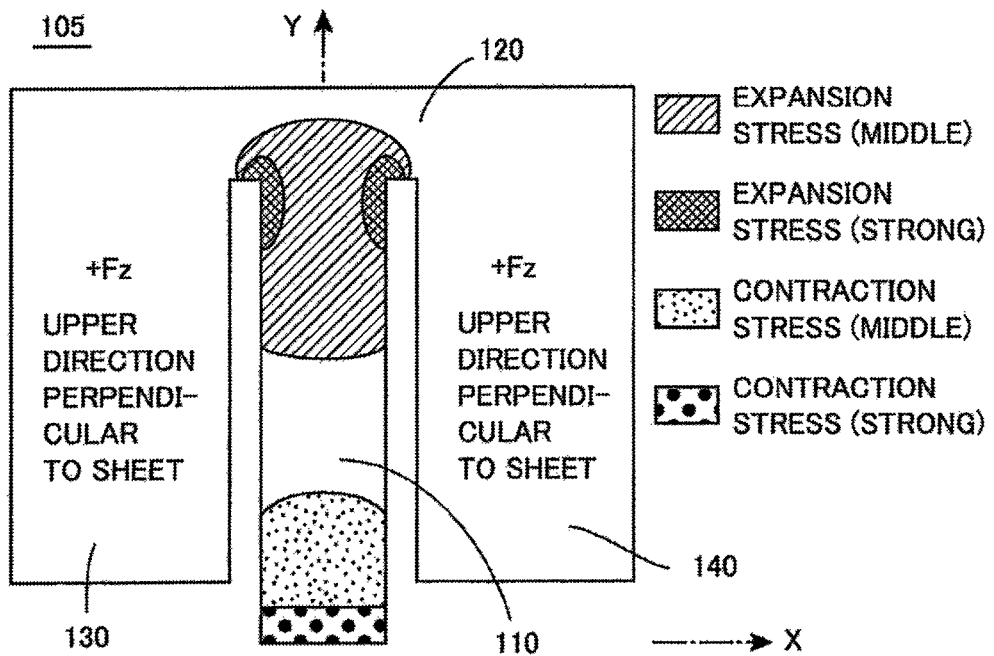
FIG. 15 is a stress distribution diagram which shows stress in the direction of the Y-axis occurring on the piezoelectric material layer 105 when force +Fz in the positive direction of the Z-axis is applied to the weight body of the main generating structure MGS given in FIG. 1.

FIG. 15 is a stress distribution diagram which shows stress in the direction of the Y-axis occurring on the piezoelectric material layer 105 when force +Fz in the positive direction of the Z-axis is applied to the weight body of the main generating structure MGS shown in FIG. 1. It is apparent from this diagram that there is obtained stress distribution, in principle, on the basis of the mode of expansion/contraction shown in FIG. 10. Specific arrangements of the four upper layer electrodes E1 to E4 correspond to positions at which conspicuous stress occurs also in this stress distribution diagram.

As described above, it is apparent from the stress distribution diagrams of FIG. 13 to FIG. 15 that the four upper layer electrodes E1 to E4 shown in FIG. 6 are arranged in a stress-concentrating domain where the weight body undergoes displacement in any direction, thus making it possible to effectively collect charge which has been generated. It is noted that, with reference to the stress distribution diagrams, it is apparent that an upper end position of each of the upper layer electrodes E1 and E2 in FIG. 6 may extend upward to some extent (in the positive direction of the Y-axis) from the boundary line H.

A description has been given above of the stress distribution where force +Fx, +Fy, +Fz in the positive direction of each coordinate axis is applied to the weight body with reference to FIG. 13 to FIG. 15. Stress distribution where force −Fx, −Fy, −Fz in the negative direction of each coordinate axis has been applied is such that the distribution of contraction/expansion is reversed. Resultantly, the four upper layer electrodes E1 to E4 shown in the top view of FIG. 6 are arranged at such a position that great stress occurs in the direction of the Y-axis where force in the direction of any coordinate axis is applied to the weight body. Further, there is no chance of a charge of reversed polarity occurring at the same electrode, even where force in the direction of any coordinate axis is applied.

That is, no such phenomenon will take place that charge of reversed polarity will cancel each other out at the same electrode. Therefore, the power generating element PGE which adopts the above-described specific electrode arrangement is able to generate electric power at extremely high efficiency.

Figure 16:
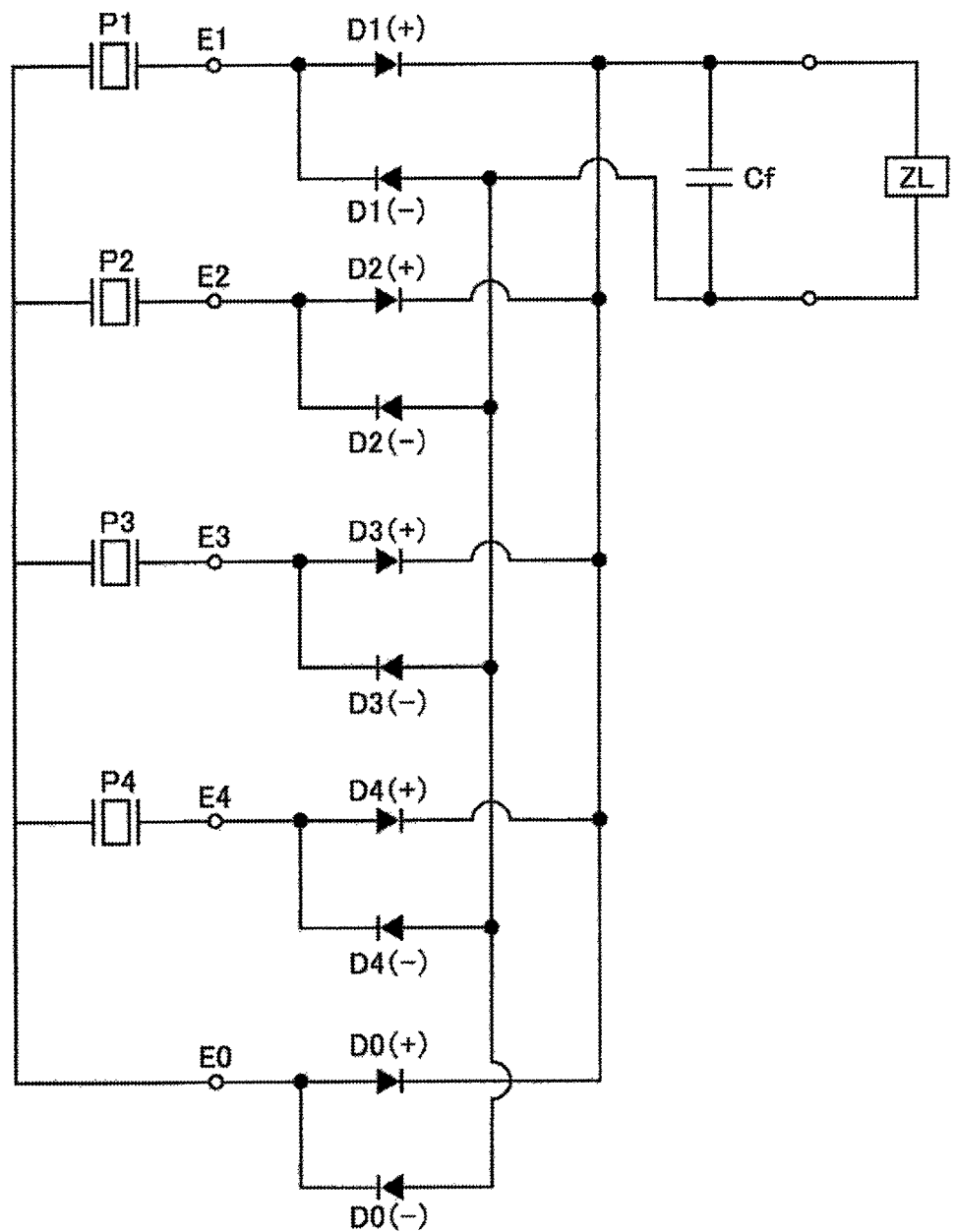
FIG. 16 is a circuit diagram which shows a specific constitution of a power generating circuit 500 of the power generating element PGE given in FIG. 1.

FIG. 16 is a circuit diagram which shows a specific constitution of the power generating circuit 500 used in the power generating element PGE shown in FIG. 1, having a function to rectify and take out electric current produced on the basis of charge generated at the piezoelectric element.

In FIG. 16, the leading end left-side piezoelectric element P1 denotes a localized piezoelectric element which is constituted with the leading end left-side upper layer electrode E1, the lower layer electrode E0 and a portion positioned below the upper layer electrode E1, of the piezoelectric material layer 105, as shown in FIG. 6. The leading end right-side piezoelectric element P2 denotes a localized piezoelectric element which is constituted with the leading end right-side upper layer electrode E2, the lower layer electrode E0 and a portion positioned below the upper layer electrode E2, of the piezoelectric material layer 105, as shown in FIG. 6.

Similarly, the base end left-side piezoelectric element P3 denotes a localized piezoelectric element which is constituted with the base end left-side upper layer electrode E3, the lower layer electrode E0 and a portion positioned below the upper layer electrode E3, of the piezoelectric material layer 105, as shown in FIG. 6. The base end right-side piezoelectric element P4 denotes a localized piezoelectric element which is constituted with the base end right-side upper layer electrode E4, the lower layer electrode E0 and a portion positioned below the upper layer electrode E4, of the piezoelectric material layer 105, as shown in FIG. 6.

Further, E0 and E1 to E4 indicated with a white circle on the circuit diagram correspond respectively to the lower layer electrode and each of the upper layer electrodes.

D1 (+), D2(+), D3(+) and D4(+) are rectifying elements (diodes), each playing a role of taking out positive charge generated respectively at the upper layer electrodes E1, E2, E3 and E4. D1 (−), D2(−), D3(−) and D4(−) are also rectifying elements (diodes), each playing a role of taking out negative charge generated respectively at the upper layer electrodes E1, E2, E3 and E4. Similarly, D0(+) is a rectifying element (diode) which plays a role of taking out positive charge generated at the lower layer electrode E0. D0(−) is a rectifying element (diode) which plays a role of taking out negative charge generated at the lower layer electrode E0.

On the other hand, Cf is a smoothing capacitive element (capacitor) in which taken-out positive charge is supplied to a positive electrode terminal thereof (an upper terminal in the drawing) and taken-out negative charge is supplied to a negative electrode terminal thereof (a lower terminal in the drawing). The capacitive element Cf plays a role of smoothing a pulsating current on the basis of generated charge. At a stationary time when the weight body is stable in vibration, impedance of the capacitive element Cf can be substantially disregarded. ZL which is connected in parallel to the capacitive element Cf denotes load of equipment to which electric power generated by the power generating element PGE is supplied.

Resultantly, the power generating circuit 500 is provided with the smoothing capacitive element Cf, the rectifying elements for positive charge D1 (+), D2(+), D3(+), D4(+) in which a direction from each of the upper layer electrodes E1 to E4 to a positive electrode of the capacitive element Cf is given as a forward direction in order to guide positive charge generated at the respective upper layer electrodes E1 to E4 to the positive electrode of the capacitive element Cf, and rectifying elements for negative charge D1 (−), D2(−), D3(−), D4(−) in which a direction from a negative electrode of the capacitive element Cf to the respective upper layer electrodes E1 to E4 is given as a forward direction in order to guide negative charge generated at the respective upper layer electrodes E1 to E4 to the negative electrode of the capacitive element Cf, thereby performing a function to smooth electric energy converted from vibration energy by the capacitive element Cf and supply the energy.

In the circuit diagram, positive charge taken out by the rectifying elements for positive charge D1 (+), D2(+), D3(+), D4(+) and negative charge taken out by the rectifying elements for negative charge D1 (−), D2(−), D3(−), D4(−) are supplied to the load ZL. Therefore, in principle, at individual moments, a total amount of positive charge generated at each of the upper layer electrodes E1 to E4 is made equal to that of negative charge thereof, thus making it possible to generate electric power at the highest efficiency.

As shown in FIG. 6, the main generating structure MGS according to the basic embodiment is symmetrically structured so as to give plane symmetry in relation to the YZ plane. The symmetrical structure is adopted, by which, as shown in FIG. 8, where the weight body undergoes vibration in the direction of the X-axis, positive charge and negative charge generated at a pair of upper layer electrodes arranged at a symmetrical position are almost equal in total amount, and efficient power generation can be expected. There is also found symmetry in relation to a center position of the bridge portion piezoelectric layer 110 in the longitudinal direction between the leading end electrode group composed of the upper layer electrodes E1, E2 and the base end electrode group composed of the upper layer electrodes E3, E4. Therefore, as shown in FIG. 10, where the weight body vibrates in the direction of the Z-axis as well, positive charge and negative charge generated at the individual upper layer electrodes E1 to E4 are almost equal in total amount, and efficient power generation can be expected.

3. Displacement Restricting Structure and Power Generating Device

In order to enhance power generation efficiency of the main generating structure MGS shown in FIG. 1, it is desirable that the plate-like bridge portion 210 is made as thin and long as possible. The first reason therefor is that use of the thin and long plate-like bridge portion 210 is able to increase flexibility, thereby causing greater deflection. Where great deflection is applied to the plate-like bridge portion 210, the piezoelectric material layer 105 is also subjected to great deflection to increase power generation. It is noted that where the plate-like bridge portion 210 is made narrow in width, there is provided an advantage of causing great deflection. However, the piezoelectric material layer 105 is decreased in area, thereby resulting in a disadvantage of decreasing power generation.

The second reason for making the plate-like bridge portion 210 thin and long is to obtain appropriate resonance frequency. As described above, the resonance frequency of the weight body determined by a specific structure of the main generating structure MGS is preferably matched with vibration frequency in environments of using power generating elements (such as transportation equipment and industrial equipment). It is practically preferable that the main generating structure MGS is designed so that the resonance frequency is in a range of 10 Hz to 50 Hz. In order to design the main generating structure MGS having the above-described range of the resonance frequency, it is advantageous that the plate-like bridge portion 210 is made thinner and longer.

Due to the above-described reasons, where the power generating element PGE according to the present invention is designed, it is preferable that the plate-like bridge portion 210 is made thin and long. However, the thin and long plate-like bridge portion 210 is easily broken upon application of an excessive external force. For example, FIG. 8 shows a deformation mode of the main generating structure MGS when force +Fx in the positive direction of the X-axis is applied to the weight body. Upon application of excessive force +Fx (excessive acceleration −αx), the bridge portion piezoelectric layer 110 and the plate-like bridge portion 210 which is a lower layer thereof are subjected to excessive deformation and may be broken.

A displacement restricting structure which suppresses excessive displacement of the plate-like bridge portion 210 can be easily added to the main generating structure MGS adopted in the present invention. This is because the weight body is provided with a left-hand side weight body portion positioned on the left hand side of the plate-like bridge portion and a right-hand side weight body portion positioned on the right hand side thereof. For example, in the case of the example shown in FIG. 6, there is provided such a mode that a left-hand side weight body portion 330 is arranged below the left-hand side piezoelectric layer 130, a right-hand side weight body portion 340 is arranged below the right-hand side piezoelectric layer 140, by which the plate-like bridge portion 210 positioned below the bridge portion piezoelectric layer 110 is protected laterally by the left-hand side weight body portion 330 and the right-hand side weight body portion 340.

Therefore, a certain displacement restricting wall is provided both on the right side and the left side of the main generating structure MGS shown in FIG. 6, thus making it possible to restrict displacement in a lateral direction of the weight body by using the displacement restricting wall. For example, as shown in the example of FIG. 8, where force +Fx in the positive direction of the X-axis is applied to the weight body, the weight body is unable to undergo displacement beyond the displacement restricting wall on the right side. Similarly, where force −Fx in the negative direction of the X-axis is applied to the weight body, the weight body is unable to undergo displacement beyond the displacement restricting wall on the left side.

Further, in the case of the example shown in FIG. 6, the central weight body portion 320 is arranged below the central piezoelectric layer 120. Thus, a displacement restricting wall is also provided above in the drawing, by which where force +Fy in the positive direction of the Y-axis is applied to the weight body, the weight body is unable to undergo displacement beyond the displacement restricting wall which is positioned above.

Resultantly, in the case of the example shown in FIG. 6, the plate-like bridge portion 210 positioned below the bridge portion piezoelectric layer 110 is surrounded by the "U" letter shaped weight body and kept protected from the circumference. Thus, a certain displacement restricting wall is provided outside the main generating structure MGS, thus making it possible to restrict excessive displacement of the weight body and avoid breakage of the plate-like bridge portion 210. Since the plate-like bridge portion 210 is surrounded by the "U" letter shaped weight body, it will not directly come into contact with the displacement restricting wall.

As the displacement restricting wall, it is possible to use, for example, the inner wall surface of the device package which houses the main generating structure MGS. It is, however, preferable to provide an exclusive displacement restricting wall so that a clearance dimension between the outer surface of the weight body and the inner surface of the displacement restricting wall is set to be an appropriate value (an appropriate value at which the weight body moves freely in a range necessary for normal power generating motion and the weight body is restricted from displacement only upon application of excessive acceleration). Thus, here, a description will be given of an embodiment in which the pedestal 400 is used as a displacement restricting wall.

In the power generating element PGE according to the present invention, the base end of the plate-like bridge portion 210 is fixed to the pedestal 400. For example, in FIG. 1, the pedestal 400 is indicated just as a symbol which denotes a fixing portion. Further, in FIG. 6 to FIG. 10, the pedestal 400 is indicated just as a fixing surface. In practice, the pedestal 400 may be structured in any manner, as long as it is able to play a role of fixing the base end of the plate-like bridge portion 210 so that the weight body is kept suspended. The embodiment given below is an example in which an annular structure body surrounding the main generating structure MGS is used as the pedestal 400 and an inner wall of the annular structure body is used as the displacement restricting wall.

Figure 17:
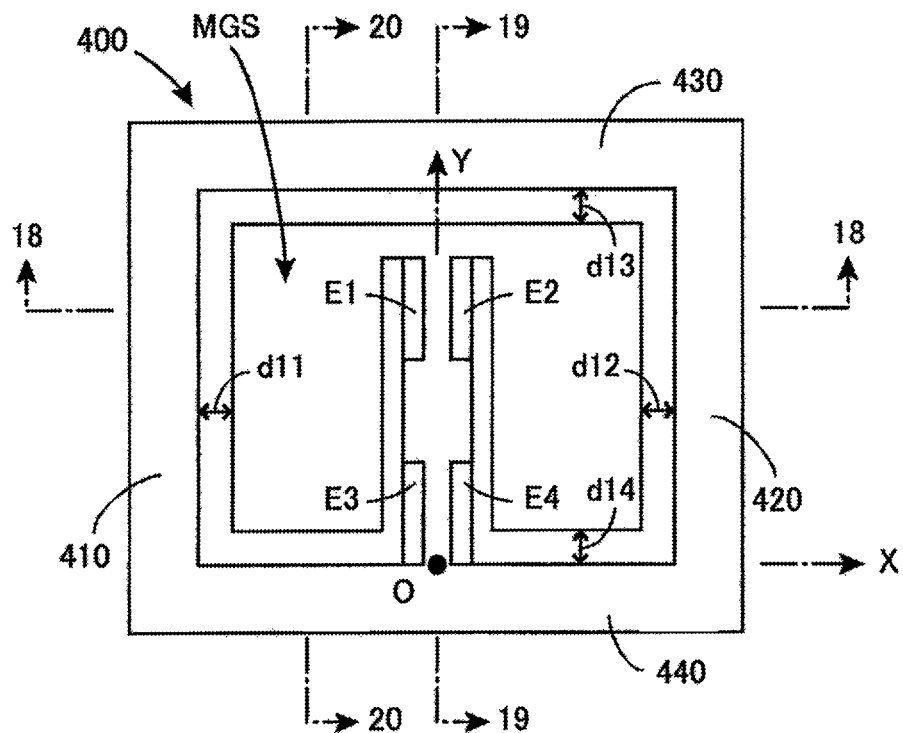
FIG. 17 is a top view which shows a power generating element PGE in which a rectangular annular structure body is used as the pedestal 400 (the power generating circuit is not illustrated).

FIG. 17 is a top view which shows the power generating element PGE in which a rectangular annular structure body is used as the pedestal 400 (in practice, illustrated is only a part of a structure body for power generating element excluding the power generating circuit 500 from the power generating element PGE, and the power generating circuit 500 is not illustrated). The main generating structure MGS depicted at the center of the drawing is the main generating structure according to the basic embodiment described in Chapter 1 and Chapter 2, and the pedestal 400 is a rectangular frame-like structure body which is arranged in the circumference thereof. The main generating structure MGS is joined with the pedestal 400 at a position of the origin O.

The pedestal 400 is given as an annular structure body which surrounds the main generating structure MGS along the XY plane. More specifically, the pedestal 400 is constituted with a rectangular frame-like structure body having four sets of wall portions composed of a first wall portion 410, a second wall portion 420, a third wall portion 430 and a fourth wall portion 440. Here, the first wall portion 410 is adjacently arranged in the negative direction of the X-axis in relation to the main generating structure MGS to constitute a wall surface along a plane parallel to the YZ plane, the second wall portion 420 is adjacently arranged in the positive direction of the X-axis in relation to the main generating structure MGS to constitute a wall surface along a plane parallel to the YZ plane, the third wall portion 430 is adjacently arranged in the positive direction of the Y-axis in relation to the main generating structure MGS to constitute a wall surface along a plane parallel to the XZ plane, and the fourth wall portion 440 is adjacently arranged in the negative direction of the Y-axis in relation to the main generating structure MGS to constitute a wall surface along a plane parallel to the XZ plane. Then, the base end of the plate-like bridge portion 210 which constitutes a part of the main generating structure MGS is supported and fixed to an inner surface of the fourth wall portion 440.

Where a horizontal direction component of acceleration in excess of a predetermined magnitude (a component parallel to the XY plane) is applied to the thus structured power generating element PGE, the weight body (the main generating third layer 300) comes into contact with the internal surface of the pedestal 400 composed of the annular structure body, thereby restricting further displacement. As shown in the drawing, a clearance dimension d11 is secured between a left side surface of the main generating structure MGS and an internal surface of the first wall portion 410, and a clearance dimension d12 is secured between a right side surface of the main generating structure MGS and an internal surface of the second wall portion 420. Similarly, a clearance dimension d13 is secured between an upper side surface of the main generating structure MGS and an inner surface of the third wall portion 430, and a clearance dimension d14 is secured between a lower side surface of the main generating structure MGS and an inner surface of the fourth wall portion 440.

Therefore, even if excessive vibration is added to the power generating element PGE to give an external force component in the direction of the X-axis to the weight body, the weight body undergoes displacement only within a range of the clearance dimensions d11, d12. And even if an external force component in the direction of the Y-axis is applied to the weight body, the weight body undergoes displacement only within a range of the clearance dimensions d13, d14. Therefore, it is possible to restrict an extent of deflection occurring at the plate-like bridge portion 210 and prevent the plate-like bridge portion 210 from being damaged.

Figure 18:
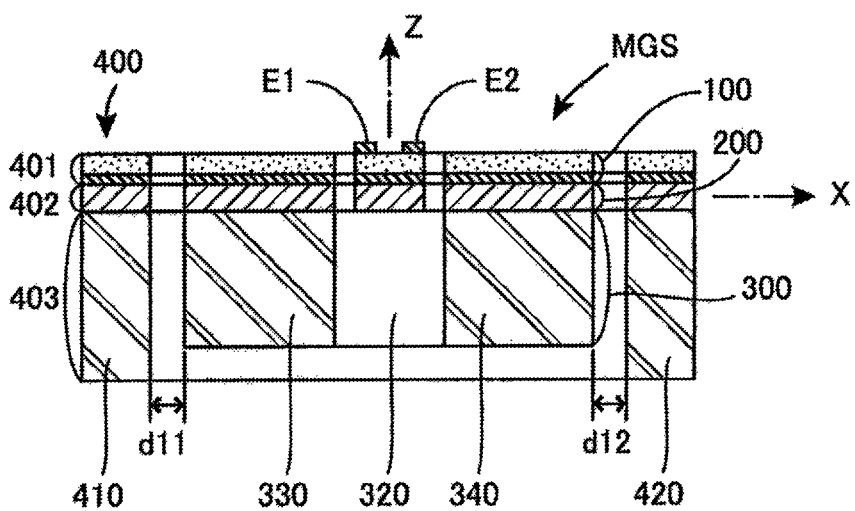
FIG. 18 is a front sectional view which shows a cross section in which the power generating element PGE given in FIG. 17 is cut along a cutting line 18-18.
Figure 19:
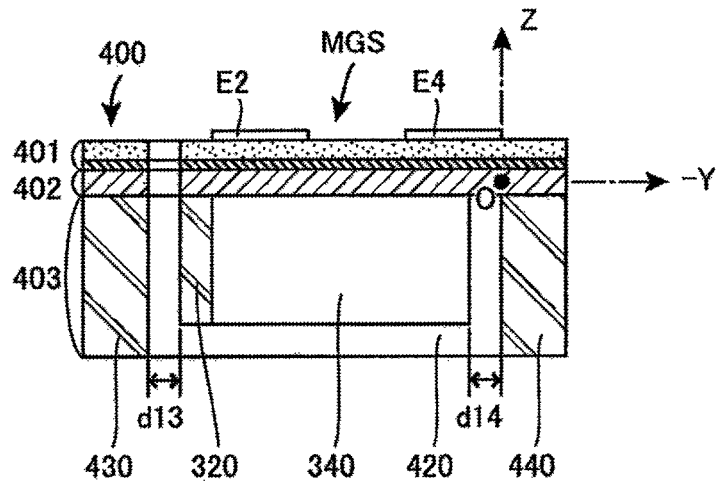
FIG. 19 is a side sectional view which shows a cross section in which the power generating element PGE given in FIG. 17 is cut along a cutting line 19-19.
Figure 20:
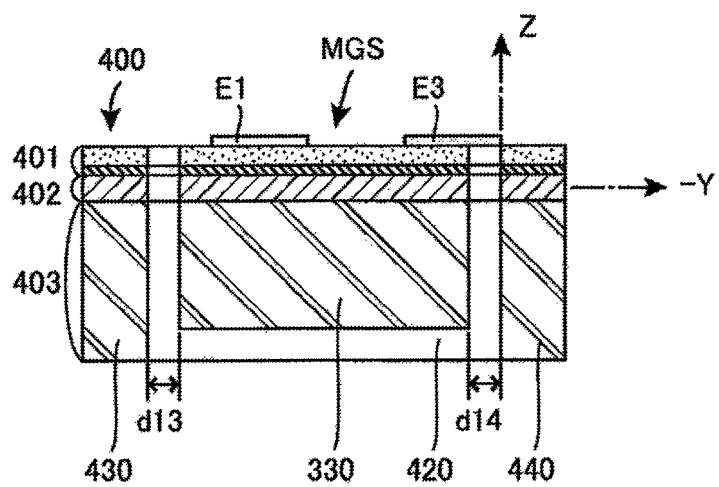
FIG. 20 is a side sectional view which shows a cross section in which the power generating element PGE given in FIG. 17 is cut along a cutting line 20-20.

A structural relationship between the main generating structure MGS and the pedestal 400 is described in detail in the side sectional views shown in FIG. 18 to FIG. 20. FIG.

18 is a front sectional view which shows a cross section in which the power generating element PGE shown in FIG. 17 is cut along a cutting line 18-18. As already described, the main generating structure MGS is composed of a three-layered structure body in which the main generating first layer 100, the main generating second layer 200 and the main generating third layer 300 are laminated. On the other hand, the pedestal 400 is also composed of a three-layered structure body in which the pedestal first layer 401, the pedestal second layer 402 and the pedestal third layer 403 are laminated.

Here, the main generating first layer 100 and the pedestal first layer 401 are arranged exactly at the same position in relation to the Z-axis, and the main generating second layer 200 and the pedestal second layer 402 are also arranged exactly at the same position in relation to the Z-axis. In contrast, when the main generating third layer 300 is compared with the pedestal third layer 403, although the upper surfaces thereof are arranged exactly at the same position in relation to the Z-axis, the lower surface of the main generating third layer 300 is positioned slightly above as compared with that of the pedestal third layer 403. This is due to the fact that the weight body (the central weight body portion 320, the left-hand side weight body portion 330 and the right-hand side weight body portion 340) is kept afloat from the bottom surface of the pedestal 400 and suspended.

As shown in the drawing, the clearance dimension d11 is secured between the outer side surface of the left-hand side weight body portion 330 and the inner surface of the first wall portion 410, and the clearance dimension d12 is secured between the outer side surface of the right-hand side weight body portion 340 and the inner surface of the second wall portion 420. Therefore, the weight body is able to undergo displacement in the direction of the X-axis within a range of the clearance dimensions d11 and d12 but is restricted from displacement beyond the range. In this example, d11 is equal to d12, each of which is set to be 20 μm.

FIG. 19 is a side sectional view which shows a cross section in which the power generating element PGE shown in FIG. 17 is cut along a cutting line 19-19. FIG. 20 is a side sectional view which shows a cross section in which the power generating element PGE shown in FIG. 17 is cut along a cutting line 20-20. In the drawings, it is clearly indicated that each of the main generating structure MGS and the pedestal 400 is composed of a three-layered structure body.

As shown in the drawing, the clearance dimension d13 is secured between the outer side surface of the central weight body portion 320 and the inner surface of the third wall portion 430, and the clearance dimension d14 is secured between the outer side surfaces of the left-hand side weight body portion 330 and the right-hand side weight body portion 340 and the inner surface of the fourth wall portion 440. Therefore, the weight body is able to undergo displacement in the direction of the Y-axis within a range of these clearance dimensions d13 and d14 but is restricted from displacement beyond the range. In this example, d13 is equal to d14, each of which is set to be 15 μm.

Here, a reason why the main generating structure MGS is constituted with a three-layered structure body composed of the main generating first layer 100, the main generating second layer 200 and the main generating third layer 300 is to perform power generating motion described in Chapter 2. That is, the main generating second layer 200 is a layer for constituting the flexible plate-like bridge portion 210, the main generating first layer 100 is a layer for constituting a piezoelectric element which detects deflection occurring at the plate-like bridge portion 210, and the main generating third layer 300 is a layer for performing a function as the weight body which applies an external force to the plate-like bridge portion 210.

In contrast, the pedestal 400 will be sufficient to play a role as a fixing member for supporting and fixing the base end of the plate-like bridge portion 210 and a role as a displacement restricting wall for restricting excessive displacement of the weight body. Thus, the pedestal 400 is not necessarily made into a three-layered structure body in terms of the function. However, in the examples shown in FIG. 18 to FIG. 20, a reason for constituting the pedestal 400 with a three-layered structure body, as with the main generating structure MGS, is only for facilitating a production process.

That is, in the case of the example shown in FIG. 18, the pedestal 400 is constituted with a laminated structure body in which the pedestal first layer 401, the pedestal second layer 402 and the pedestal third layer 403 are laminated sequentially from above. The pedestal first layer 401 continues to the main generating first layer 100 in the vicinity of the base end of the plate-like bridge portion 210, and the pedestal second layer 402 continues to the main generating second layer 200 at the base end of the plate-like bridge portion 210. Further, the pedestal third layer 403 is a constituent which is physically isolated from the main generating third layer 300 but the lowest layer of the three-layered structure body, with the upper surface thereof positioned at the same place.

Resultantly, in the case of the example shown in FIG. 18, the pedestal first layer 401 and the main generating first layer 100 can be constituted with the same material layer. The pedestal second layer 402 and the main generating second layer 200 can be constituted with the same material layer. And, the pedestal third layer 403 and the main generating third layer 300 can also be constituted with the same material layer.

Figure 21:
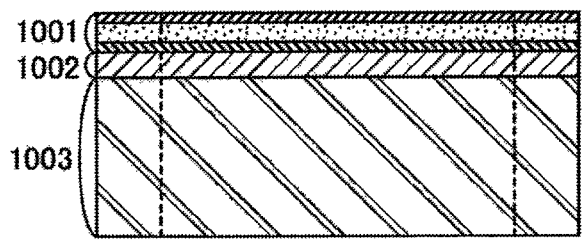
FIG. 21 is a side sectional view of a laminated material block 1000 which is used as a material for constituting the main generating structure MGS and the pedestal 400 of the power generating element PGE shown in FIG. 17.

FIG. 21 is a side sectional view of a laminated material block 1000 which is used as a material for constituting the main generating structure MGS and the pedestal 400 of the power generating element PGE shown in FIG. 18. The laminated material block 1000 is a three-layered laminated structure body in which a material first layer 1001, a material second layer 1002 and a material third layer 1003 are laminated sequentially from above. The dotted line on the drawing indicates a part which is to act as the pedestal 400.

In FIG. 21, the material first layer 1001 is a layer which is intended to constitute the main generating first layer 100 and in which a conductive layer given as an electrode is formed on upper and lower surfaces of the piezoelectric material layer. Similarly, the material second layer 1002 is a layer which is intended to constitute the main generating second layer 200 and can be constituted with, for example, a silicon substrate suitable for constituting the plate-like bridge portion 210. Then, the material third layer 1003 is a layer which is intended to constitute the main generating third layer 300 (the weight body) and can be constituted with, for example, a metal substrate such as SUS.

Each layer of the laminated material block 1000 is subjected to respective necessary treatment process (for example, etching treatment), by which the main generating structure MGS and the pedestal 400 shown in FIG. 18 to FIG. 20 can be constituted at the same time. Therefore, a production step can be simplified to realize mass production and also reduce production costs.

As described above, in the power generating element PGE shown in FIG. 17, the main generating structure MGS is housed in the pedestal 400 which is composed of a rectangular frame-like structure body. Thus, it is possible to restrict displacement of the weight body where a horizontal direction component (a component parallel to the XY plane) of acceleration in excess of a predetermined magnitude is applied. Here, a description will also be given of an example which restricts displacement of the weight body where a perpendicular direction component (a component parallel to the Z-axis) of acceleration in excess of predetermined magnitude is applied.

Figure 22:
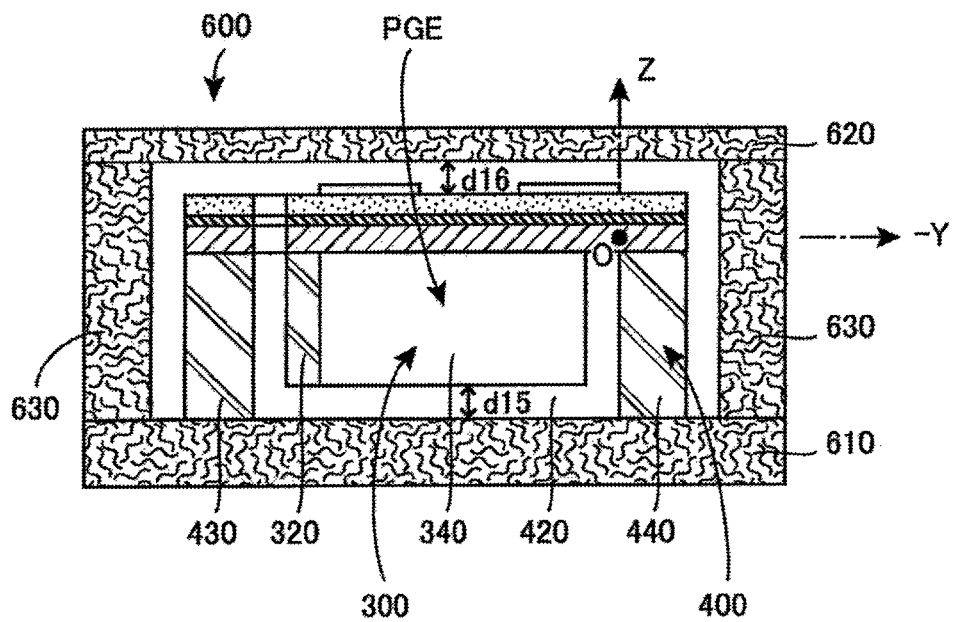
FIG. 22 is a side sectional view of a power generating device which is constituted by housing the power generating element PGE shown in FIG. 17 in a device package 600.

FIG. 22 is a side sectional view which shows the above-described example. The example shown in the drawing is such that the power generating element PGE shown in FIG. 17 is housed inside a device package 600. In the application concerned, the power generating element PGE which includes the device package 600 is referred to as "a power generating device" for convenience of description. That is, "the power generating device" described here is a device which is equipped with the power generating element PGE described above (an element having the main generating structure MGS, the pedestal 400 and the power generating circuit 500) and the device package 600 which houses the power generating element PGE.

As shown in the drawing, the pedestal 400 of the power generating element PGE is fixed to the device package 600. Upon application of an external force which allows the device package 600 to vibrate, the weight body 300 (the main generating third layer) of the power generating element PGE undergoes vibration inside the device package 600 due to deflection of the plate-like bridge portion 210. The power generating circuit 500 which is not illustrated performs processing for taking out electric power generated by the vibration and outputting the electricity to the outside.

More specifically, the device package 600 is provided with a base substrate 610 for supporting and fixing the power generating element PGE from below, an upper lid substrate 620 for covering an upper part of the power generating element PGE and a side wall plate 630 which is arranged so as to surround the circumference of the power generating element PGE and couples the base substrate 610 with the upper lid substrate 620. Then, the bottom surface of the pedestal 400 (individual wall portions 410 to 440) of the power generating element PGE is positioned further below than the bottom surface of the weight body (the main generating third layer 300, namely, 320, 330, 340) of the power generating element PGE. The bottom surface of the pedestal 400 (individual wall portions 410 to 440) is fixed to the upper surface of the base substrate 610.

As a result, there is formed a lower clearance portion which has a clearance dimension d15 between the upper surface of the base substrate 610 and the bottom surface of the weight body (the main generating third layer 300, namely, 320, 330, 340). Further, the upper lid substrate 620 is positioned further above than the upper surface of the main generating first layer 100 of the power generating element PGE, and there is formed an upper clearance portion which has a clearance dimension d16 between the lower surface of the upper lid substrate 620 and the upper surface of the main generating first layer 100. In this example, d15 is equal to d16, each of which is set to be 10 μm.

Therefore, where a perpendicular direction component of acceleration in excess of a predetermined magnitude is applied to the power generating element PGE, a part of the main generating structure PGE comes into contact with the upper surface of the base substrate 610 or the lower surface of the upper lid substrate 620, thereby restricting further displacement. Thus, according to the power generating device shown in FIG. 22, in the XYZ three-dimensional coordinate system, even where excessive acceleration in any direction of the X-axis, the Y-axis or the Z-axis is applied, it is possible to restrict displacement of the weight body and prevent the plate-like bridge portion 210 from being broken.

Figure 23:
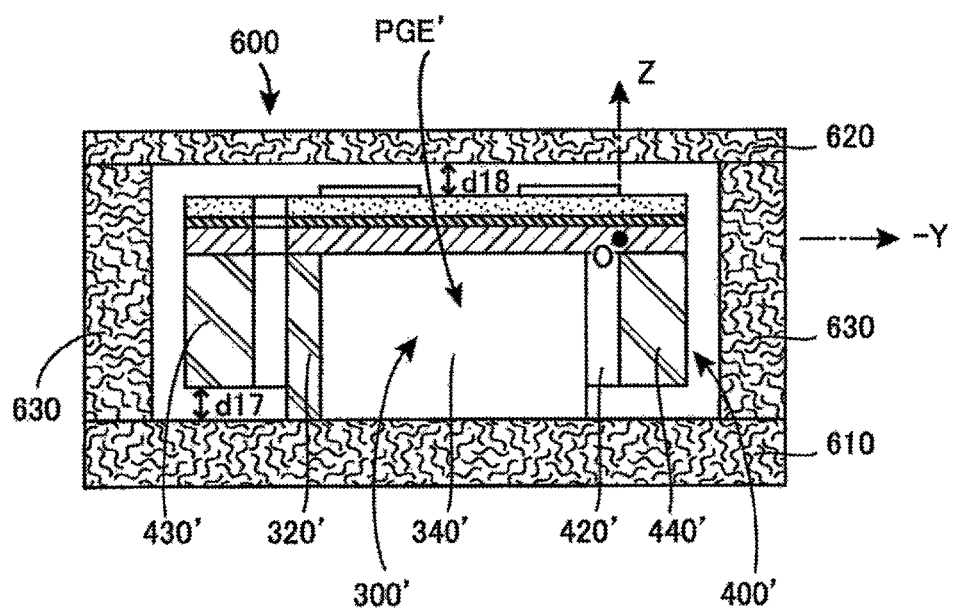
FIG. 23 is a side sectional view of a power generating device according to a modification example in which a role of the weight body and that of the pedestal in the power generating device shown in FIG. 22 are reversed.

FIG. 23 is a side sectional view of a power generating device according to a modification example in which the role of the weight body and the role of the pedestal in the power generating device shown in FIG. 22 are reversed. The power generating device shown in FIG. 23 is also a device which is equipped with a power generating element PGE' and a device package 600 which houses the power generating element PGE'. The portion of the device package 600 is exactly identical to the device shown in FIG. 22. However, the power generating element PGE' shown in FIG. 23 is slightly different in structure from the power generating element PGE shown in FIG. 22.

In the case of the power generating device shown in FIG. 23, a main generating third layer 300' (320', 330', 340') of the power generating element PGE' is fixed to the device package 600, and a pedestal 400' (410', 420', 430', 440') is kept suspended. Therefore, upon application of an external force which allows the device package 600 to vibrate, the pedestal 400' of the power generating element PGE undergoes vibration inside the device package 600 by deflection of the plate-like bridge portion 210. The power generating circuit 500 which is not illustrated performs processing for taking out electric power generated by the vibration and outputting the electric power to the outside.

More specifically, the device package 600 is provided with a base substrate 610 for supporting and fixing the power generating element PGE' from below, an upper lid substrate 620 for covering an upper part of the power generating element PGE' and a side wall plate 630 which is arranged so as to surround the circumference of the power generating element PGE' and couples the base substrate 610 with the upper lid substrate 620. Then, the bottom surface of the pedestal 400' (410', 420', 430', 440') of the power generating element PGE' is positioned further above than the bottom surface of the main generating third layer 300' (320', 330', 340') of the power generating element PGE', and the bottom surface of the main generating third layer 300' (320', 330', 340') is fixed to the upper surface of the base substrate 610.

As a result, there is formed a lower clearance portion which has a clearance dimension d17 between the upper surface of the base substrate 610 and the bottom surface of the pedestal 400' (410', 420', 430', 440'). Further, the upper lid substrate 620 is positioned further above than the upper surface of the main generating first layer 100 of the power generating element PGE', and there is formed an upper clearance portion which has a clearance dimension d18 between the lower surface of the upper lid substrate 620 and the upper surface of the main generating first layer 100. In this example, d17 is equal to d18, each of which is set to be 10 μm.

Therefore, where a perpendicular direction component of acceleration in excess of a predetermined magnitude is applied to the power generating element PGE', a part of the main generating structure PGE' comes into contact with the upper surface of the base substrate 610 or the lower surface of the upper lid substrate 620, thereby restricting further displacement. Thus, in the case of the power generating device shown in FIG. 23 as well, in the XYZ three-dimensional coordinate system, if excessive acceleration in any direction of the X-axis, the Y-axis or the Z-axis is applied, it is possible to restrict displacement of the weight body and prevent the plate-like bridge portion 210 from being broken. As described above, examples of specific dimensional values are shown with regard to the clearance dimensions d11 to d18. Of course, optimal values of these clearance dimensions d11 to d18 shall be determined depending on dimensional values d1 to d10, etc., of individual portions shown in FIG. 6 and FIG. 7.

The power generating device shown in FIG. 22 is compared with the power generating device shown in FIG. 23 in terms of an operation principle. In the former case, the main generating third layer 300 (320, 330, 340) performs a function as a weight body which is kept suspended inside the device package 600 and vibration energy of the weight body is converted into electric energy. In the latter case, the pedestal 400' (410', 420', 430', 440') performs a function as a weight body which is kept suspended inside the device package 600, and vibration energy of the weight body is converted into electric energy. It is noted that in the case of the power generating device shown in FIG. 23, in principle, a member 300' is to be referred to as the pedestal, and a member 400' is to be referred to as the weight body. However, for convenience of comparison with the power generating device shown in FIG. 22, here, the member 300' is referred to as the weight body and the member 400' is referred to as the pedestal.

In general terms, as compared with the main generating third layers 300, 300', the pedestals 400, 400' which surround them can be easily made into a structure body having greater mass. For example, in the example shown in FIG. 17, the first wall portion 410, the second wall portion 420, the third wall portion 430 and the fourth wall portion 440 are increased in wall thickness, by which the pedestal 400 can be easily increased in mass. The pedestal which is large in mass is used as a weight body, thus making it possible to secure greater power generation. Therefore, in general terms, the structure shown in FIG. 23 is more preferable than the structure shown in FIG. 22 in securing power generation. Of course, even where the structure shown in FIG. 23 is adopted, the pedestal 400' is restricted from displacement in the direction of each coordinate axis, thereby obtaining effects of preventing breakage of the plate-like bridge portion 210.

Chapter 4. Modification Examples of the Present Invention

Next, a description will be given of several modification examples on the power generating element PGE according to the basic embodiment described above.

4-1. First Modification Example A: Planar Shape Modification Example with Three-Layered Structure Body The main generating structure MGS which constitutes the power generating element PGE according to the basic embodiment described in Chapter 1 is, as shown in FIG. 1, constituted with a three-layered structure body in which the main generating first layer 100, the main generating second layer 200 and the main generating third layer 300 are laminated. Planar shapes of the three layers are shown respectively in FIG. 2 to FIG. 4.

Here, as apparent from comparison between FIG. 2 and FIG. 3, the planar shape of the main generating first layer 100 is exactly identical to the planar shape of the main generating second layer 200, and their projection images on the XY plane are overlapped. This is because there is adopted a production process in which the main generating first layer 100 composed of a piezoelectric element is formed on an entire domain of the upper surface of the main generating second layer 200 which is made of a silicon substrate.

However, a role of the main generating first layer 100 (the piezoelectric element) is to cause deflection together with the main generating second layer 200, thereby generating electric power on the basis of this deflection. Thus, in principle, the main generating first layer 100 (the piezoelectric element) will be sufficient as long as it is formed on the upper surface of the plate-like bridge portion 210 on which deflection occurs. The main generating first layer 100 shown in FIG. 2 is constituted with four portions of the bridge portion piezoelectric layer 110, the central piezoelectric layer 120, the left-hand side piezoelectric layer 130 and the right-hand side piezoelectric layer 140. In principle, only the bridge portion piezoelectric layer 110 may be installed. In more detail, it is sufficient to form the bridge portion piezoelectric layer 110 only on domains where the upper layer electrodes E1 to E4 may be formed.

In short, the planar shape of the main generating first layer 100 is not necessarily identical to the planar shape of the main generating second layer 200. The main generating first layer 100 may be only provided with a piezoelectric element which is formed so as to cover at least a part of the upper surface of the plate-like bridge portion 210 on the main generating second layer 200.

On the other hand, as apparent from comparison between FIG. 3 and FIG. 4, the planar shape of the main generating second layer 200 is identical to the planar shape of the main generating third layer 300 except for the portion of the plate-like bridge portion 210. That is, the planar shapes of the central plate-like portion 220, the left-hand side plate-like portion 230 and the right-hand side plate-like portion 240 which constitute individual parts of the main generating second layer 200 shown in FIG. 3 are respectively identical to the planar shapes of the central weight body portion 320, the left-hand side weight body portion 330 and the right-hand side weight body portion 340 which constitute individual parts of the main generating third layer 300 shown in FIG. 4. They are different in planar shape only in that the part corresponding to the plate-like bridge portion 210 of the main generating second layer 200 shown in FIG. 3 is given as the void portion 310 in the main generating third layer 300 shown FIG. 4.

As described above, the planar shape of the main generating second layer 200 is almost identical to the planar shape of the main generating third layer 300, by which the three layers are made almost identical in outer planar shape. It is, thus, possible to simplify an entire shape of the main generating structure MGS. However, the planar shape of the main generating second layer 200 is not necessarily made almost identical to the planar shape of the main generating third layer 300.

Figure 24:
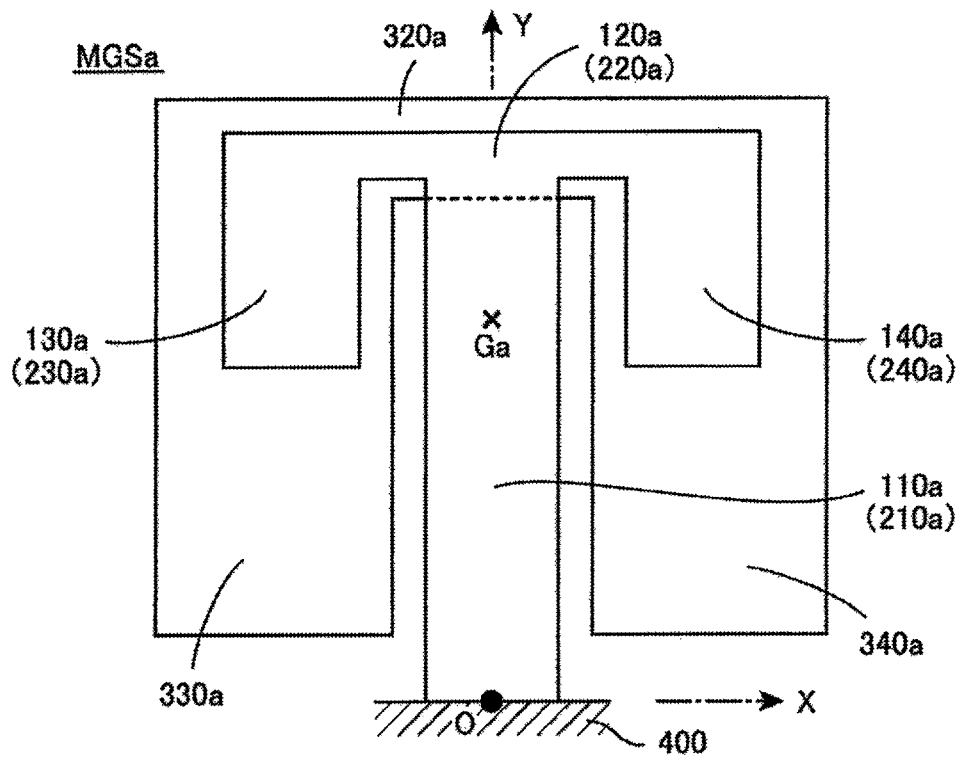
FIG. 24 is a top view which shows a first modification example A of the main generating structure MGS given in FIG. 1 (the reference numerals in parentheses indicate constituents of a main generating second layer 200a arranged below).

FIG. 24 is a top view which shows a main generating structure MGSa according to the first modification example A of the main generating structure MGS shown in FIG. 1. The main generating structure MGSa is constituted with a three-layered structure body which is composed of a main generating first layer 100a, a main generating second layer 200a and a main generating third layer 300a, as with the main generating structure MGS shown in FIG. 1 but different in planar shape of each layer. In the first modification example A, the main generating first layer 100a is identical in planar shape with the main generating second layer 200a but they are greatly different in planar shape from the main generating third layer 300a.

Individual portions of the main generating first layer 100a and those of the main generating second layer 200a are respectively identical in planar shape. Since FIG. 24 is a top view, the main generating second layer 200a is concealed behind a lower layer of the main generating first layer 100a and does not appear in the drawing. However, the reference numerals in parentheses indicate individual constituents of the main generating second layer 200a arranged so as to be overlapped below the main generating first layer 100a. As apparent from the drawing, an outer circumference of the main generating third layer 300a extends out greatly to the outside from an outer circumference of the main generating first layer 100a and that of the main generating second layer 200a.

Specifically, the central weight body portion 320a is structured so as to extend out to a greater extent than the central piezoelectric layer 120a and the central plate-like portion 220a. The left-hand side weight body portion 330a is also structured so as to extend out to a greater extent than the left-hand side piezoelectric layer 130a and the left-hand side plate-like portion 230a. Further, the right-hand side weight body portion 340a is also structured so as to extend out to a greater extent than the right-hand side piezoelectric layer 140a and the right-hand side plate-like portion 240a.

The thus structured main generating structure MGSa is also structured so as to give plane symmetry in relation to the YZ plane. Therefore, the center of gravity Ga of a structure body (a weight body) which constitutes the main generating third layer 300a is positioned on the YZ plane below the plate-like bridge portion 210a. Therefore, the weight body undergoes stable vibration in the direction of each coordinate axis, which is the same as the previous case.

As described above, there is adopted such a structure that the outer circumference of the main generating third layer 300a (a central weight body portion 320a, a left-hand side weight body portion 330a and a right-hand side weight body portion 340a) which performs a function as the weight body is allowed to extend out greatly to the outside from the outer circumference of the main generating first layer 100a and that of the main generating second layer 200a, by which it is possible to enhance a function to protect the main generating first layer 100a and the main generating second layer 200a upon application of excessive vibration.

That is, in the case of the main generating structure MGS shown in FIG. 17, the plate-like bridge portion 210 which is most likely to be damaged is surrounded by a "U" letter shaped structure body. Therefore, even where an external force which causes excessive displacement is applied, there is no chance that the plate-like bridge portion 210 itself comes into contact with the pedestal 400. However, as apparent from FIG. 18, outer circumference surfaces of the main generating first layer 100, the main generating second layer 200 and the main generating third layer 300 are aligned with each other. Thus, where an external force which causes excessive displacement is applied, the outer circumference of each of these layers comes into contact with the inner surface of the pedestal 400. Since the main generating first layer 100 and the main generating second layer 200 are thinner in thickness than the main generating third layer 300, there is a risk that the outer circumferences thereof may be damaged when in contact with the inner surface of the pedestal 400.

In contrast, in the case of the main generating structure MGSa shown in FIG. 24, such a structure is adopted that the outer circumference of the main generating third layer 300a which is greater in thickness is allowed to extend out to the outside. Thus, where an external force which causes excessive displacement is applied, the outer circumference of the main generating third layer 300a comes into contact with the inner surface of the pedestal 400, thereby restricting further displacement. Therefore, it is possible to prevent the outer circumference surfaces of the main generating first layer 100a and the main generating second layer 200a which are thinner in thickness from being in contact with the inner surface of the pedestal 400 and also prevent the outer circumferences from being damaged.

In the main generating structure MGSa shown in FIG. 24, the main generating third layer 300a is allowed to extend out in all the directions (vertical and lateral directions) in the drawing. The layer is, however, not necessarily allowed to extend out in all the directions in order to attain the above-described protection effect. That is, there may be provided such a structure that an outer circumference of the main generating third layer 300a which performs a function as the weight body is partially brought into contact with the inner surface of the pedestal 400, thus making it possible to restrict vertical displacement and lateral displacement in the drawing.

Specifically, an end of the main generating third layer 300a in the positive direction of the X-axis may project in the positive direction of the X-axis to a greater extent than ends of weight body supporting portions (220a, 230a, 240a) in the positive direction of the X-axis. An end of the main generating third layer 300a in the negative direction of the X-axis may project in the negative direction of the X-axis to a greater extent than ends of the weight body supporting portions (220a, 230a, 240a) in the negative direction of the X-axis. An end of the main generating third layer 300a in the positive direction of the Y-axis may project in the positive direction of the Y-axis to a greater extent than ends of the weight body supporting portions (220a, 230a, 240a) in the positive direction of the Y-axis. An end of the main generating third layer 300a in the negative direction of the Y-axis may project in the negative direction of the Y-axis to a greater extent than ends of the weight body supporting portions (220a, 230a, 240a) in the negative direction of the Y-axis.

4-2. Second Modification Example B: Separation Structure of Weight Body

In the basic embodiment described above, as shown in FIG. 4, the main generating third layer 300 performing a function as the weight body is constituted with three portions of the central weight body portion 320, the left-hand side weight body portion 330 and the right-hand side weight body portion 340 (as with the first modification example A shown in FIG. 24). However, in the present invention, there is used, as a weight body, the main generating structure MGS which is provided with the left-hand side weight body portion 330 positioned on the left hand side and the right-hand side weight body portion 340 positioned on the right hand side in relation to the plate-like bridge portion 210 in the longitudinal direction axis (Y-axis), by which it is possible to obtain necessary working effects. In other words, the central weight body portion 320 which connects the left-hand side weight body portion 330 with the right-hand side weight body portion 340 is not essentially necessary for carrying out the present invention.

Figure 25:
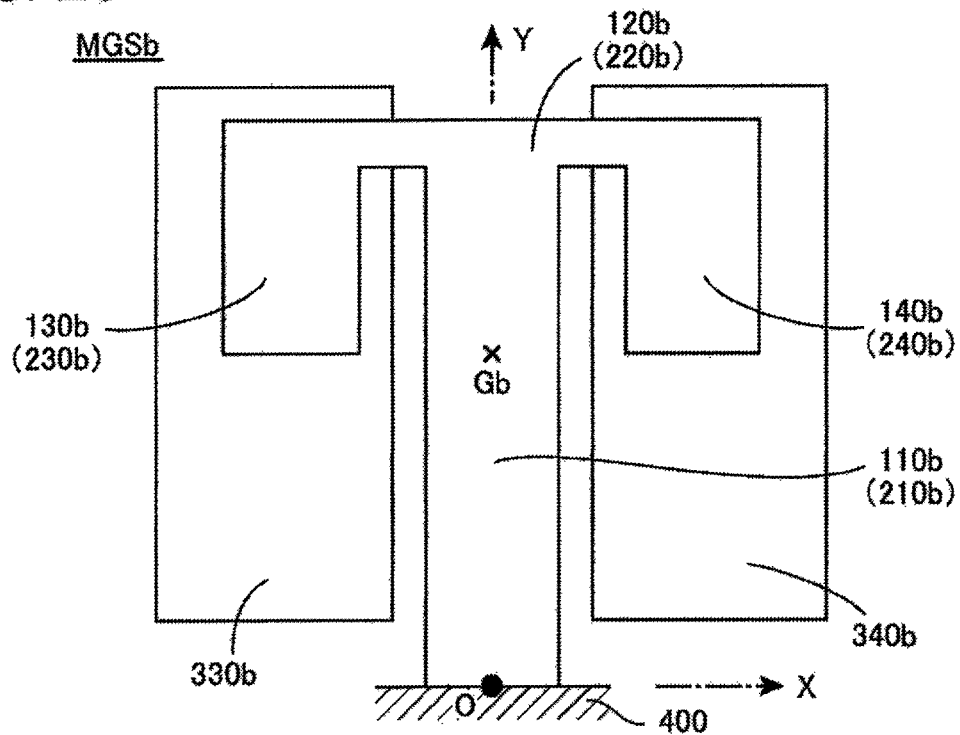
FIG. 25 is a top view which shows a second modification example B of the main generating structure MGS given in FIG. 1 (the reference numerals in parentheses indicate constituents of a main generating second layer 200b arranged below).

FIG. 25 is a top view which shows the second modification example B of the main generating structure MGS shown in FIG. 1. As with the main generating structure MGS shown in FIG. 1 and the main generating structure MGSa shown in FIG. 24, a main generating structure MGSb shown in the drawing is constituted with a three-layered structure body composed of a main generating first layer 100b, a main generating second layer 200b and a main generating third layer 300b. Also, here, the reference numerals in parentheses indicate constituents of the main generating second layer 200b arranged below. The main generating first layer 100b (110b, 120b, 130b, 140b) shown in FIG. 25 is exactly identical in constituents with the main generating first layer 100a (110a, 120a, 130a, 140a) shown in FIG. 24. The main generating second layer 200b (210b, 220b, 230b, 240b) shown in FIG. 25 is exactly identical in constituents with the main generating second layer 200a (210a, 220a, 230a, 240a) shown in FIG. 24.

The main generating structure MGSa shown in FIG. 24 is different from the main generating structure MGSb shown in FIG. 25 only in a structure portion of the main generating third layer which performs a function as the weight body. That is, in the case of the main generating structure MGSa shown in FIG. 24, the main generating third layer 300a is a "U" letter shaped structure body which is composed of three portions of the central weight body portion 320a, the left-hand side weight body portion 330a and the right-hand side weight body portion 340a. In the case of the main generating structure MGSb shown in FIG. 25, the main generating third layer 300b is a structure body composed of two portions of a left-hand side weight body portion 330b and a right-hand side weight body portion 340b, and there is provided no central weight body portion for connecting them.

The left-hand side weight body portion 330b is joined with the lower surface of the left-hand side plate-like portion 230b (the weight body supporting portion), and the right-hand side weight body portion 340b is joined with the lower surface of the right-hand side plate-like portion 240b (the weight body supporting portion). Displacement caused on the weight body is smoothly transmitted to the leading end of the plate-like bridge portion 210b.

In the above-structured main generating structure MGSb, the weight body is separated into two portions of the left-hand side weight body portion 330b and the right-hand side weight body portion 340b. Since the weight body is structured so as to give plane symmetry in relation to the YZ plane, the center of gravity Gb of the weight body is positioned on the YZ plane below the plate-like bridge portion 210b. Therefore, the weight body undergoes stable vibration in the direction of each coordinate axis, which is the same as the previous case.

Further, the main generating structure MGSb shown in FIG. 25 is structured so that an outer circumference of the main generating third layer 300b extends out to a greater extent than outer circumferences of the main generating first layer 100b and the main generating second layer 200b, as with the main generating structure MGSa shown in FIG. 24. It is, therefore, possible to prevent outer circumference surfaces of the main generating first layer 100b and the main generating second layer 200b which are thinner in thickness from being in contact with the inner surface of the pedestal 400 and also obtain such an effect of preventing damage to the outer circumference.

That is, in FIG. 25, an end of the right-hand side weight body portion 340b in the positive direction of the X-axis projects in the positive direction of the X-axis to a greater extent than an end of the right-hand side plate-like portion 240b (the weight body supporting portion) in the positive direction of the X-axis. An end of the left-hand side weight body portion 330b in the negative direction of the X-axis projects in the negative direction of the X-axis to a greater extent than an end of the left-hand side plate-like portion 230b (the weight body supporting portion) in the negative direction of the X-axis. Ends of the left-hand side weight body portion 330b and the right-hand side weight body portion 340b in the positive direction of the Y-axis project in the positive direction of the Y-axis to a greater extent than ends of the left-hand side plate-like portion 230b and the right-hand side plate-like portion 240b (weight body supporting portions) in the positive direction of the Y-axis. Ends of the left-hand side weight body portion 330b and the right-hand side weight body portion 340b in the negative direction of the Y-axis project in the negative direction of the Y-axis to a greater extent than ends of the left-hand side plate-like portion 230b and the right-hand side plate-like portion 240b (weight body supporting portions) in the negative direction of the Y-axis.

Therefore, even if an external force which causes excessive displacement in the vertical direction or in the lateral direction in the drawing is applied to the weight body, the outer circumference of the main generating third layer 300b (weight body) is constantly in contact with the inner surface of the pedestal 400, thereby restricting further displacement. It is, therefore, possible to prevent the outer circumference surfaces of the main generating first layer 100b and the main generating second layer 200b which are thinner in thickness from being in contact with the inner surface of the pedestal 400 and also prevent damage to the outer circumferences.

Figure 26:
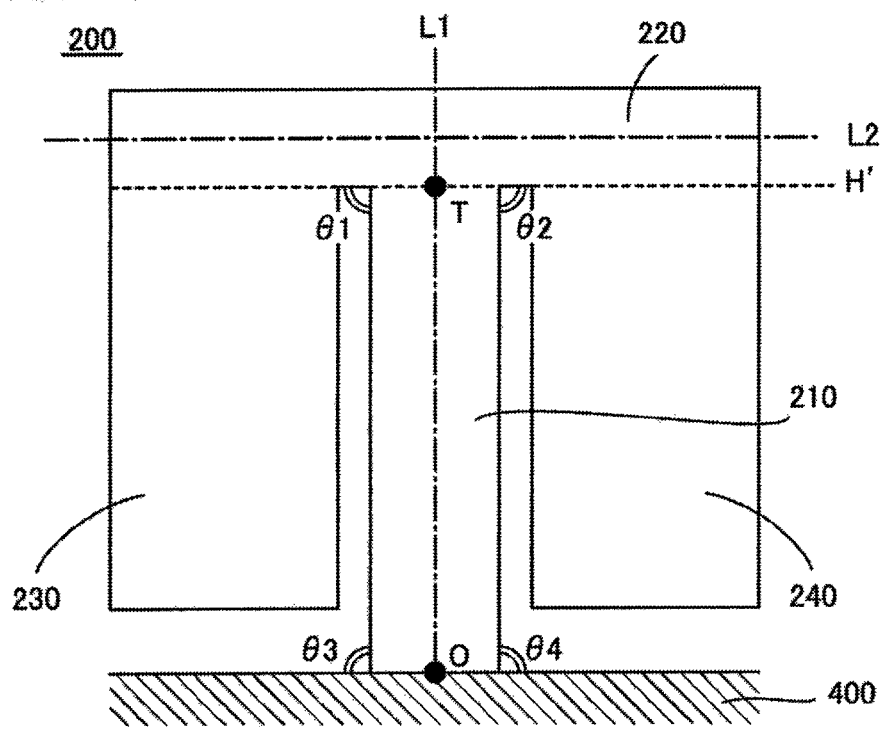
FIG. 26 is a top view which shows connection angles at both ends of a plate-like bridge portion 210 in the main generating second layer 200 of the main generating structure MGS given in FIG. 1.

4-3. Third Modification Example C: Connection Angles at Plate-Like Bridge Portion FIG. 26 is a top view which shows connection angles at both ends of the plate-like bridge portion 210 on the main generating second layer 200 of the main generating structure MGS shown in FIG. 1. As shown in the drawing, the main generating second layer 200 is constituted with four portions of a plate-like bridge portion 210, a central plate-like portion 220, a left-hand side plate-like portion 230 and a right-hand side plate-like portion 240.

Here, the plate-like bridge portion 210 is an essential portion which causes deflection directly involved in power generating motion and a flexible beam-like structure body extending along a first longitudinal direction axis L1 (the Y-axis in the description given above). In contrast, the central plate-like portion 220 is a structure body extending along a second longitudinal direction axis L2 (the X'-axis in the description given above) orthogonal to the first longitudinal direction axis L1 and arranged at a position so as to be symmetrical in relation to the first longitudinal direction axis L1. Then, the leading end of the plate-like bridge portion 210 is connected to a center of the central plate-like portion 220 at the leading end point T. Both of them give a T letter shaped structure body.

Further, the left-hand side plate-like portion 230 is connected to the left side of the central plate-like portion 220, and the right-hand side plate-like portion 240 is connected to the right side thereof. The main generating second layer 200 constitutes a flat-plate like structure body in which the planar shape thereof is formed in the "E" letter shape, as a whole. A boundary line H' in the drawing corresponds to a boundary line which divides individual domains with each other.

In the main generating second layer 200, attention is given to a connection state of the leading end (the vicinity of the leading end point T) of the plate-like bridge portion 210 with the central plate-like portion 220. Both of the connection angles θ1, θ2 in the drawing give 90 degrees. Here, the connection angle θ1 is an angle formed by a side on the left of the plate-like bridge portion 210 and the boundary line H', while the connection angle θ2 is an angle formed by a side on the right of the plate-like bridge portion 210 and the boundary line H'. As described above, these connection angles θ1, θ2 give 90 degrees, the reason of which is that the first longitudinal direction axis L1 and the second longitudinal direction axis L2 are orthogonal to each other and also the plate-like bridge portion 210 which is oblong in shape is arranged so that the first longitudinal direction axis L1 is given as the center axis, and the central plate-like portion 220 which is oblong in shape is arranged so that the second longitudinal direction axis L2 is given as the center axis.

Similarly, attention is given to a connection state of the base end (the vicinity of the origin O) of the plate-like bridge portion 210 with the pedestal 400. Both of connection angles θ3, θ4 shown in the drawing give 90 degrees. Here, the connection angle θ3 is an angle formed by a side on the left of the plate-like bridge portion 210 and an inner side surface of the pedestal 400. The connection angle θ4 is an angle formed by a side on the right of the plate-like bridge portion 210 and an inner side surface of the pedestal 400. As described above, the connection angles θ3, θ4 give 90 degrees, the reason of which is that the first longitudinal direction axis L1 is orthogonal to the inner side surface of the pedestal 400 and also the plate-like bridge portion 210 which is oblong in shape is arranged so that the first longitudinal direction axis L1 is given as the center axis.

Figure 27:
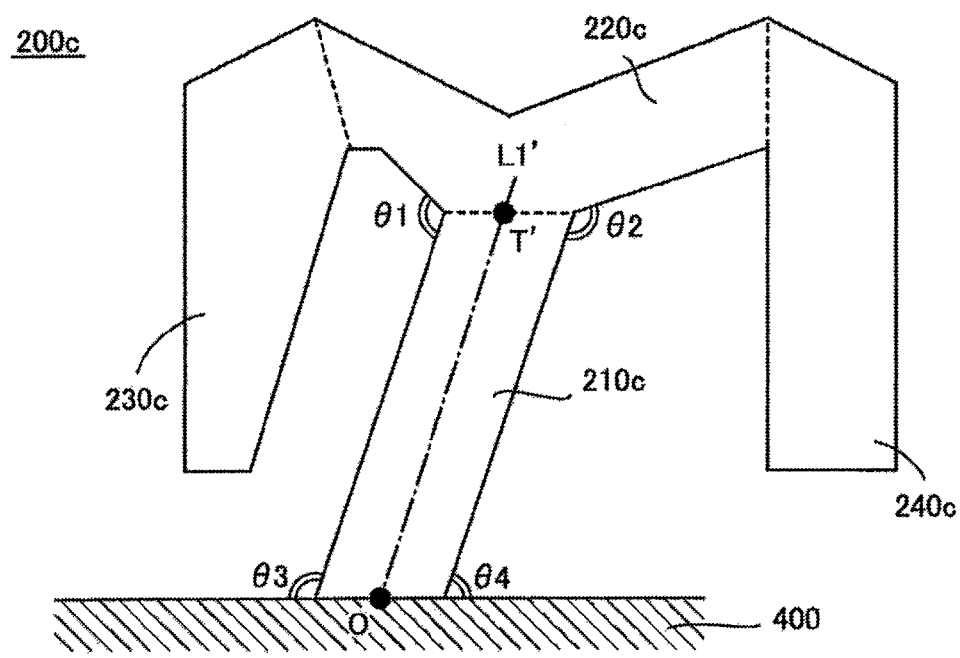
FIG. 27 is a top view which shows a main generating second layer 200c according to a third modification example C of the main generating structure MGS given in FIG. 1.

On the other hand, FIG. 27 is a top view which shows a main generating second layer 200c according to the third modification example C of the main generating structure MGS shown in FIG. 1. In the case of the third modification example C as well, the main generating second layer 200c is constituted with four portions of a plate-like bridge portion 210c, a central plate-like portion 220c, a left-hand side plate-like portion 230c and a right-hand side plate-like portion 240c. The planar shape of each of the portions is not oblong but irregular in shape. Further, the plate-like bridge portion 210c is a member extending in a direction along a longitudinal direction axis L1', but the longitudinal direction axis L1' is not orthogonal to the inner side surface of the pedestal 400. Therefore, connection angles θ1, θ2 at the leading end of the plate-like bridge portion 210c or connection angles θ3, θ4 at the base end thereof do not give 90 degrees.

As described above, even where the power generating element according to the present invention is formed by using the main generating second layer 200c having an irregular shape according to the third modification example C shown in FIG. 27, it is possible to generate electric power smoothly. That is, there is provided such a weight body that has a left-hand side weight body portion 330c joined with the lower surface of the left-hand side plate-like portion 230c and a right-hand side weight body portion 340c joined with the lower surface of the right-hand side plate-like portion 240c, by which the plate-like bridge portion 210c will deflect by vibration of the weight body. It is, thus, possible to generate electric power by a piezoelectric element installed on the upper surface thereof.

Therefore, the plate-like bridge portion is not necessarily made orthogonal to the central plate-like portion in carrying out the present invention or a T letter shaped structure body is not necessarily constituted with these portions. For example, in the case of the modification example C shown in FIG. 27, a mode which is similar to the Y letter shape is formed by the plate-like bridge portion 210c and the central plate-like portion 220c. Further, the plate-like bridge portion 210c is not necessarily connected with the inner side surface of the pedestal 400 in a mode so as to be orthogonal thereto. Still further, the planar shape of each portion which constitutes each layer of the main generating structure is not necessarily oblong in shape but may be formed in any given shape.

However, in practice, as shown in the example of FIG. 26, it is preferable that each portion of the main generating second layer 200 is constituted with a member with an oblong plane, the plate-like bridge portion 210 is arranged so that the first longitudinal direction axis L1 orthogonal to the inner side surface of the pedestal 400 is given as the center axis, the central plate-like portion 220 is arranged so that the second longitudinal direction axis L2 orthogonal to the first longitudinal direction axis L1 is given as the center axis, and the plate-like bridge portion 210 is orthogonal to the central plate-like portion 220 to give the T letter shape. The above-described constitution is adopted, by which all the connection angles θ1 to θ4 give 90 degrees. It is, therefore, possible to concentrate stress at the leading end and the base end of the plate-like bridge portion 210 (refer to FIG. 13 to FIG. 15) and generate charge efficiently at the four upper layer electrodes E1 to E4 arranged at positions shown in FIG. 6.

4-4. Fourth Modification Example D: Independent Main Generating Part

Since the power generating element PGE shown in FIG. 18 has been constituted so that the portion of the main generating structure MGS and the portion of the pedestal 400 are both composed of a three-layered structure body, the single laminated material block 1000 shown in FIG. 21 is provided and subjected to etching treatment process or the like, thus making it possible to produce the power generating element PGE. As described above, this is suitable for mass production.

Here, of the three-layered structure which constitutes the main generating structure MGS, the main generating first layer 100 requires the use of a piezoelectric element for attaining power generating motion. Further, for the main generating second layer 200, the use of a silicon substrate is suitable and the use of a metal substrate is suitable for the main generating third layer 300. This is due to the fact that, as described above, a silicon substrate is optimal as a layer for supporting the piezoelectric element and in order to keep resonance frequency within a range of 10 Hz to 50 Hz, the weight body is optimally constituted with a metal substrate.

In particular, with mass production taken into account, it is preferable that at a stage of providing the laminated material block 1000 shown in FIG. 21, a material second layer 1002 is constituted with a silicon substrate, a metal layer which is to act as a lower layer electrode E0 is formed on the upper surface thereof, a film of a piezoelectric material layer is formed further on the upper surface thereof, and a metal layer which is to act as upper layer electrodes E1 to E4 is formed still further on the upper surface thereof, thereby forming a material first layer 1001, and the material first layer is joined with the upper surface of a material third layer 1003 composed of a metal substrate.

However, at the present time, a process step for forming a piezoelectric element on a silicon substrate requires sophisticated facilities and entails a great amount of cost. In practice, according to existing technologies, the process step for forming a piezoelectric element on a silicon substrate requires expenditure of 10 times or more than a material cost of the silicon substrate. Therefore, although the laminated material block 1000 shown in FIG. 21 may be used to perform a process for efficiently producing the power generating element PGE shown in FIG. 18, it is inevitable that costs for purchasing the laminated material block 1000 will be relatively high.

In practice, a piezoelectric element which is directly involved in power generation functions of the power generating element PGE is only the part formed on the upper surface of the plate-like bridge portion 210, and it is not necessary to form a piezoelectric element at other domains. In particular, a piezoelectric element formed on the pedestal 400 is useless. Originally, there is found no necessity at all for using a silicon substrate in the pedestal 400. Thus, here, a description will be given of a modification example in which a silicon substrate and a piezoelectric element formed on the upper surface thereof can be greatly decreased in planar size, thereby attaining a reduction in production costs.

Figure 28:
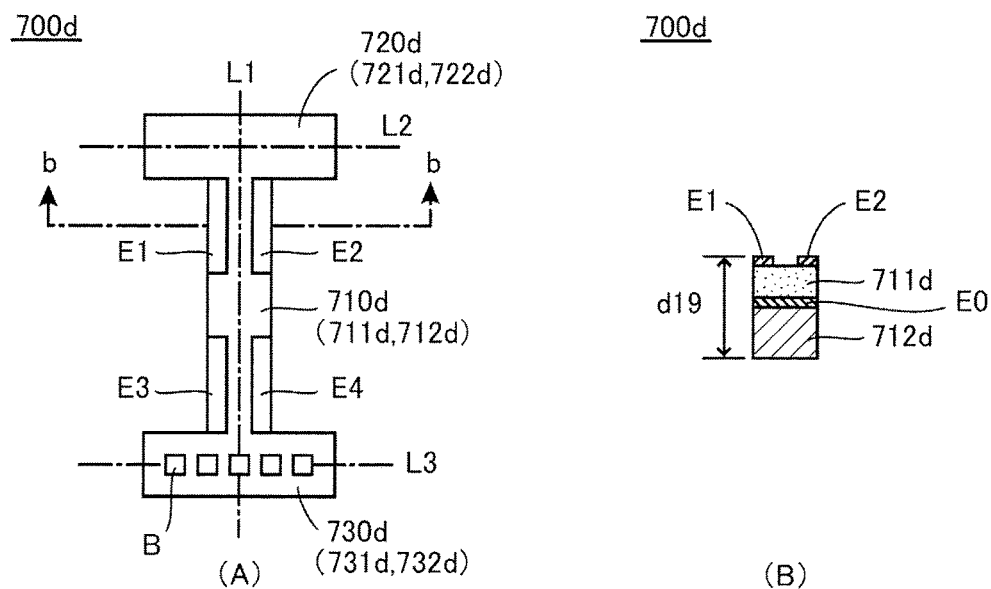
FIG. 28 covers a top view (FIG. 28(A)) and a front sectional view (FIG. 28(B)), each of which shows a main generating part 700d used in a fourth modification example D of the main generating structure MGS given in FIG. 1.

FIGS. 28(A) and 28(B) are drawings which show a main generating part 700d used in the fourth modification example D of the main generating structure MGS shown in FIG. 1. FIG. 28(A) is a top view thereof and FIG. 28(B) is a front sectional view in which the main generating part is cut along a cutting line b-b. In FIG. 28(A), the reference numerals in parentheses indicate constituents of individual layers. The fourth modification example D described here is in principle exactly identical to the basic embodiment described above but slightly different in specific constitution of parts. The main generating part 700d shown in FIG. 28 plays a role as a part in which the portion of the weight body is removed from the main generating structure MGS of the basic embodiment described above.

As shown in the top view of FIG. 28(A), the main generating part 700d is constituted with a first member 710d extending along a first longitudinal direction axis L1, a second member 720d extending along a second longitudinal direction axis L2 and a third member 730d extending along a third longitudinal direction axis L3. Here, the first longitudinal direction axis L1, the second longitudinal direction axis L2 and the third longitudinal direction axis L3 are all included on the same common plane. The first longitudinal direction axis L1 is orthogonal to the second longitudinal direction axis L2, and the first longitudinal direction axis L1 is orthogonal to the third longitudinal direction axis L3 (the second longitudinal direction axis L2 is parallel to the third longitudinal direction axis L3).

In the front sectional view of FIG. 28(B), there is indicated only a cross section in which the first member 710d is cut along a cutting line b-b. As shown in the drawing, the first member 710d is structured so that, for example, a lower layer electrode E0 composed of metal is formed on an upper surface of a plate-like bridge portion 712d composed of silicon, a bridge portion piezoelectric layer 711d is formed on the upper surface thereof and upper layer electrodes E1 to E4 (in the drawing, only E1 and E2 appear which are positioned on the cross section) are formed at predetermined positions further on the upper surface thereof. A layer structure thereof and thickness dimensions of individual layers are the same as those of the example shown in FIG. 7. Therefore, in the case of this example, a thickness dimension d19 of the first member 710d (dimension from the lower surface of the plate-like bridge portion 712d to the upper surface of each of the upper layer electrodes E1 to E4) is a sum of each thickness of four layers, that is, 0.01+2.00+0.01+200.00=202.02 µm.

Although not shown in the drawing, the second member 720d and the third member 730d are also similar in layer structure. That is, the second member 720d is structured so that, for example, a lower layer electrode E0 composed of metal is formed on an upper surface of a central plate-like portion 722d composed of silicon and a central piezoelectric layer 721d is formed on the upper surface thereof. And, the third member 730d is structured so that, for example, the lower layer electrode E0 composed of metal is formed on an upper surface of a pedestal connection portion 732d composed of silicon, a connection portion piezoelectric layer 731d is formed on the upper surface thereof and a bonding pad B is formed at predetermined sites (installed at five sites in the drawing) further on the upper surface thereof.

Here, the thickness of the third member 730d is the same as that of the first member 710d, that is, the dimension d19 (this is because the thickness of the bonding pad B is set to be equal to the thickness of each of the upper layer electrodes E1 to E4). On the other hand, in the case of the example shown in the drawing, neither the upper layer electrodes E1 to E4 nor the bonding pad B is formed on the upper surface of the second member 720d. Therefore, the thickness of the second member 720d is slightly smaller than the dimension d19. It is noted that wiring (not illustrated) is given between five sets of bonding pads B and each of the electrodes E0 to E4. Wiring from a power generating circuit 500 is given to each of the bonding pads B.

In the fourth modification example D as well, the four upper layer electrodes E1 to E4 are formed laterally at both side positions in the vicinity of an upper end of the first member 710d in the drawing and laterally at both side positions in the vicinity of a lower end of the first member 710d in the drawing, and each of them is arranged at a stress concentrating domain. It is apparent from the stress distribution diagrams shown in FIG. 13 to FIG. 15 that the upper end position of each of the upper layer electrodes E1, E2 shown in FIG. 28(A) in the drawing may extend beyond a boundary line between the first member 710d and the second member 720d and slightly above the drawing (a domain of the second member 720d). Similarly, it is apparent that the lower end position of each of the upper layer electrodes E3, E4 shown in FIG. 28(A) in the drawing may extend beyond a boundary line between the first member 710d and the third member 730d and slightly below the drawing (a domain of the third member 730d).

Figure 29:
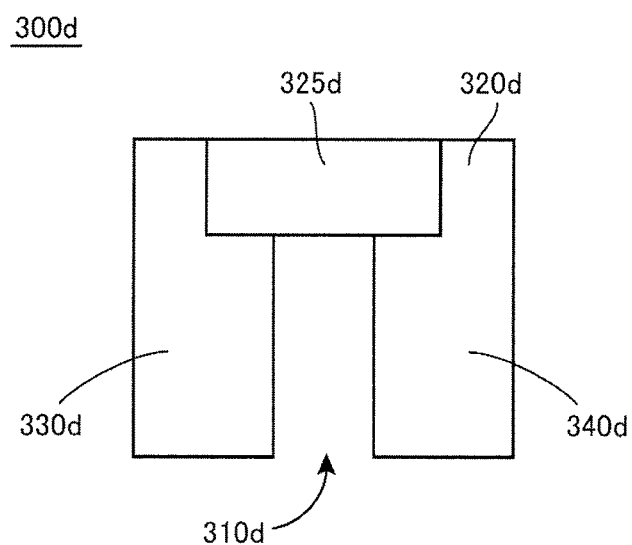
FIG. 29 is a top view which shows a weight body 300d used in the fourth modification example D of the main generating structure MGS given in FIG. 1.

On the other hand, FIG. 29 is a top view which shows a weight body 300d used in the fourth modification example D. As with the weight body 300 (the main generating third layer) shown in FIG. 4, the weight body 300d is constituted with a material such as metal, glass or ceramic. It is a "U" letter shaped constituent which has three portions of a central weight body portion 320d, a left-hand side weight body portion 330d and a right-hand side weight body portion 340d and provided with a void portion 310d. Of course, the thickness of the weight body 300d is set at such a dimension that provides sufficient mass for causing deflection at the first member 710d shown in FIG. 28(A). In the case of the example shown in the drawing, an oblong fitting groove 325d is formed on the upper surface of the central weight body portion 320d. As will be described below, the second member 720d of the main generating part 700d shown in FIG. 28(A) is fitted into the fitting groove 325d and fixed. A depth dimension thereof is set so as to be greater than the thickness dimension of the second member 720d.

Figure 30:
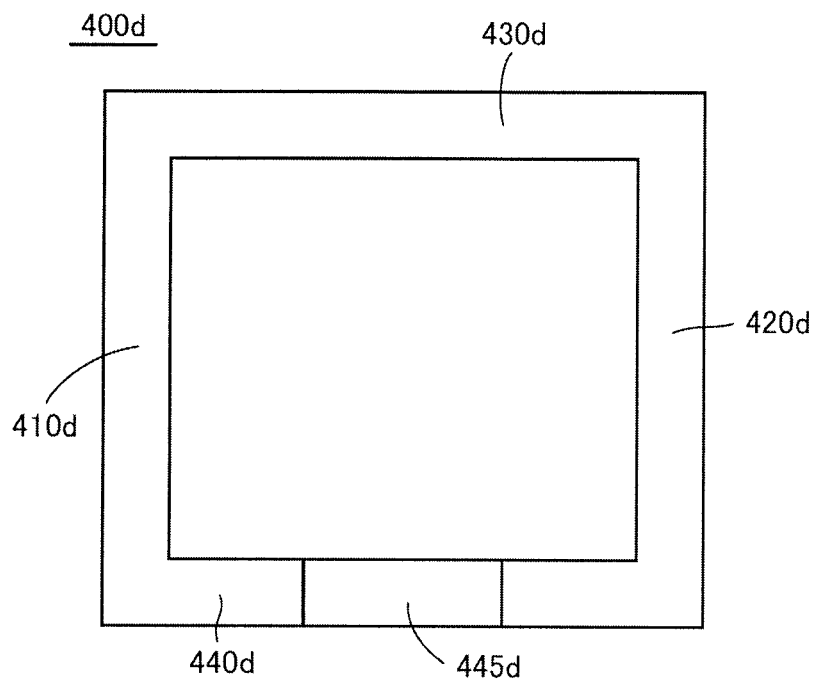
FIG. 30 is a top view which shows a pedestal 400d for fixing the fourth modification example D of the main generating structure MGS given in FIG. 1.

FIG. 30 is a top view which shows a pedestal 400d used in the fourth modification example D. As with the pedestal 400 shown in FIG. 17, the pedestal 400d is an oblong constituent which has a first wall portion 410d, a second wall portion 420d, a third wall portion 430d and a fourth wall portion 440d. The pedestal 400 is constituted with a three-layered structure body (having a layered structure as with the main generating structure MGS) shown in FIG. 18.

However, the pedestal 400d shown in FIG. 30 is not required to have the three-layered structure and may be formed with a single-layered structure body composed of a material such as metal. This is because in the case of the fourth modification example D shown here, the pedestal 400d is produced by an independent process entirely different from the main generating part 700d shown in FIG. 28.

In the case of the example shown in the drawing, an oblong fitting groove 445d is formed at the center of the upper surface of the fourth wall portion 440d. As will be described below, the fitting groove 445d is such that the third member 730d of the main generating part 700d shown in FIG. 28 is fitted and fixed. The depth dimension thereof is set so as to be greater than the thickness dimension of the third member 730d.

Figure 31:
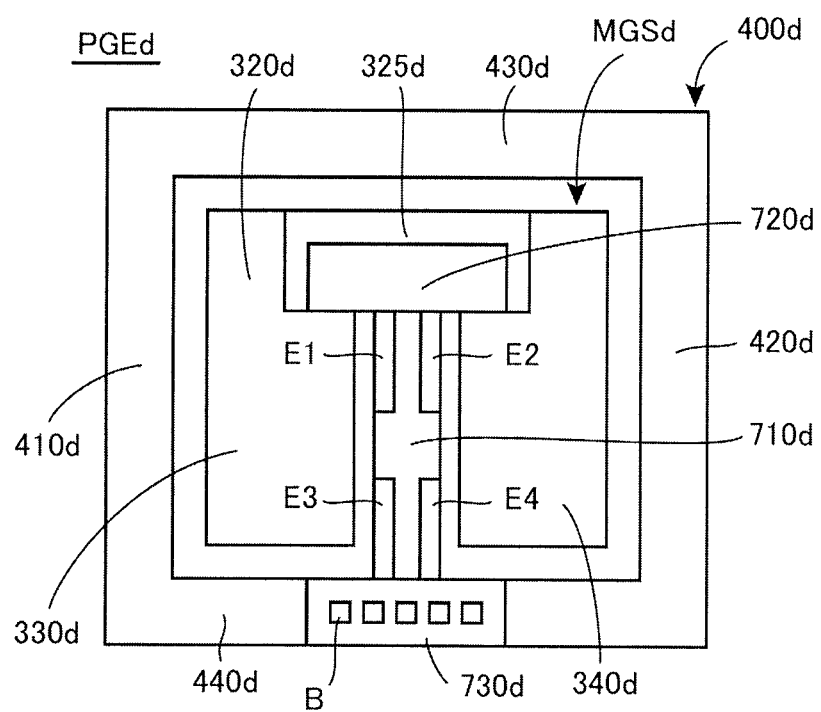
FIG. 31 is a top view which shows a state that the main generating part 700d shown in FIG. 28 and the weight body 300d shown in FIG. 29 are attached to the pedestal 400d shown in FIG. 30.

FIG. 31 is a top view which shows an entire constitution of a power generating element PGEd of the fourth modification example D (however, indicated is only a structure body for power generating element from which the power generating circuit 500 is removed and the power generating circuit 500 is not illustrated). The power generating element PGEd is constituted by attaching the main generating part 700d shown in FIG. 28 and the weight body 300d shown in FIG. 29 to the pedestal 400d shown in FIG. 30.

Specifically, the second member 720d of the main generating part 700d shown in FIG. 28 is fitted into the fitting groove 325d installed at the central weight body portion 320d of the "U" letter shaped weight body 300d shown in FIG. 29, and the lower surface of the second member 720d is allowed to adhere to the bottom surface of the fitting groove 325d. Similarly, the third member 730d of the main generating part 700d is fitted into the fitting groove 445d installed at the fourth wall portion 440d of the pedestal 400d shown in FIG. 30 and the lower surface of the third member 730d is allowed to adhere to the bottom surface of the fitting groove 445d. Thereby, completed is the power generating element PGEd shown in FIG. 31 (in practice, wiring is needed between the power generating circuit 500 and the bonding pad B which are not shown in the drawing).

Resultantly, the power generating element PGEd shown in FIG. 31 is also constituted so that the main generating structure MGSd is housed inside the rectangular pedestal 400d, and the main generating structure MGSd is composed of a three-layered structure body, which is the same as the power generating element PGE according to the basic embodiment shown in FIG. 17. However, as shown by the reference numerals in parentheses in FIG. 28, the main generating second layer which constitutes the main generating structure MGSd is additionally provided with a pedestal connection portion 732d connected to the base end of the plate-like bridge portion 712d. When the third longitudinal direction axis L3 (an axis parallel to the X-axis in the basic embodiment) orthogonal to the first longitudinal direction axis L1 (the Y-axis in the basic embodiment) is given as an arrangement axis, the pedestal connection portion 732d is a member which is arranged on the arrangement axis and extends along the arrangement axis.

As shown in FIG. 29, the fitting groove 325d for fitting the central plate-like portion 722d (the second member 720d) to effect adhesion of the lower surface thereof is formed on an upper surface of a predetermined site of the weight body 300d, and the central plate-like portion 722d is thereby fixed in a state of being fitted into the fitting groove 325d. Similarly, as shown in FIG. 30, the fitting groove 445d for fitting the pedestal connection portion 732d (the third member 730d) to effect adhesion of the lower surface thereof is formed on an upper surface of a predetermined site of the pedestal 400d, and the pedestal connection portion 732d is thereby fixed in a state of being fitted into the fitting groove 445d.

It is noted that, as shown in FIG. 31, in the case of the example shown here, the planar shape of the fitting groove 325d is designed so as to be slightly larger than the planar shape of the second member 720d, and the second member 720d can be fitted into the fitting groove 325d with allowance. On the other hand, the planar shape of the fitting groove 445d is designed so as to be in agreement with the planar shape of the third member 730d and formed in such a manner that the third member 730d can be snugly fitted into the fitting groove 445d. Of course, a planar-shape relationship between the respective fitting grooves 325d, 445d and the members 720d, 730d which are fitted thereinto is not necessarily the same as that of the example. In any case, they may be designed so as to be fitted into the groove with allowance or they may be designed so as to be snugly fitted into the groove.

In contrast, with regard to a relationship between the depth of the respective fitting grooves 325d, 445d and the thickness of the members 720d, 730d to be fitted thereinto, it is preferable that the design is made so that the former is greater in dimension than the latter, that is, the fitting grooves are deeper than the thickness of the members. This is because consideration is given for protecting the main generating part 700d so as not to be broken. Since the main generating part 700d is a part which includes, for example, a silicon substrate, a piezoelectric element layer and an electrode, it is more easily broken than the weight body 300d and the pedestal 400d. Thus, the members 720d, 730d are completely embedded into the fitting grooves 325d, 445d, thus making it possible to reduce the possibility that the main generating part 700d may be broken by being in contact with certain other members.

In the case of the example shown in FIG. 31, the fitting groove 325d is designed so that the depth dimension thereof is greater than the thickness dimension of the second member 720d. Therefore, the upper surface of the second member 720d is positioned below the upper surface of the central weight body portion 320d (in the depth direction in the drawing), and the second member 720d is completely embedded into the weight body 300d so as to be in a state of being protected from contact with an external member. Similarly, the fitting groove 445d is designed so that the depth dimension thereof is greater than the thickness dimension of the third member 730d. Thus, the upper surface of the third member 730d (the upper surface including the bonding pad B) is positioned below the upper surface of the fourth wall portion 440d (in the depth direction in the drawing), and the third member 730d is completely embedded into the pedestal 400d so as to be in a state of being protected from contact with an external member. The above-described constitution is adopted, thus making it possible to prevent breakage of the main generating part 700d by coming into contact with another member, even where excessive acceleration is applied to cause great displacement at individual portions.

A production process of the power generating element PGEd according to the fourth modification example D is different from that of the power generating element PGE of the basic embodiment shown in FIG. 17 and FIG. 18 and requires a step for effecting mutual adhesion of individual parts and assembling them. Even where a layer continuing to the plate-like bridge portion 712d is constituted with silicon, it will be sufficient that a silicon layer and a piezoelectric element on the upper surface thereof are formed only at the portion of the main generating part 700*d* shown in FIG. 28. It is, therefore, possible to greatly decrease a planar size of the silicon substrate and that of the piezoelectric element formed on the upper surface thereof and reduce production costs.

Further, in the case of the fourth modification example D, as shown in FIG. 28, the first member 710*d* (the plate-like bridge portion 712*d*) arranged along the first longitudinal direction axis L1 is orthogonal to the second member 720*d* (the central plate-like portion 722*d*) arranged along the second longitudinal direction axis L2 and the third member 730*d* (the pedestal connection portion 732*d*) arranged along the third longitudinal direction axis L3. Thus, the connection angles θ1 to θ4 shown in FIG. 26 are able to give 90 degrees. It is, therefore, possible to generate efficient stress at both ends of the plate-like bridge portion 712*d* and enhance power generation efficiency.

Chapter 5. Basic Concept of the Present Invention

A description has been given above of the basic embodiment of the present invention in Chapter 1 to Chapter 3 and also some modification examples in Chapter 4. Of course, the modification examples of the present invention shall not be limited to these modification examples described in Chapter 4, and other various modification examples can be implemented within a scope of providing similar working effects.

For example, in the basic embodiment and the modification examples described above, the main generating structure MGS is constituted with a three-layered structure body. However, in carrying out the present invention, it is not always necessary to use a three-layered structure body. For example, the main generating second layer 200 may be merged with the main generating third layer 300, and the plate-like bridge portion may be integrated with the weight body by using a silicon substrate, etc. Of course, the plate-like bridge portion, the weight body and the pedestal can be integrally formed by using the same material such as silicon.

Further, in the examples described above, the main generating third layer 300 which constitutes the weight body is arranged below the plate-like bridge portion. However, there may be installed the weight body which continues from below to above the plate-like bridge portion.

Here, on the basis of the basic embodiment and various modification examples described above, a basic concept of the present invention will be outlined. The power generating element according to the present invention is a power generating element which generates electric power by converting vibration energy into electric energy. As shown in FIG. 1, the power generating element may be such that it is provided with a plate-like bridge portion 210 which extends along the first longitudinal direction axis Y and has flexibility, a pedestal 400 which supports and fixes the base end of the plate-like bridge portion 210, a weight body 300 which is connected directly or indirectly to the leading end of the plate-like bridge portion 210, a piezoelectric element 100 which is fixed at a predetermined position on the surface of the plate-like bridge portion 210 where expansion/contraction deformation occurs and a power generating circuit 500 which rectifies electric current produced on the basis of charge generated at the piezoelectric element 100 and takes out electric power, in which the weight body 300 has a left-hand side weight body portion 330 which is positioned on the left hand side of the plate-like bridge portion 210 in relation to the longitudinal direction axis Y and a right-hand side weight body portion 340 which is positioned on the right hand side of the plate-like bridge portion 210 in relation to the longitudinal direction axis Y.

It is, however, preferable that in order to generate electric power more efficiently, the weight body supporting portions 220, 230, 240 are connected to the leading end of the plate-like bridge portion 210, the weight body 300 is connected to the lower surface thereof, and the center of gravity G of the weight body 300 is positioned below the plate-like bridge portion 210.

In particular, in the basic embodiment shown in FIG. 1, there is provided, as a weight body supporting portion, the central plate-like portion 220 which extends along the second longitudinal direction axis X' orthogonal to the first longitudinal direction axis Y, connecting the leading end of the plate-like bridge portion 210 with the central vicinity of the central plate-like portion 220, thereby forming a T letter shaped structure body by the plate-like bridge portion 210 and the central plate-like portion 220. Then, there is adopted such a structure that the left-hand side weight body portion 330 is connected to the left lower surface of the central plate-like portion 220 and the right-hand side weight body portion 340 is connected to the right lower surface of the central plate-like portion 220.

More specifically, in the case of the basic embodiment shown in FIG. 1, there is adopted such a structure that the weight body supporting portion is constituted with the central plate-like portion 220 which extends along the second longitudinal direction axis X' orthogonal to the first longitudinal direction axis Y and the central vicinity thereof is connected to the leading end of the plate-like bridge portion 210, the left-hand side plate-like portion 230 which extends from the left side of the central plate-like portion 220 to the left hand side of the plate-like bridge portion 210, and the right-hand side plate-like portion 240 which extends from the right side of the central plate-like portion 210 to the right hand side of the plate-like bridge portion 210, the left-hand side weight body portion 330 is connected to the lower surface of the left-hand side plate-like portion 230, and the right-hand side weight body portion 340 is connected to the lower surface of the right-hand side plate-like portion 240. Further, the central weight body portion 320 for coupling the left-hand side weight body portion 330 with the right-hand side weight body portion 340 is provided on the weight body 300, and the central weight body portion 320 is connected to the lower surface of the central plate-like portion 220.

The above-described constitution is adopted to realize a structure which covers the circumference of the plate-like bridge portion 210 with the weight body 300 so as to give a "U" letter shape. And, the center of gravity G of the weight body 300 can be placed at a predetermined position below the plate-like bridge portion 210. Therefore, the plate-like bridge portion 210 can be efficiently deflected on the basis of displacement of the weight body 300. Further, if a certain displacement restricting wall is installed around the weight body 300, even where an external force which causes excessive displacement is applied to the weight body 300, by which it is possible to restrict displacement of the weight body 300 and prevent the plate-like bridge portion 210 from being broken.

In practice, it is preferable that the pedestal 400 is used as a displacement restricting wall for restricting displacement of the weight body 300. For example, in the case of the embodiment shown in FIG. 17, there is used the pedestal 400 of a rectangular frame-like structure body which surrounds the circumference of the main generating structure MGS having the plate-like bridge portion 210 and the weight body 300. Thereby, where acceleration in excess of a predetermined magnitude is applied to the power generating element PGE, a part of the weight body 300 comes into contact with a part of the pedestal 400 composed of an annular structure body, thus making it possible to restrict further displacement.

As shown in FIG. 26, the plate-like bridge portion 210 is made orthogonal to the central plate-like portion 220, thereby forming a T letter shaped structure body. Then, as shown in FIG. 13 to FIG. 15, there is found a concentration of stress laterally on both sides of the leading end of the plate-like bridge portion 210 and laterally on both sides of the base end thereof, where force in the direction of each coordinate axis is applied to the weight body 300.

Therefore, as piezoelectric elements, there are installed a leading end left-side piezoelectric element P1 (a piezoelectric element formed in a domain of the upper layer electrode E1) arranged on the left side in the vicinity of the leading end of the plate-like bridge portion 210, a leading end right-side piezoelectric element P2 (a piezoelectric element formed in a domain of the upper layer electrode E2) arranged on the right side in the vicinity of the leading end of the plate-like bridge portion 210, a base end left-side piezoelectric element P3 (a piezoelectric element formed in a domain of the upper layer electrode E3) arranged on the left side in the vicinity of the base end of the plate-like bridge portion 210 and a base end right-side piezoelectric element P4 (a piezoelectric element formed in a domain of the upper layer electrode E4) arranged on the right side in the vicinity of the base end of the plate-like bridge portion 210, thus making it possible to generate electric power efficiently.

Further, as shown in FIG. 1, the piezoelectric element may be specifically structured so as to give a laminated structure which is provided with the lower layer electrode E0 formed in a layered manner on the surface of the plate-like bridge portion 210, the piezoelectric material layer 105 formed in a layered manner on the surface of the lower layer electrode E0, and an upper layer electrode group composed of the plurality of upper layer electrodes E1 to E4 formed locally on the surface of the piezoelectric material layer 105. Here, the piezoelectric material layer 105 may be formed by using a material which is likely to polarize in the thickness direction by application of stress undergoing expansion/contraction in the layer direction.

In the case of the example shown in FIG. 1, the piezoelectric element (the main generating first layer 100) is formed on an upper surface of the plate-like bridge portion 210 (the main generating second layer 200). However, the piezoelectric element is not necessarily formed on an upper surface of the plate-like bridge portion 210 and may be formed on a side surface or a lower surface thereof. Of course, the piezoelectric element may be formed on both the upper surface and the side surface, or formed on all the upper surface, the side surface and the lower surface. Deflection of the plate-like bridge portion 210 will cause stress not only on the upper surface but also on the side surface and the lower surface. It is, therefore, possible to generate electric power also by using piezoelectric elements formed on the side surface and the lower surface.

In short, the piezoelectric element may be formed on the surface of the plate-like bridge portion 210, irrespective of being formed on an upper surface, a side surface or a lower surface. For example, the lower layer electrode E0 is formed so as to continue from the upper surface of the plate-like bridge portion 210 to the side surface thereof, the piezoelectric material layer 105 is formed all over the surface of the lower layer electrode E0, and a plurality of upper layer electrodes are formed locally at predetermined sites on the surface of the piezoelectric material layer 105 (not only above the plate-like bridge portion 210 but also at predetermined sites including side areas thereof), by which the piezoelectric elements can be formed not only on the upper surface of the plate-like bridge portion 210 but also on the side surfaces thereof. In this instance, electric power can be generated by the piezoelectric element formed not only on the upper surface but also the piezoelectric elements formed on the side surfaces.

However, a complicated step is needed in order that a piezoelectric element is formed not only on the upper surface of the plate-like bridge portion 210 but also on the side surfaces and the lower surface thereof, thus, inevitably resulting in increased production costs. Therefore, as shown in the basic embodiment and the modification examples described above, it is in practice preferable that there is adopted such a structure that the piezoelectric element is installed on the upper surface of the plate-like bridge portion 210, thereby reducing the costs. In particular, there is adopted a mass production process in which, as shown in FIG. 21, the laminated material block 1000 is provided and subjected to a predetermined treatment process, and the piezoelectric element can be formed on the upper surface of the plate-like bridge portion 210.

In the example shown in FIG. 22, where the power generating element PGE is housed inside the device package 600 to constitute the power generating device, there may be adopted such a constitution that the pedestal 400 of the power generating element PGE is fixed to the device package 600, and upon application of an external force which vibrates the device package 600, the weight body 300 of the power generating element PGE undergoes vibration inside the device package 600 by deflection of the plate-like bridge portion 210, thereby outputting electric power taken out from the power generating circuit 500 depending on the vibration.

Alternatively, as shown in the example of FIG. 23, it is possible to adopt a constitution in which the role of the weight body and the role of the pedestal are reversed. In this instance, there may be adopted such a constitution that the power generating element PGE' is provided in which the bottom surface of the weight body 300' is positioned below the bottom surface of the pedestal 400', the weight body 300' of the power generating element PGE' is fixed to the device package 600, and upon application of an external force which vibrates the device package 600, the pedestal 400' of the power generating element PGE' undergoes vibration inside the device package 600 by deflection of the plate-like bridge portion 210, thereby outputting electric power taken out from the power generating circuit 500 depending on the vibration.

Of course, as with the example shown in FIG. 28 to FIG. 31, the power generating element PGE can be constituted by a method for assembling some of individual parts. In the case of the main generating part 700d shown in FIG. 28, the pedestal connection portion 732d extending along the longitudinal direction axis L3 orthogonal to the longitudinal direction axis L1 is connected to the base end of the plate-like bridge portion 712d extending along the longitudinal direction axis L1, and the pedestal connection portion 732d is fixed to the pedestal 400d, by which they can be assembled.

What is claimed is:

1. A power generating element which generates electric power by converting vibration energy into electric energy, the power generating element comprising:
- a plate-like bridge portion which is composed of a flat-plate like member arranged along a surface parallel to an XY plane of an XYZ three-dimensional coordinate system having an X-axis, a Y-axis and a Z-axis and extends from a base end to a leading end along the Y-axis and has flexibility;
- a pedestal which supports and fixes the base end of the plate-like bridge portion;
- a weight body which is directly or indirectly connected to the leading end of the plate-like bridge portion; and
- a plurality of sets of piezoelectric elements which are fixed at a predetermined position on a surface of the plate-like bridge portion at which expansion/contraction deformation occurs; wherein
- when both sides of the plate-like bridge portion are defined in such a manner that a side in which an X coordinate value is negative is defined as a left hand side, and a side in which an X coordinate value is positive is defined as a right hand side, the weight body is provided with a left-hand side weight body portion which is positioned on a left hand side of the plate-like bridge portion and a right-hand side weight body portion which is positioned on a right hand side of the plate-like bridge portion,
- the plurality of sets of piezoelectric elements have a leading end piezoelectric element arranged in a vicinity of the leading end of the plate-like bridge portion and a base end piezoelectric element arranged in a vicinity of the base end of the plate-like bridge portion,
- each of the piezoelectric elements has a lower layer electrode which is formed in a layered manner on a surface of the plate-like bridge portion, a piezoelectric material layer which is formed in a layered manner on a surface of the lower layer electrode, and an upper layer electrode which is formed in a layered manner on a surface of the piezoelectric material layer, and the piezoelectric material layer is likely to polarize in a thickness direction by application of stress which expands and contracts in a layer direction,
- when the weight body undergoes displacement in a direction of the Z-axis, charge of a first polarity is generated at the upper layer electrode of the leading end piezoelectric element, charge of a second polarity is generated at the upper layer electrode of the base end piezoelectric element, the second polarity being reversed polarity of the first polarity.

2. The power generating element according to claim 1, wherein
when the weight body undergoes displacement in a direction of the Y-axis, charges of the same polarity are generated in the upper layer electrode of the leading end piezoelectric element and the upper layer electrode of the base end piezoelectric element.

3. A power generating element which generates electric power by converting vibration energy into electric energy, the power generating element comprising:
- a plate-like bridge portion which is composed of a flat-plate like member arranged along a surface parallel to an XY plane of an XYZ three-dimensional coordinate system having an X-axis, a Y-axis and a Z-axis and extends from a base end to a leading end along the Y-axis and has flexibility;
- a pedestal which supports and fixes the base end of the plate-like bridge portion;
- a weight body which is directly or indirectly connected to the leading end of the plate-like bridge portion; and
- a plurality of sets of piezoelectric elements which are fixed at a predetermined position on a surface of the plate-like bridge portion at which expansion/contraction deformation occurs;

wherein
when both sides of the plate-like bridge portion are defined in such a manner that a side in which an X coordinate value is negative is defined as a left hand side, and a side in which an X coordinate value is positive is defined as a right hand side, the weight body is provided with a left-hand side weight body portion which is positioned on a left hand side of the plate-like bridge portion and a right-hand side weight body portion which is positioned on a right hand side of the plate-like bridge portion,
- the plurality of sets of piezoelectric elements have a leading end piezoelectric element arranged in a vicinity of the leading end of the plate-like bridge portion and a base end piezoelectric element arranged in a vicinity of the base end of the plate-like bridge portion,
- each of the piezoelectric elements has a lower layer electrode which is formed in a layered manner on a surface of the plate-like bridge portion, a piezoelectric material layer which is formed in a layered manner on a surface of the lower layer electrode, and an upper layer electrode which is formed in a layered manner on a surface of the piezoelectric material layer, and the piezoelectric material layer is likely to polarize in a thickness direction by application of stress which expands and contracts in a layer direction,
- when the weight body undergoes displacement in a direction of the Y-axis, charges of the same polarity are generated in the upper layer electrode of the leading end piezoelectric element and the upper layer electrode of the base end piezoelectric element.

* * * * *